(12) United States Patent
Park et al.

(10) Patent No.: US 7,227,215 B2
(45) Date of Patent: Jun. 5, 2007

(54) SEMICONDUCTOR DEVICE HAVING A CAPACITOR WITH A STEPPED CYLINDRICAL STRUCTURE AND METHOD OF MANUFACTURING SAME

(75) Inventors: Je-Min Park, Gyeonggi-do (KR); Jin-Jun Park, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 175 days.

(21) Appl. No.: 10/996,969

(22) Filed: Nov. 23, 2004

(65) Prior Publication Data

US 2005/0116318 A1    Jun. 2, 2005

(30) Foreign Application Priority Data

Nov. 27, 2003  (KR) .................... 10-2003-0084844

(51) Int. Cl.
    *H01L 27/108* (2006.01)
(52) U.S. Cl. .................. 257/306; 257/307; 257/308; 257/309; 257/E27.086; 438/253
(58) Field of Classification Search .............. 257/306, 257/307, 308, 309; 438/253
See application file for complete search history.

(56) References Cited

U.S. PATENT DOCUMENTS

| 5,610,741 A | 3/1997 | Kimura |
| 6,037,206 A | 3/2000 | Huang et al. |
| 6,080,623 A | 6/2000 | Ono |
| 6,156,608 A | 12/2000 | Chen |
| 6,162,670 A | 12/2000 | Wu et al. |
| 6,548,853 B1 | 4/2003 | Hwang et al. |
| 2001/0022369 A1* | 9/2001 | Fukuda et al. ............. 257/207 |
| 2003/0190808 A1* | 10/2003 | Kim et al. ................. 438/689 |

FOREIGN PATENT DOCUMENTS

| JP | 2003-224210 | 8/2003 |
| KR | 2002-76473 | 10/2002 |
| KR | 2004-0058765 | 7/2004 |

OTHER PUBLICATIONS

English language abstract of Japanese publication No. 2003-224210.
English language abstract of Korean publication No. 2002-76473.
English language abstract of Korean Publication No. 2004-0058765.

* cited by examiner

Primary Examiner—Asok K. Sarkar
Assistant Examiner—Victor V. Yevsikov
(74) Attorney, Agent, or Firm—Marger Johnson & McCollom, P.C.

(57) ABSTRACT

According to some embodiments, a capacitor includes a storage conductive pattern, a storage electrode having a complementary member enclosing a storage conductive pattern so as to complement an etch loss of the storage electrode, a dielectric layer disposed on the storage electrode, and a plate electrode disposed on the dielectric layer. Because the complementary member compensates for the etch loss of the storage electrode during several etching processes, the deterioration of the structural stability of the storage electrode may be prevented. Additionally, because the complementary member is formed on an upper portion of the storage electrode, the storage electrode may have a sufficient thickness to enhance the electrical characteristics of the capacitor that includes the storage electrode.

22 Claims, 52 Drawing Sheets

FIG. 1
(Conventional)
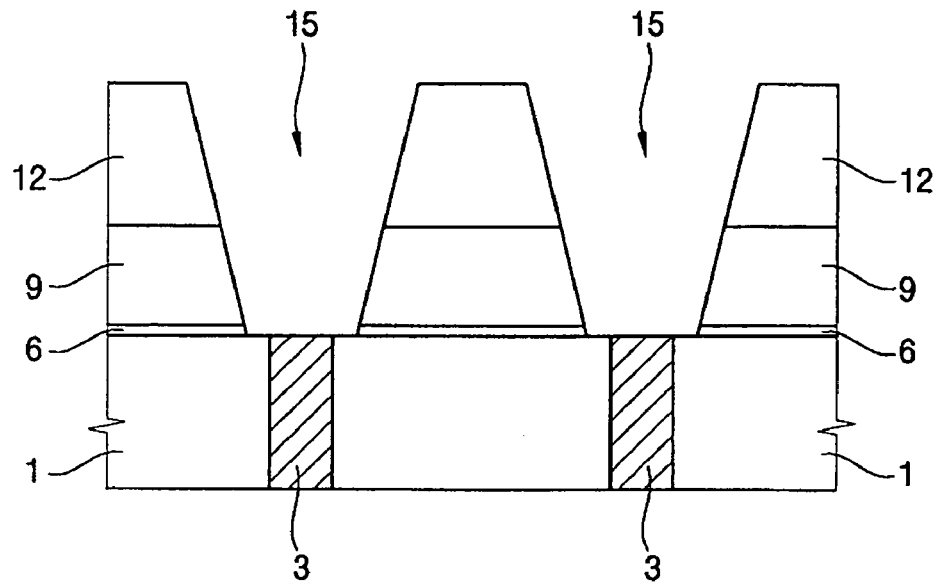
FIG. 2
(Conventional)
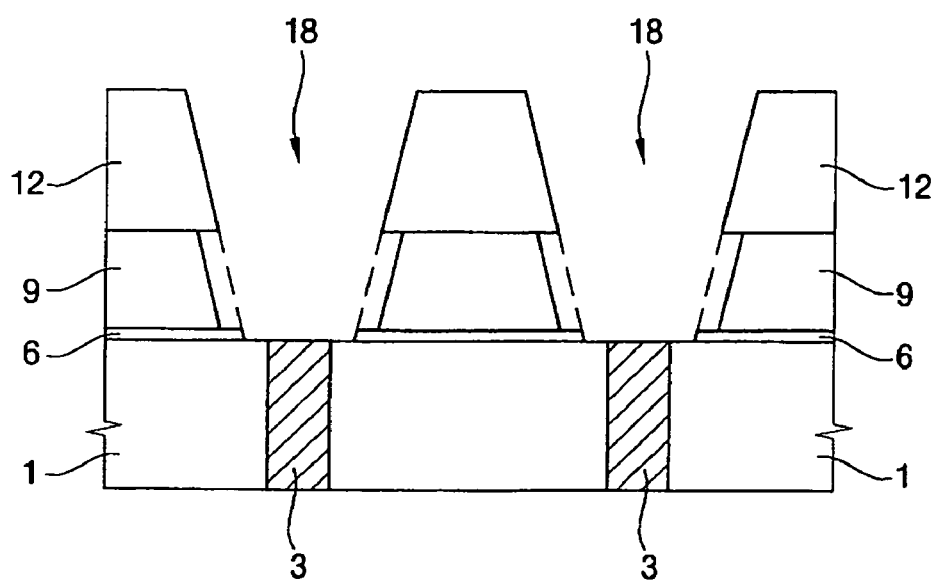

FIG. 3
(Conventional)
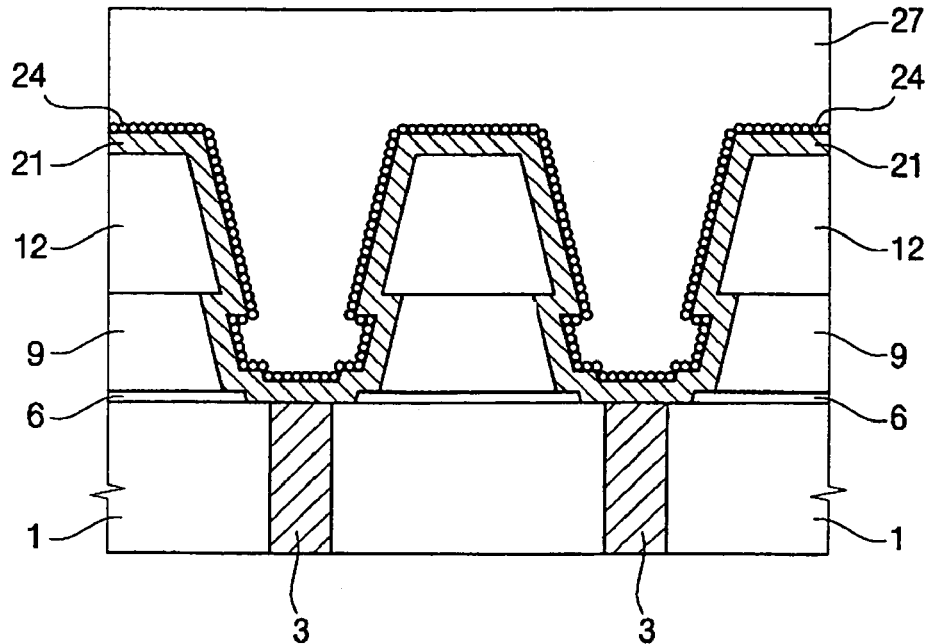
FIG. 4
(Conventional)
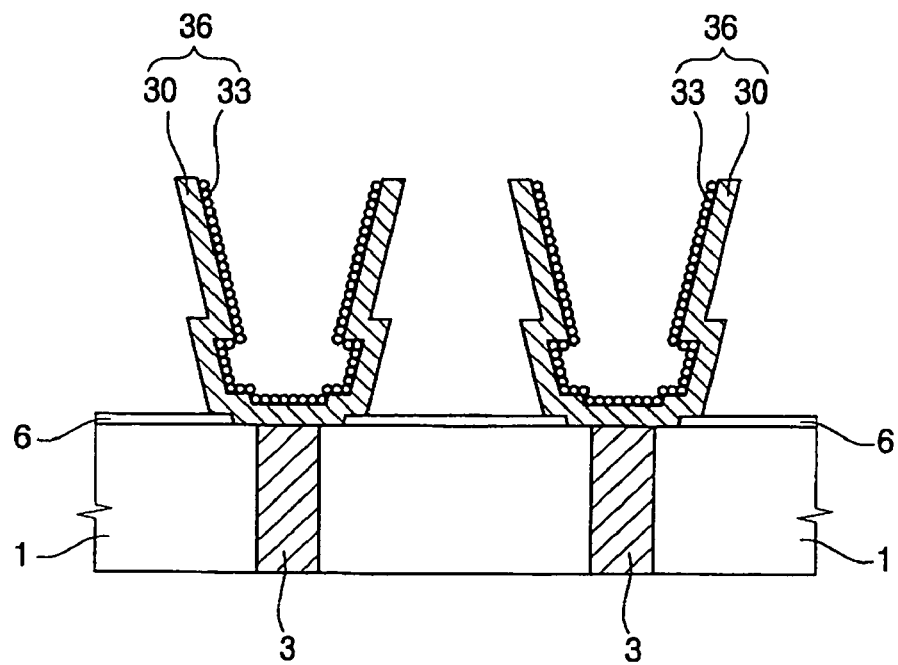

FIG. 5 (Conventional)
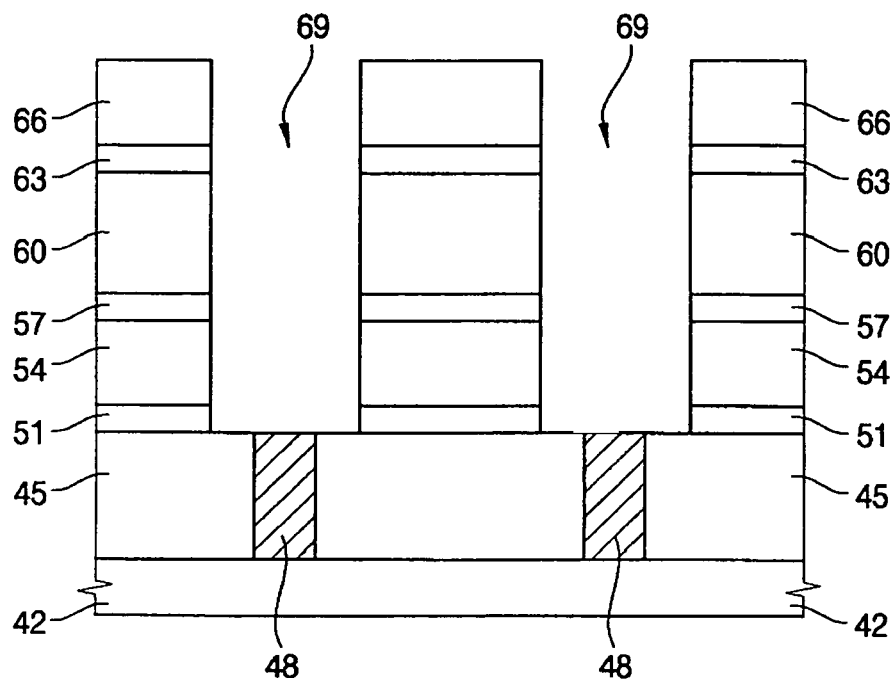
FIG. 6 (Conventional)
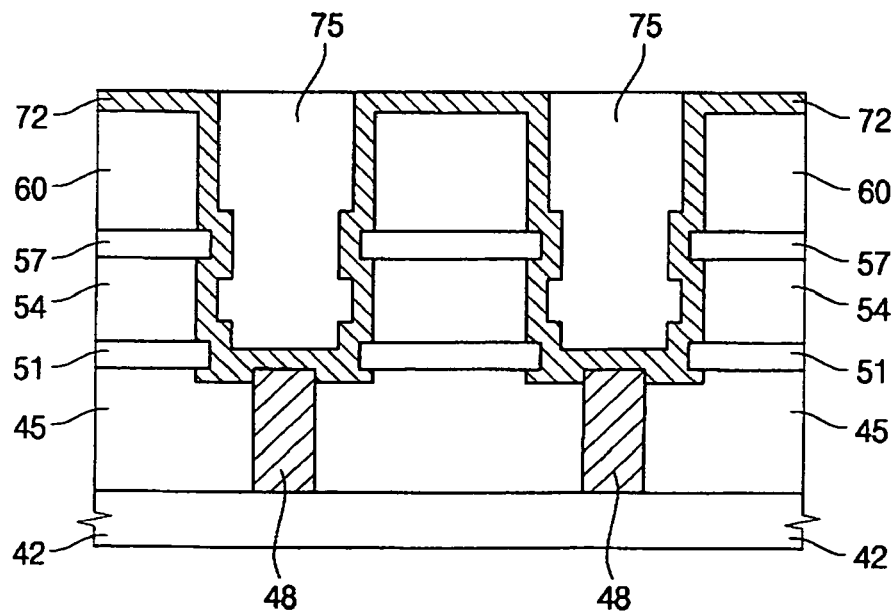

FIG. 7 (Conventional)
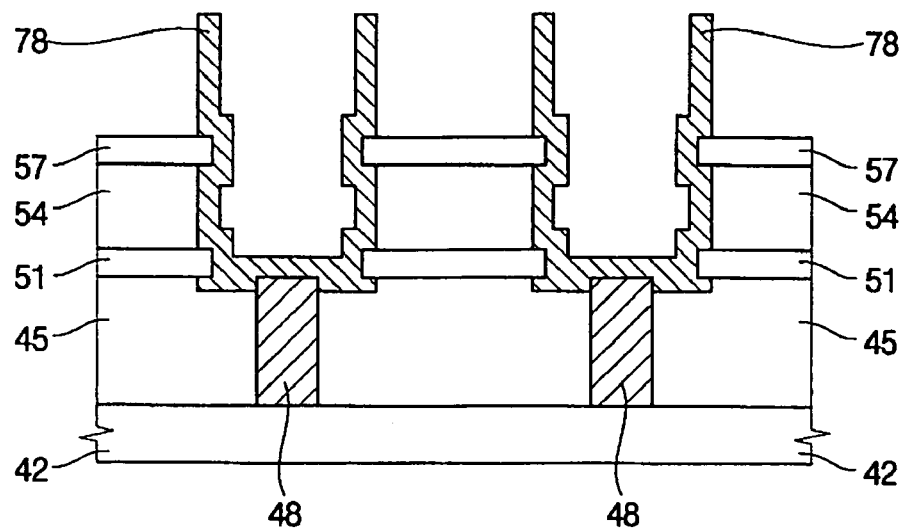
FIG. 8
(Conventional)
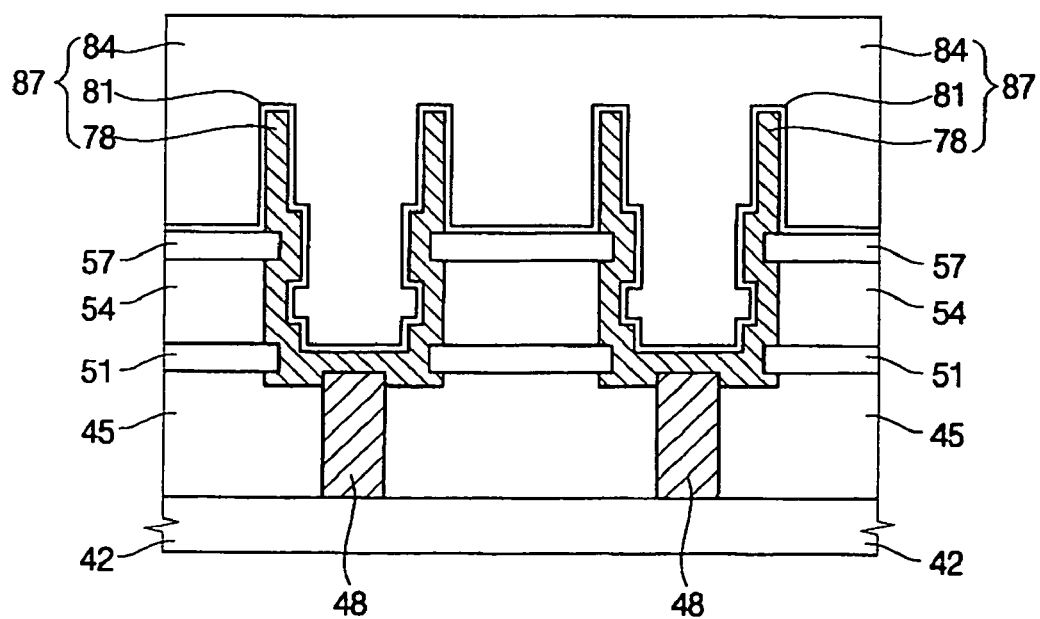

SEMICONDUCTOR DEVICE HAVING A CAPACITOR WITH A STEPPED CYLINDRICAL STRUCTURE AND METHOD OF MANUFACTURING SAME

CROSS REFERENCE TO RELATED APPLICATIONS

This application claims priority from Korean Patent Application No. 2003-0084844, filed on 27 Nov. 2003, the content of which is herein incorporated by reference in its entirety for all purposes.

BACKGROUND OF THE INVENTION

1. Field of the Invention

This disclosure relates to a semiconductor device and a method of manufacturing the semiconductor device. More particularly, the disclosure relates to a semiconductor device including a capacitor that has a storage electrode having greatly improved electrical characteristics and structural stability, and a method of manufacturing a semiconductor device having such a capacitor.

2. Description of the Related Art

In general, semiconductor memory devices such as dynamic random access memory (DRAM) devices can store data or information therein. The data or information may be stored in the semiconductor memory devices, and the data or information may also be read from the semiconductor memory devices. A typical single unit memory cell of the semiconductor memory device includes one capacitor and one transistor. The capacitor of the semiconductor memory device typically includes a storage electrode, a dielectric layer, and a plate electrode. To improve a storage capacitance of the semiconductor memory device, a capacitor with a high capacitance value is required.

As semiconductor memory devices become highly integrated, the area of the unit memory cell of the semiconductor memory device is decreased. To ensure a sufficient storage capacitance of the semiconductor memory device, the capacitor may have various shapes such as a box, a cylinder, etc. However, as a design rule for the semiconductor memory device decreases, the aspect ratio of the capacitor increases because the capacitor must be formed in a correspondingly limited unit area. The aspect ratio is defined as the ratio between a height of the capacitor and a width of the capacitor. As a result, adjacent capacitors having a high aspect ratio may lean against each other so that the adjacent capacitors are electrically connected with each other, thereby causing a two-bit short between the adjacent capacitors.

To overcome the above problem, cylindrical capacitors having a stepped sidewall and methods for fabricating the same are disclosed in U.S. Pat. No. 5,610,741 issued to Hwang et al.

FIGS. 1 to 4 are cross-sectional diagrams illustrating a conventional method for forming cylindrical capacitors having stepped inner side faces.

Referring to FIG. 1, storage node contact holes (not shown) that expose contact regions are formed through an insulating interlayer 1 positioned on a semiconductor substrate.

Storage node contact plugs are formed in the storage node contact holes, respectively. A nitride etching stop layer 6 is then formed on upper faces of the storage node contact holes and on an upper face of the insulating interlayer 1.

A lower mold layer 9 and an upper mold layer 12 are successively formed on an upper face of the etching stop layer 6. Here, the lower mold layer 9 includes a material that has an etch rate greater than that of a material included in the upper mold layer 12 with respect to an etching solution including hydrogen fluoride (HF). For example, the lower mold layer 9 may be formed using boro-phosphor silicate glass (BPSG) or phosphor silicate glass (PSG), etc., and the upper mold layer 12 may be formed using undoped silicate glass (USG) or tetra ethyl ortho silicate (TEOS), etc.

The upper mold layer 12, the lower mold layer 9, and the etching stop layer 6 are successively patterned to form preliminary storage node holes 15 that expose the storage node contact plugs 3. Here, upper portions of the preliminary storage node holes 15 have diameters greater than those of lower portions of the preliminary storage node holes 15.

Referring to FIG. 2, exposed inner side faces of the lower mold layer 9 in the preliminary storage node holes 15 are isotropically etched to thereby form storage node holes 18. Lower portions of the storage node holes 18 have diameters greater than those of the preliminary storage node holes 15. As a result, the storage node holes 18 have stepped inner side faces.

Referring to FIG. 3, a conductive layer 21 and a hemispherical grain (HGS) silicon layer 24 that covers the mold layer and inner faces of the storage node holes 18 are successively formed. A sacrificial layer 27 is then formed to thereby fill the storage node contact holes 18.

Referring to FIG. 4, the sacrificial layer 18, the HGS silicon layer 24, and the conductive layer 21 are removed until the upper face of the upper mold layer 12 is exposed to thereby form a conductive layer pattern 30 and a HSG silicon layer pattern 33 in the storage node contact holes 18. Sequentially, the upper mold layer 12 and the lower mold layer 9 are successively removed to thereby form storage electrodes 36 that include the conductive layer pattern 30 and the HGS silicon layer pattern 33. Here, the storage electrodes 36 have stepped inner side faces.

Upper portions of the storage electrodes 36 may be thinner during several etching processes for forming the storage electrodes 36 of capacitors. Lower portions of the storage electrodes 36 may be etched once or twice, whereas the upper portions of the storage electrodes 36 may be etched at least three times. As a result, the upper portions of the storage electrodes 36 may have thicknesses that are much less than those of the lower portions of the storage electrodes 36. Because the thicknesses of the upper portions of the storage electrodes 36 are relatively thin compared to the lower portions of the storage electrodes, the electrical characteristics of the upper portions of the storage electrodes 36 may deteriorate. In addition, because the storage electrodes 36 having the thin upper portions are structurally unstable, the upper portions of the storage electrodes 36 may become bowed or deformed. Thus, the structural stability of capacitors that include the storage electrodes 36 may deteriorate. To overcome the bowing, stacked capacitors are disclosed in Japanese Laid Open Patent Publication No. 2003-224210.

FIGS. 5 to 8 are cross-sectional diagrams illustrating a method for forming stacked capacitors according to Japanese Laid Open Patent Publication No. 2003-224210.

Referring to FIG. 5, an insulating interlayer 45 is formed on the semiconductor 42 including underlying structures such as bit lines (not shown) and contact regions (not shown). Contact holes (not shown) are formed to expose the contact regions.

Contact plugs 48 are formed in the contact holes. A first etching stop layer 51, a first insulation layer 54, a second etching stop layer 57, and an antireflective 63 are successively formed on an upper face of the contact plugs 48 and on an upper face of the insulation inter layer 45.

A photoresist pattern 66 is formed on the antireflective coating 63. The antireflective coating 63, the second insulation layer 60, the second etching stop layer 57, the first insulation layer 54, and the first etching stop layer 51 are successively etched to form openings 69 that expose upper faces of the contact plugs 48.

Referring to FIG. 6, the photoresist pattern 66 and the antireflective coating 63 are removed. A first conductive layer 72 is then formed on an upper face of the conductive layer 60 and on inner faces of the openings 69.

A third insulation layer is formed on an upper face of the first conductive layer 72 to thereby fill the openings 69. The third insulation layer is partially etched to thereby form a third insulation layer pattern 75 in the openings 69.

Referring FIG. 7, the first conductive layer 72 is partially etched. The third insulation layer pattern 75 and the second insulation layer 60 are then removed to thereby form storage electrodes 78.

Referring to FIG. 8, a dielectric layer 81 and a plate electrode 84 are successively formed, and cover a partially exposed upper face of the second etching stop layer 57 and partially exposed faces of the storage electrodes 78. As a result, stacked capacitors 87 are formed.

Because the first insulation layer 54 and the first etching stop layer 51 are disposed between the stacked capacitors 87, the storage electrodes 78 are not fully used. As a result, the capacitances of the stacked capacitors 87 may be reduced. That is, because outer side faces of lower portions of the storage electrodes 87 are not covered with the dielectric layer 81 and the plate electrode 84, the lower portions of the storage electrodes 87 may not contribute to the capacitances of the capacitor.

In addition, because the storage electrodes 78 are formed by several etching processes, upper portions of the electrodes 78 may be thinner. As a result, the upper portions of the storage electrodes 78 may still become bowed or deformed.

Embodiments of the invention address these and other disadvantages of the conventional art described above.

SUMMARY OF THE INVENTION

Some embodiments of the invention provide a capacitor including a storage electrode having improved structural stability and electrical characteristics to thereby prevent bowing and deterioration of capacitance. Other embodiments of the invention provide a method of manufacturing the capacitor that includes a storage electrode having improved structural stability and electrical characteristics.

BRIEF DESCRIPTION OF THE DRAWINGS

The above and other features and advantages of embodiments of the invention will become readily apparent by reference to the following detailed description when considered in conjunction with the accompanying drawings.

FIGS. 1 to 4 are cross-sectional diagrams illustrating a conventional method of forming a semiconductor device that includes a cylindrical capacitor.

FIGS. 5 to 8 are cross-sectional diagrams illustrating a conventional method of forming a semiconductor device that includes a stacked capacitor;

DETAILED DESCRIPTION OF THE INVENTION

Figure 9:
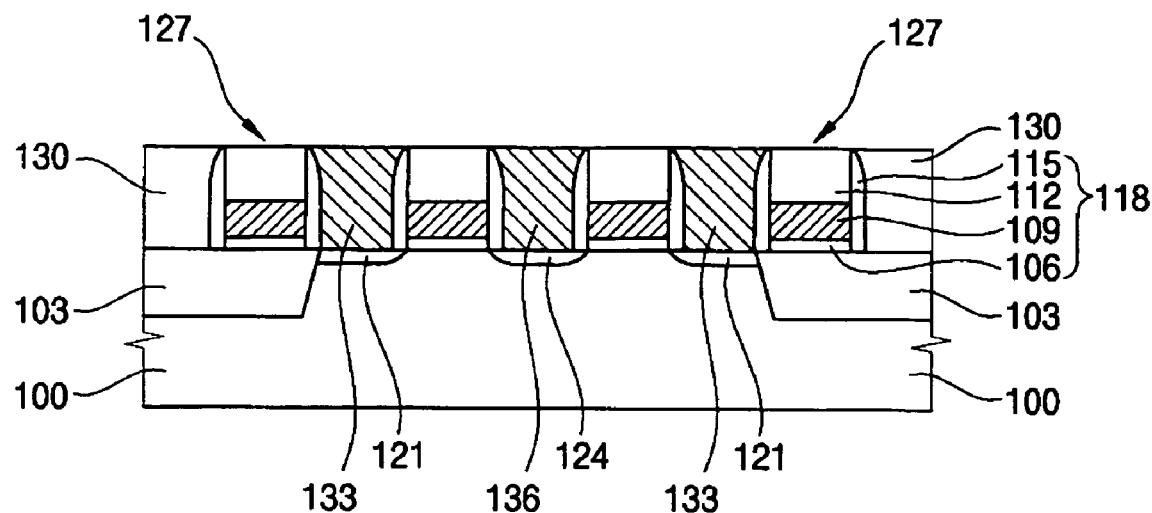
FIGS. 9 to 32 are cross-sectional diagrams illustrating a method of forming a semiconductor device in accordance with some embodiments of the invention.

The invention will be described below with reference to the accompanying drawings, in which embodiments of the invention are shown. This invention may, however, be embodied in many different forms and should not be construed as limited to the embodiments set fourth herein; rather, these embodiments are provided so that this disclosure will be through and complete, and will fully convey the scope of the invention to those skilled in the art. In the drawings, the thickness of layers and regions are exaggerated for clarity. Like reference numerals refer to similar or identical elements throughout. It will be understood that when an element such as a layer, a region, or a substrate is referred to as being "on" or "onto" another element, it can be directly on the other element or intervening elements may also be present.

FIGS. 9 to 32 are cross-sectional diagrams illustrating a method of forming a semiconductor device in accordance with some embodiments of the invention. FIGS. 9, 11, 13, 15, 17, 19, 21, 23, 25, 27, 29 and 31 are cross-sectional diagrams illustrating the semiconductor device taken along a line parallel to the bit lines of the semiconductor device. FIGS. 10, 12, 14, 16, 18, 20, 22, 24, 26, 28, 30 and 32 are cross-sectional diagrams illustrating the semiconductor device taken along a line parallel to the word lines of the semiconductor device.

Figure 10:
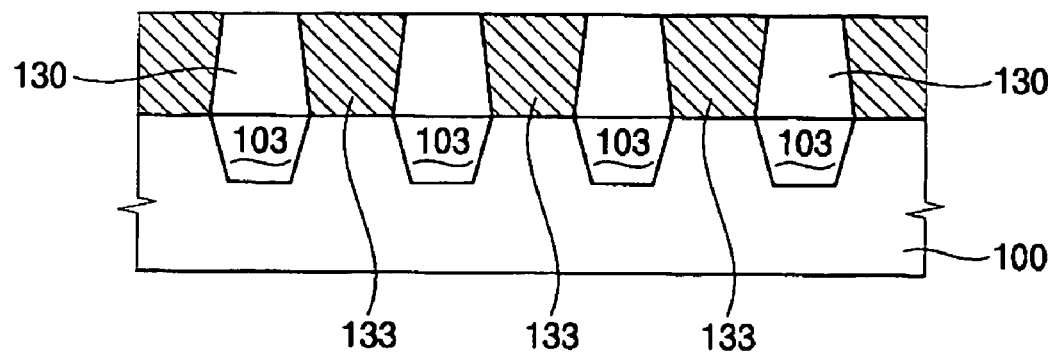

FIGS. 9 and 10 are cross-sectional diagrams illustrating exemplary processes for forming first pads 133 and second pads 136 on a semiconductor substrate 100 including word lines 127 having gate structures 118 thereon.

Referring to FIGS. 9 and 10, an isolation layer 103 is formed on the semiconductor substrate 100 to thereby define an active region and a field region on the semiconductor substrate 100. The isolation layer 103 may be formed by a shallow trench isolation (STI) process or a local oxidation of silicon (LOCOS) process. A thin gate oxide layer (not shown) is then formed on the semiconductor substrate 100 by a thermal oxidation process or a chemical vapor deposition (CVD) process. The thin gate oxide layer is formed only on the active region defined by the isolation layer 103.

A first conductive layer (not shown) and a first mask layer (not shown) are successively formed on the thin gate oxide layer. The first conductive layer may include polysilicon doped with impurities. The first conductive layer is patterned in a subsequent process to thereby form a gate conductive pattern 109. Alternatively, the first conductive layer may have a polycide structure that includes a doped polysilicon film and a metal silicide film formed on the doped polysilicon film. The first mask layer is patterned in a subsequent process to thereby form a gate mask 112. The first mask layer may be formed using material that has etching selectivity with respect to a first insulating interlayer 130. For example, in case that the first insulating interlayer 130 includes oxide, the first mask layer may include nitride such as silicon nitride.

A first photoresist pattern (not shown) is formed on the first mask layer. The first mask layer, the first conductive layer and the gate oxide layer are then etched using the first photoresist pattern as an etching mask to thereby form the gate structures 118 including the gate oxide pattern 106, the gate conductive pattern 109 and the gate mask 112 on the semiconductor substrate 100.

In one embodiment of the present invention, the first mask layer is etched using the first photoresist pattern as an etching mask to thereby form the gate mask 112 on the first conductive layer. The first photoresist pattern is then removed. The first conductive layer and the gate oxide layer are successively etched using the gate mask 112 as an etching mask to thereby form the gate structures 118 including the gate oxide pattern 106, the gate conductive pattern 109, and the gate mask 112 on the semiconductor substrate 100.

A first insulation layer covering the gate structures 118 is formed on the semiconductor substrate 100. The first insulation layer may be formed using nitride such as silicon nitride. The first insulation layer is anisotropically etched to form first spacers 115 on sidewalls of the gate structures 118. The first spacers 115 correspond to gate spacers. As a result, word lines 127 that are parallel to each other are formed on the semiconductor substrate 100. The first spacers 115 are formed on sidewalls of word lines 127 to electrically separate adjacent word lines 127 from each other. That is, because the gate mask 112 that includes nitride is formed on the word lines 127 and the first spacers 115 that include nitride are formed on the sidewalls of the word lines 127, the adjacent word lines 127 are electrically separated from each other.

Impurities are implanted into the portions of the semiconductor substrate 100 that are exposed between the word lines 127 by an ion implantation process using the word lines 127 as masks. The substrate 100 is then thermally treated to thereby form first and second contact regions 121 and 124 at the exposed portions of the semiconductor substrate 100. The first and second contact regions 121 and 124 correspond to source/drain regions of transistors, respectively. As a result, metal oxide semiconductor (MOS) transistors having the gate structures 118 and the first and second contact regions 121 and 124 may be formed on the semiconductor substrate 100. The first and second contact regions 121 and 124 also correspond to capacitor contact regions and bit line contact regions, respectively. Capacitors 200 (see FIGS. 31 and 32) are electrically connected to the capacitor contact regions, whereas bit lines 154 are electrically connected to the bit line contact regions. For example, the first contact regions 121 may be the capacitor regions with which first pads 133 make contact, whereas the second contact regions 124 may be the bit line contact regions with which second pads 136 make contact.

The first insulating interlayer 130 covering the MOS transistors is formed on the semiconductor substrate 100. The first insulating interlayer 130 may include oxide such as boro-phosphor silicate glass (BPSG), phosphor silicate glass (PSG), undoped silicate glass (USG), spin on glass (SOG), high density plasma-chemical vapor deposition (HDP-CVD) oxide, etc. The above-mentioned examples of the oxide may be used alone or in a mixture thereof.

The first insulating interlayer 130 is planarized by a chemical mechanical polishing (CMP) process, an etch-back process, or a combination of a CMP process and an etch-back process. The first insulating interlayer 130 is etched until the gate mask 112 of the gate structure 118 is exposed.

A second photoresist pattern (not shown) is formed on the planarized first insulating interlayer 130. The first insulating interlayer 130 is partially and anisotropically etched using the second photoresist pattern as an etching mask to thereby form first contact holes (not shown) that expose the first and second contact regions 121 and 124. Preferably, the first insulating interlayer 130 of oxide is etched using an etching gas that has etching selectivity relative to the gate mask 112 of nitride. Here, the first contact holes are formed through the first insulating interlayer 130 by a self-alignment process. That is, the first contact holes are self-aligned relative to the word lines 127. Some first contact holes expose the first contact regions 121 corresponding to the capacitor contact regions, and other first contact holes expose the second contact regions 124 corresponding to the bit line contact regions.

The second photoresist pattern may be removed by an ashing process and/or a stripping process. A second conductive layer (not shown) is formed on the first insulating interlayer 130 to fill the first contact holes. The second conductive layer may be formed using conductive material such as doped polysilicon, metal, etc.

The second conductive layer may be etched by a CMP process, an etch-back process, or a combination of a CMP process and an etch-back process until the planarized first insulating interlayer 130 is exposed. Thus, the first and second contact pads 133 and 136 that fill the first contact holes are formed on the first and second contact regions 121 and 124, respectively. Each of the first pads 133 corresponds to a first storage node contact pad, and each of the second pads 136 corresponds to a first bit line contact pad. Because the first contact holes are formed by the self-alignment process, the first and second pads 133 and 136 correspond to self-aligned contact (SAC) pads. That is, the first pads 133 make contact with the first contact regions 121 corresponding to the capacitor contact region, and the second pads 136 make contact with the second contact regions 124 corresponding to the bit line contact regions.

Figure 11:
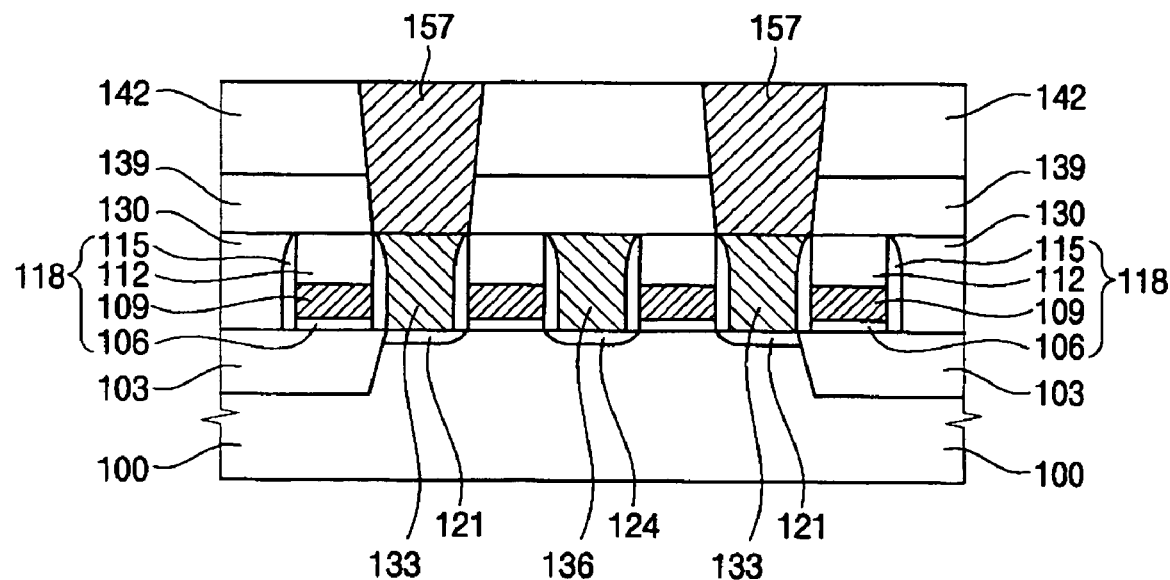
Figure 12:
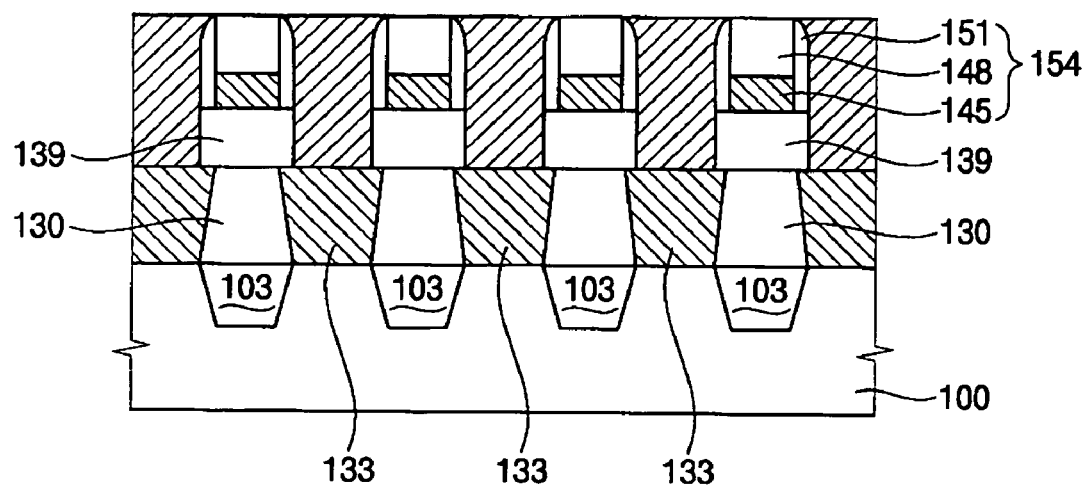

FIGS. 11 and 12 are cross-sectional diagrams illustrating exemplary processes for forming bit lines 154 and fourth pads 157 on the semiconductor substrate 100.

Referring to FIGS. 11 and 12, a second insulating interlayer 139 is formed on the first insulating interlayer 130 including the first and second pads 133 and 136. The second insulating interlayer 139 electrically isolates the first pads 133 from the bit lines 154. The second insulating interlayer 139 may be formed using materials such as BPSG, USG, PSG, TEOS, HDP-CVD oxide, etc. These may be used alone or in a mixture thereof.

An upper portion of the second insulating interlayer 139 may be planarized by a CMP process, an etch-back process, or a combination of both a CMP process and an etch-back process.

A third photoresist pattern (not shown) is formed on the planarized second insulating interlayer 139. The second insulating interlayer 139 is partially etched using the third photoresist pattern as an etching mask to thereby form second contact holes (not shown) exposing the second pads 136 therethrough. The second contact holes correspond to bit line contact holes that electrically connect the second pads 136 to the bit lines 154, respectively.

The third photoresist pattern may be removed by an ashing and/or a stripping process. A third conductive layer (not shown) and a second mask layer (not shown) are then successively formed on the second insulating interlayer 139. Here, the second contact holes are filled with the third conductive layer. A fourth photoresist pattern (not shown) is formed on the second mask layer. The second mask layer and the third conductive layer are successively etched using the fourth photoresist pattern as an etching mask to thereby form the bit lines 154 on the second insulating interlayer 139. Here, third pads (not shown) that fill the second contact holes are formed simultaneously. Each of the bit lines 154 includes the bit line conductive pattern 145 and bit line mask 148. The third pads correspond to second bit line contact pads that electrically connect the second pads 136 to the bit lines 154, respectively.

Each of the bit line conductive patterns 145 may include a first film, and a second film formed on the first film. The first film may include a metal or a metal compound such as titanium/titanium nitride (Ti/TiN), and the second film may include a metal such as tungsten (W). Each of the bit line mask 148 protects the bit line conductive pattern 145 in an etching process for forming a fourth contact hole corresponding to a storage node contact hole. The bit line mask 148 may be formed using material that has etching selectivity relative to oxide. For example, the bit line mask 148 may be formed using a nitride such as silicon nitride.

In some embodiments of the invention, the second mask layer is patterned using the fourth photoresist pattern as an etching mask to form the bit line mask 148 on the third conductive layer. The fourth photoresist pattern is then removed. Sequentially, the third conductive layer is patterned using the bit line mask 148 as an etching mask, thereby forming the bit line conductive pattern 145 on the second insulating interlayer 139. Here, the third pads are formed simultaneously in the second contact holes. The third pads correspond to the second bit line contact pads that electrically connect the bit line conductive patterns 145 to the second pads 136, respectively.

A second insulation layer (not shown) covering the bit lines 154 is formed on the second insulating interlayer 139. The second insulation layer is anisotropically etched to form second spacers 151 on sidewalls of the bit lines 154. The second spacers 151 correspond to bit line spacers. The second spacers 151 protect the bit lines 154 in a subsequent etching process for forming fourth pads 157 that correspond to second storage node contact pads. The second spacers 151 may include material that has etching selectivity relative to the second insulating interlayer 139 and a third insulating interlayer 142. For example, the second spacers 151 include nitride such as silicon nitride.

The third insulating interlayer 142 that covers the bit lines 154 including the second spacers 151 is formed on the second insulating interlayer 139. The third insulating interlayer 142 may be formed using materials such as BPSG, USG, PSG, TEOS, HDP-CVD oxide, etc. These may be used alone or in a mixture thereof.

An upper portion of the third insulating interlayer 142 may be planarized by using a CMP process, an etch-back process, or a combination process of both a CMP process and an etch-back process until the bit line mask 148 is exposed.

A fifth photoresist pattern (not shown) is formed on the planarized second insulating interlayer 142. The third insulating interlayer 142 and the second insulating interlayer 139 are partially etched using the fifth photoresist pattern as an etching mask, thereby forming third contact holes (not shown) exposing the first pads 133 therethrough. The third contact holes correspond to first storage node contact holes. The third contact holes are formed through the third insulating interlayer 142 and the second insulating interlayer 139 by a self-alignment process. That is, the third contact holes are self-aligned relative to the second spacers 151 positioned on the sidewalls of the bit lines 154.

A fourth conductive layer is formed on the third insulating interlayer 142 to fill the third contact holes. An upper portion of the fourth conductive layer is then planarized by a CMP process, an etch-back process or a combination process of a CMP process and an etch back process until the third insulating interlayer 142 and the bit line mask pattern 148 are exposed. Thus, the fourth pads 157 are formed in the third contact holes, respectively. The fourth pads 157 correspond to the second storage node contact pads. The fourth pads 157 that contact the first pads 133 may be formed using conductive material such as doped polysilicon or metal. Each of the fourth pads 157 electrically connects the first pads 133 to a storage electrode 190 (see FIGS. 29 and 30) that is successively formed on the fourth pad 157.

Figure 13:
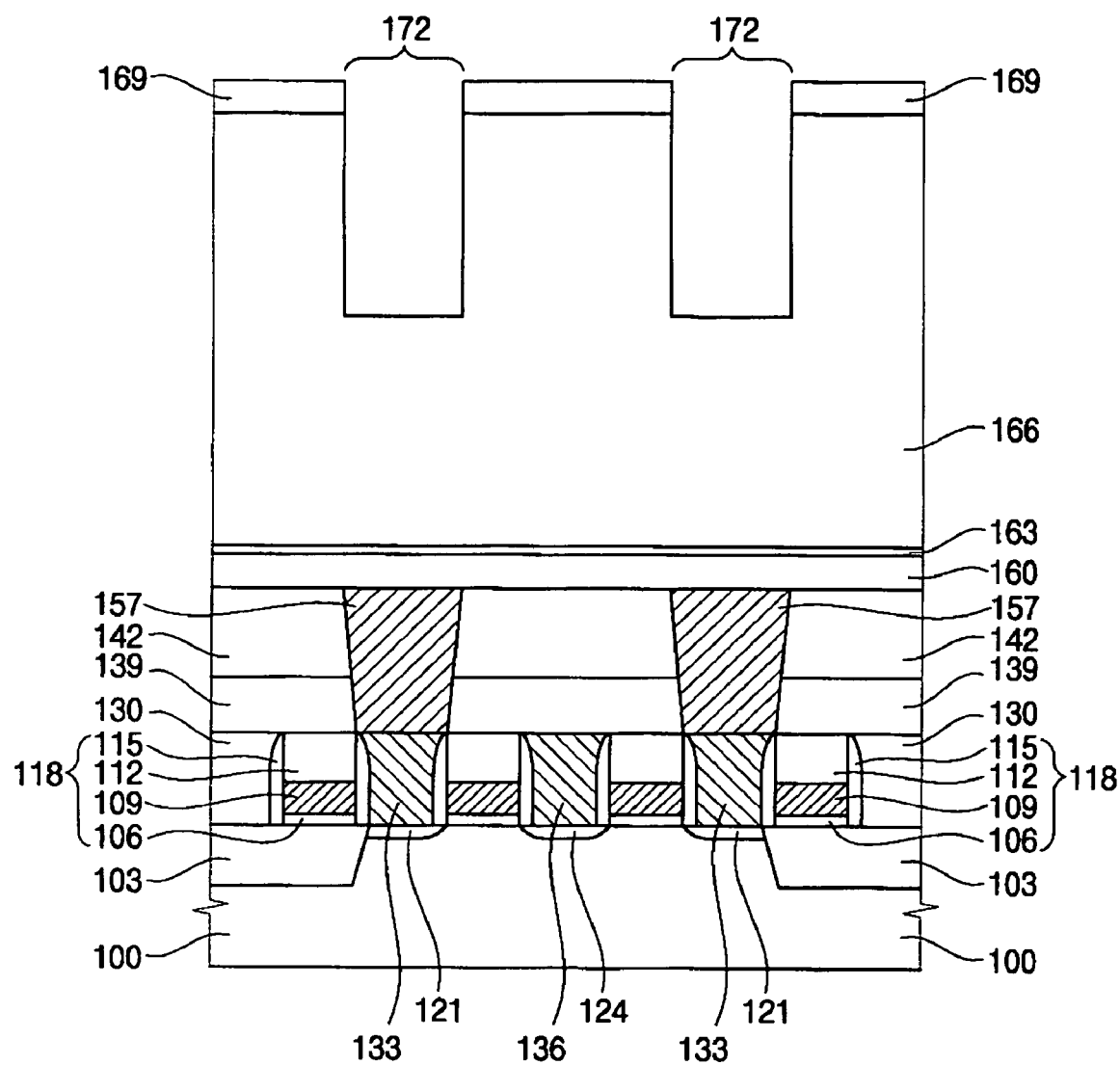
Figure 14:
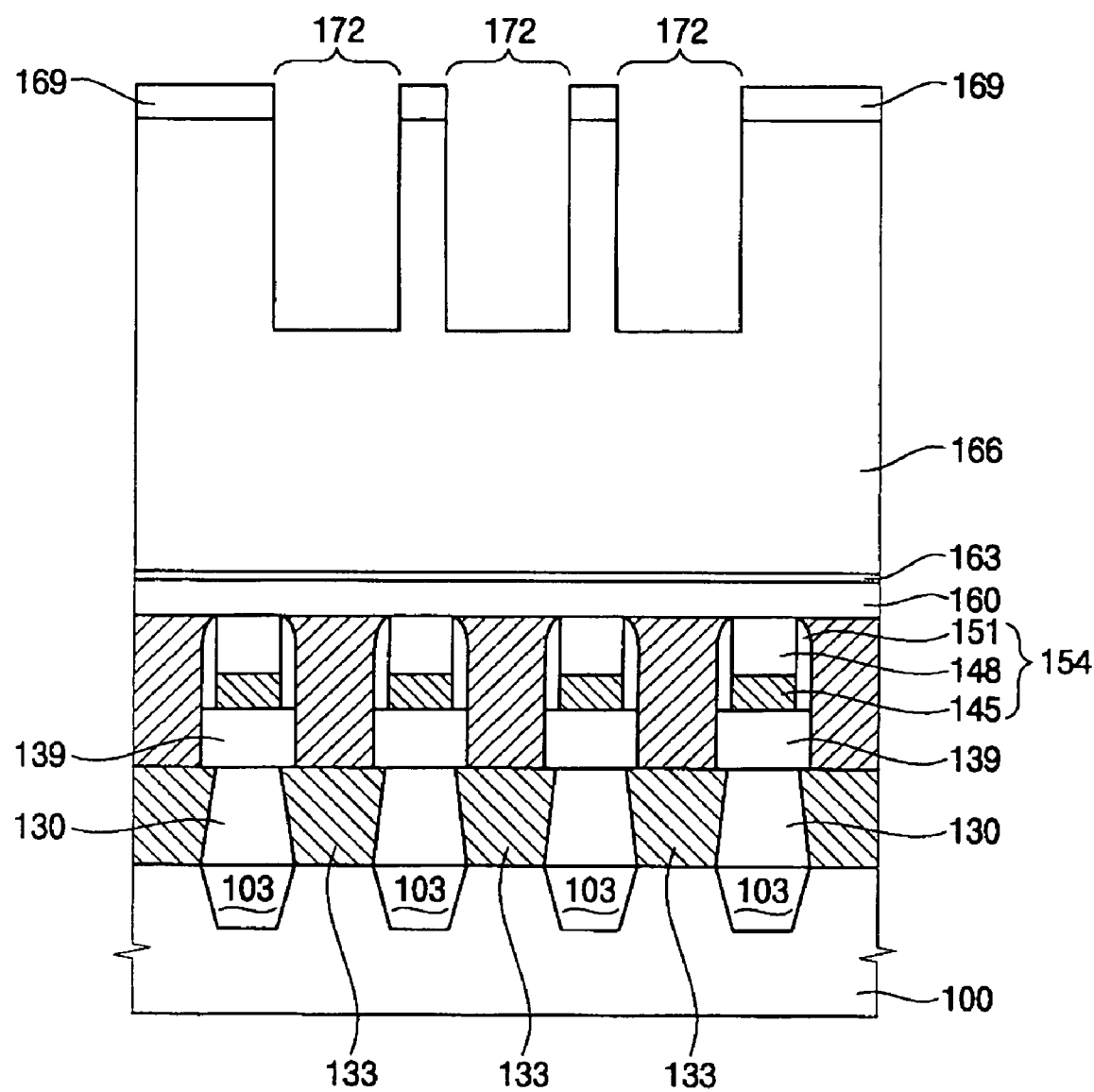

FIGS. 13 and 14 are cross-sectional diagrams illustrating exemplary processes for forming a mold layer 166 and a third mask layer 169.

Referring to FIGS. 13 and 14, a fourth insulating interlayer 160 is formed on the fourth pads 157, the bit lines 154, and the third insulating interlayer 142. The fourth insulating interlayer 160 may be formed using materials such as BPSG, USG, PSG, TEOS, HDP-CVD oxide, etc. These materials may be used alone or together in a mixture. The fourth insulating interlayer 160 electrically isolates the bit lines 154 from the storage electrodes 190.

An etching stop layer 163 is formed on the fourth insulating interlayer 160. The etching stop layer 163 may be formed using a material having an etching selectivity relative to the fourth insulating interlayer 160 and the mold layer 166. For example, the etching stop layer 163 may be formed using a nitride such as silicon nitride.

In some embodiments of the invention, the fourth insulating interlayer 160 may be planarized by a CMP process, an etch-back process, or a combination of both a CMP process and an etch-back process. The etching stop layer 163 may be formed on the planarized fourth insulating interlayer 160.

The mold layer 166 may be formed on the etching stop layer 163. The mold layer 166 may be formed using materials such as HDP-CVD oxide, USG, PSG, BPSG, SOG, etc. These materials may be used alone or together with one or more of the other materials in a mixture. The mold layer has a thickness of about 5,000 Å to about 50,000 Å measured from an upper face of the etching stop layer 163. The thickness of the mold layer 166 may vary in accordance with the desired capacitance of capacitors 200. The height of the capacitor 205 has an important role for determining the capacitance of the capacitor 205, and the capacitor 200 has height in proportion to the thickness of the mold layer 166. As a result, the thickness of the mold layer 166 may be advantageously adjusted so as to control the capacitance of the capacitor 205. In some embodiments of the invention, the mold layer 166 may be formed directly on the fourth insulating interlayer 160 without forming the etching stop layer 163.

The third mask layer is formed on the mold layer 166. The third mask layer may be formed using material that has an etching selectivity with respect to the mold layer 166 of oxide. For example, the third mask layer may be formed using a polysilicon or a nitride such as silicon nitride. The third mask layer has a thickness of about 100 Å to about 6,000 Å measured from an upper face of the mold layer 166. As described above, the thickness of the mold layer may vary in accordance with the thickness of the desired capacitance of the capacitor 190. Alternatively, the mold layer 166 may be planarized using a CMP process, an etch-back process, or a combination of both a CMP process and an etch-back process. The third mask layer may be formed on the planarized mold layer 166.

A sixth photoresist pattern (not shown) is formed on the third mask layer. The third mask layer is patterned using the sixth photoresist pattern as an etching mask to form a storage node mask 169 on the mold layer 166.

The sixth photoresist pattern is removed by an ashing process and/or a stripping process. An upper portion of the mold layer 166 is anisotropically etched using the storage node mask 169 as an etching mask to thereby form openings 172 at the upper portion of the mold layer 166. The openings 172 are positioned over the fourth pads 157 and the first pads 133. In some embodiments of the invention, the sixth photoresist pattern may be removed during an etching process for forming the openings 172 at the upper portion of the mold layer 166 without performing the ashing process and/or the stripping process.

Figure 15:
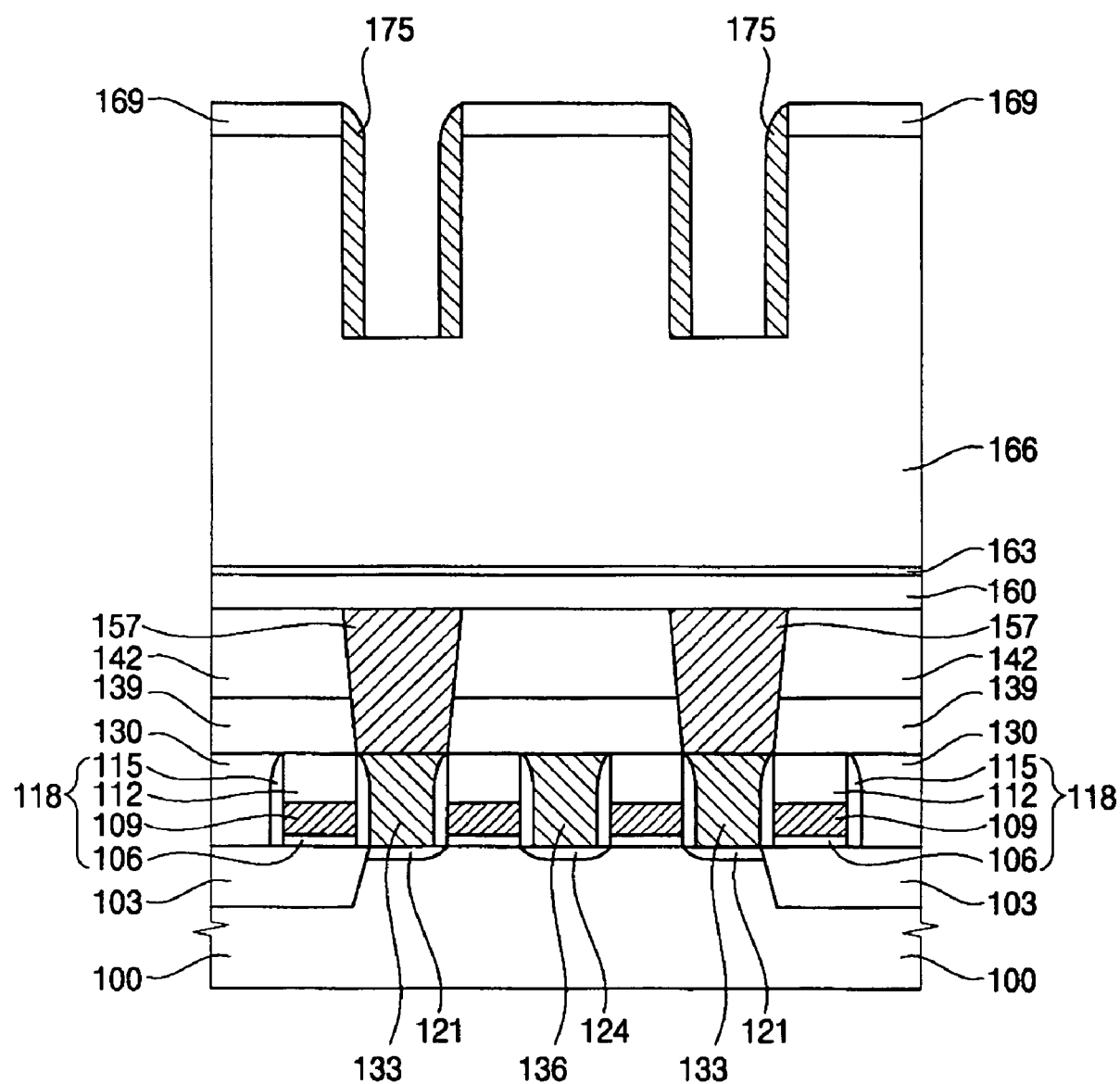
Figure 16:
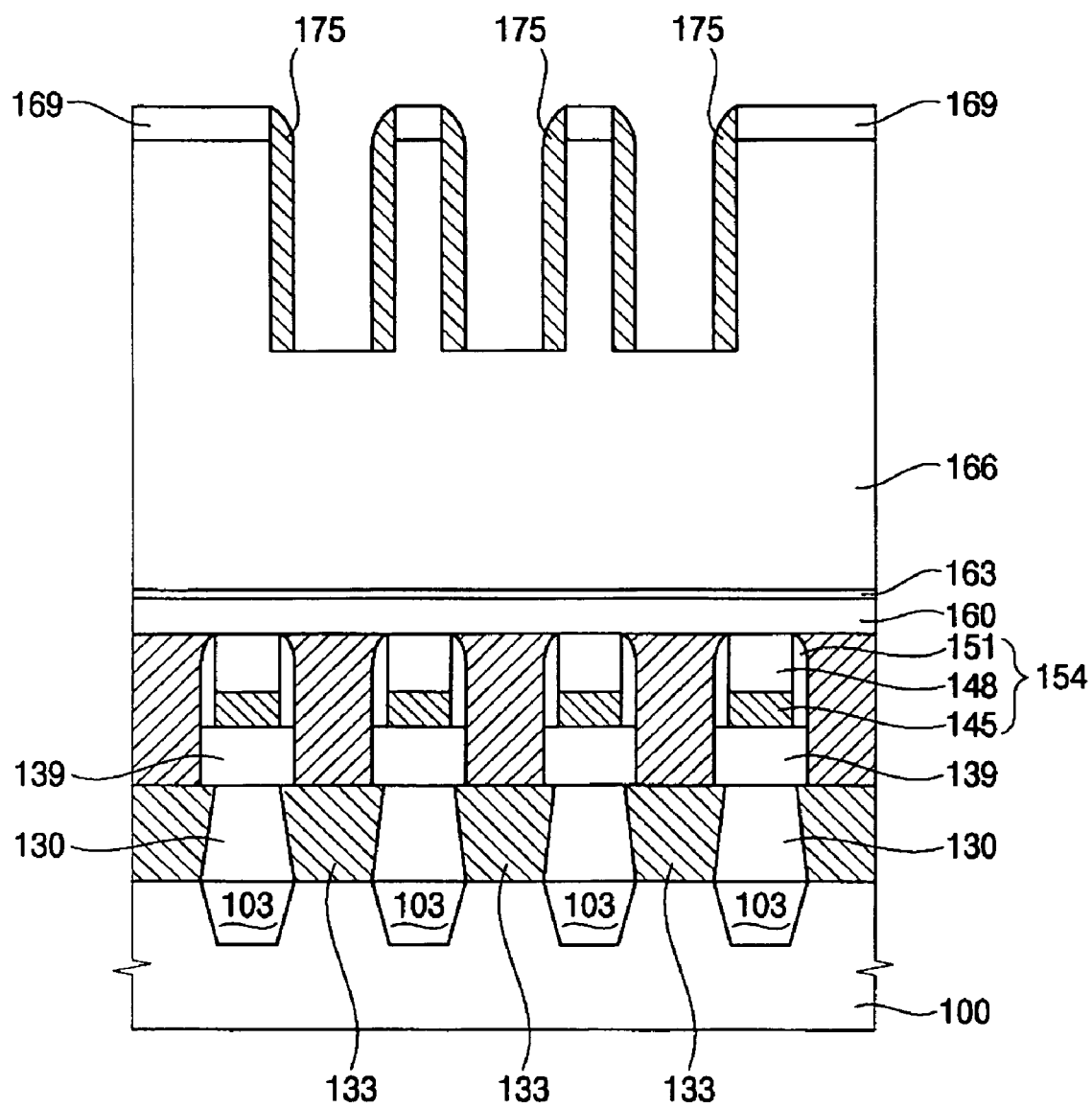

FIGS. 15 and 16 are cross-sectional diagrams illustrating an exemplary process for forming third spacers 175.

Referring to FIGS. 15 and 16, a fifth conductive layer is formed on the storage node mask 169 to fill the first openings 172. The fifth conductive layer is anisotropically etched to form the third spacers 175 on sidewalls of the first openings 172. The third spacers 175 correspond to storage node spacers. The third spacers 175 are formed using material that has an etching selectivity with respect to the fourth insulating interlayer 160 and the mold layer 166, wherein the fourth insulating interlayer 160 and the mold layer 166 include oxide. The third spacers 175 may be formed of polysilicon, doped polysilicon, metal, etc. The third spacers 175 may be successively formed as complementary members 176 that improve structural stability and electrical characteristics of storage electrodes 190. According to embodiments of the invention, the complementary members 176 are formed at upper portions of storage conductive patterns 188. As a result, the storage electrodes 190 may be formed without thinning the upper portions of the storage electrodes 190 by the etching processes. Accordingly, the structural stability of the storage electrodes 190 may be improved. In addition, the electrical characteristics of the capacitors 200 that include the storage electrodes 190 may be improved.

Figure 17:
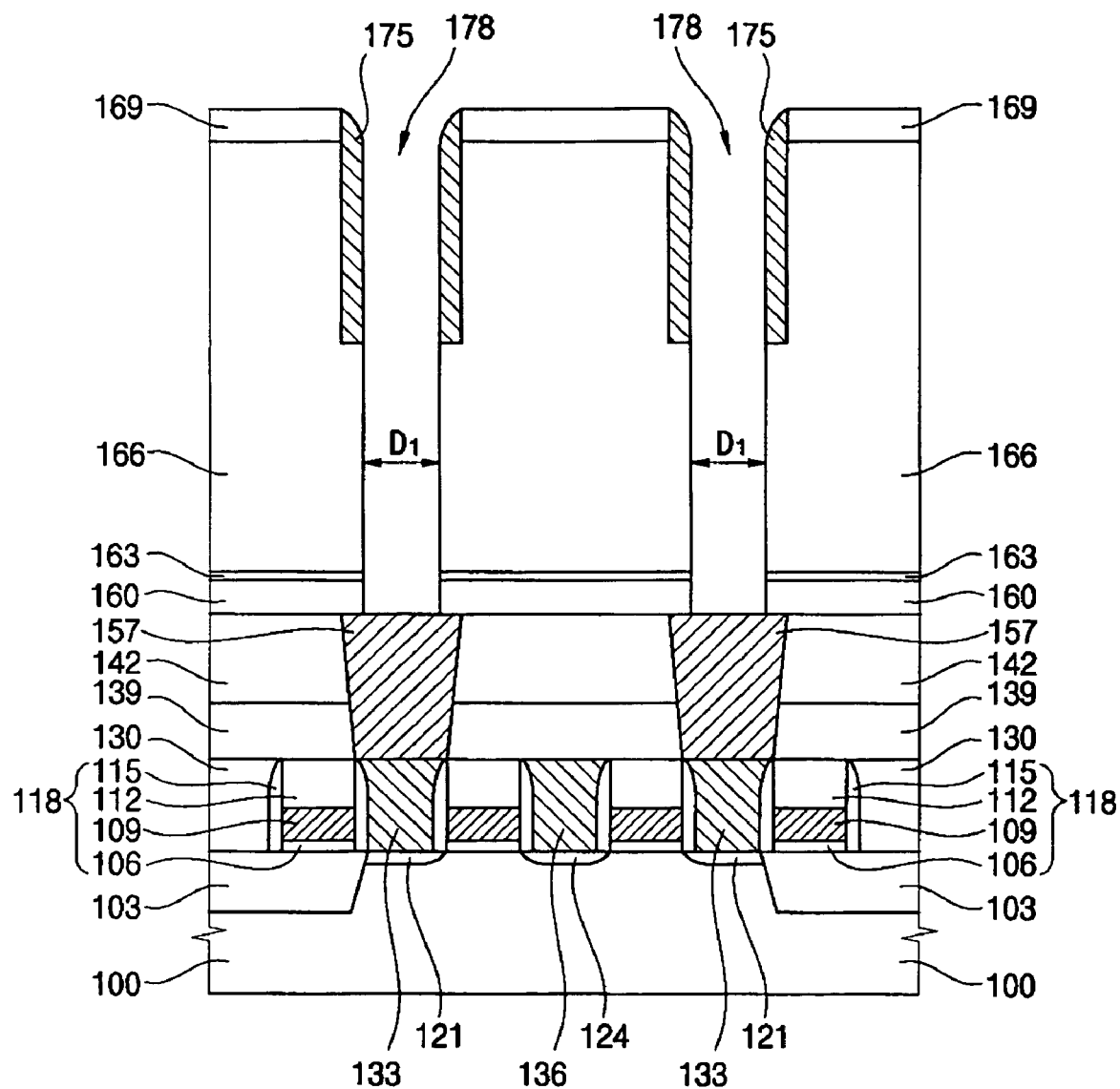
Figure 18:
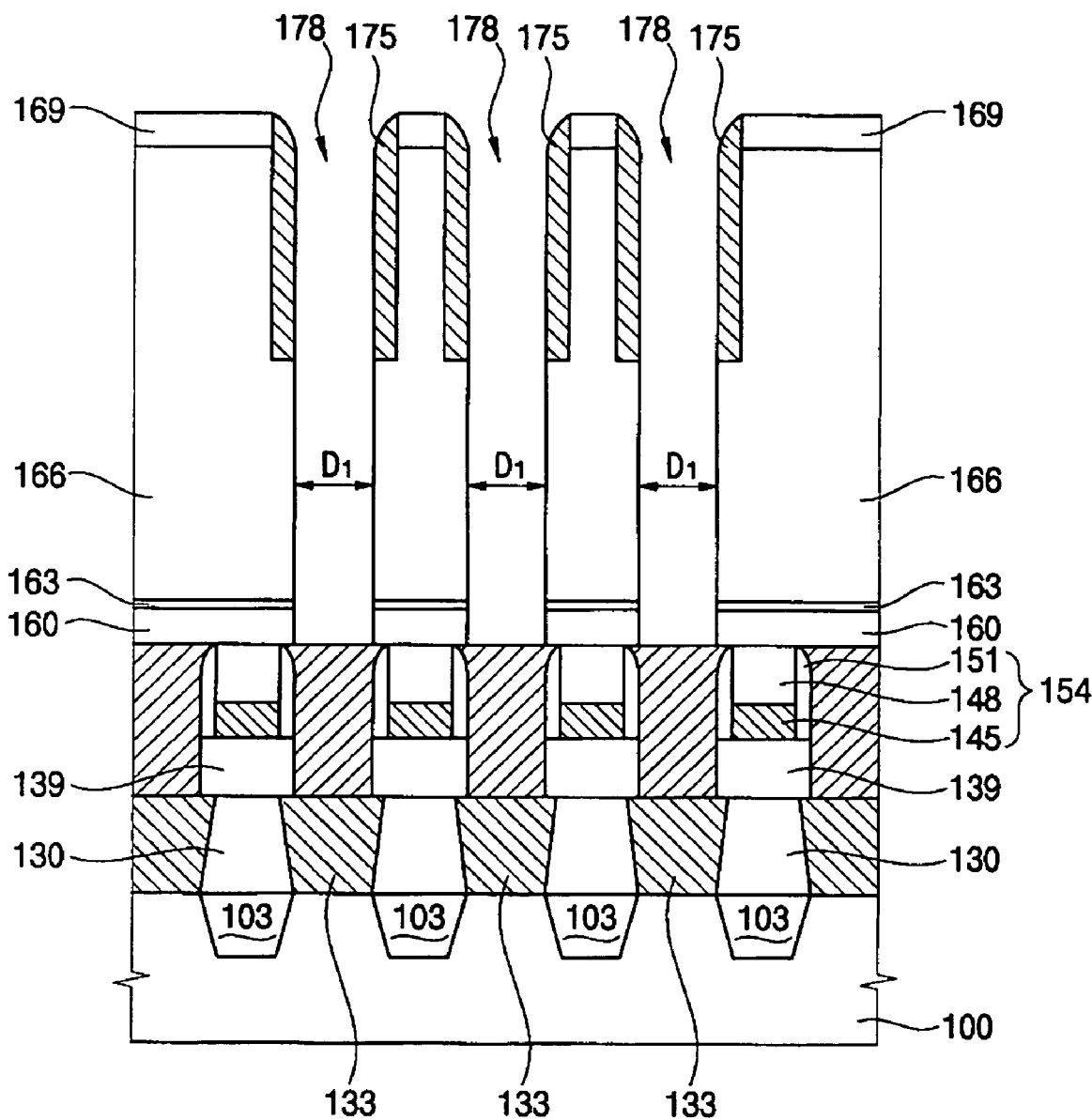

FIGS. 17 and 18 are cross-sectional diagrams illustrating an exemplary process for forming fourth contact holes 174 through the mold layer 166.

Referring to FIGS. 17 and 18, the mold layer 166, the etching stop layer 163, and the fourth insulating interlayer 160 are successively etched using the storage node mask 169 and the third spacers 175 as etching masks to thereby form fourth contact holes 178 that expose the fourth pads 157, respectively. The fourth contact holes 178 are formed through the mold layer 166, the etching stop layer 163, and the fourth insulating interlayer 160 by a self-alignment process. That is, the fourth contact holes 178 are self-aligned relative to the third spacers 175. Here, the fourth contact holes 178 that partially expose the fourth pads 157 have relatively narrow first diameters D1.

Figure 19:
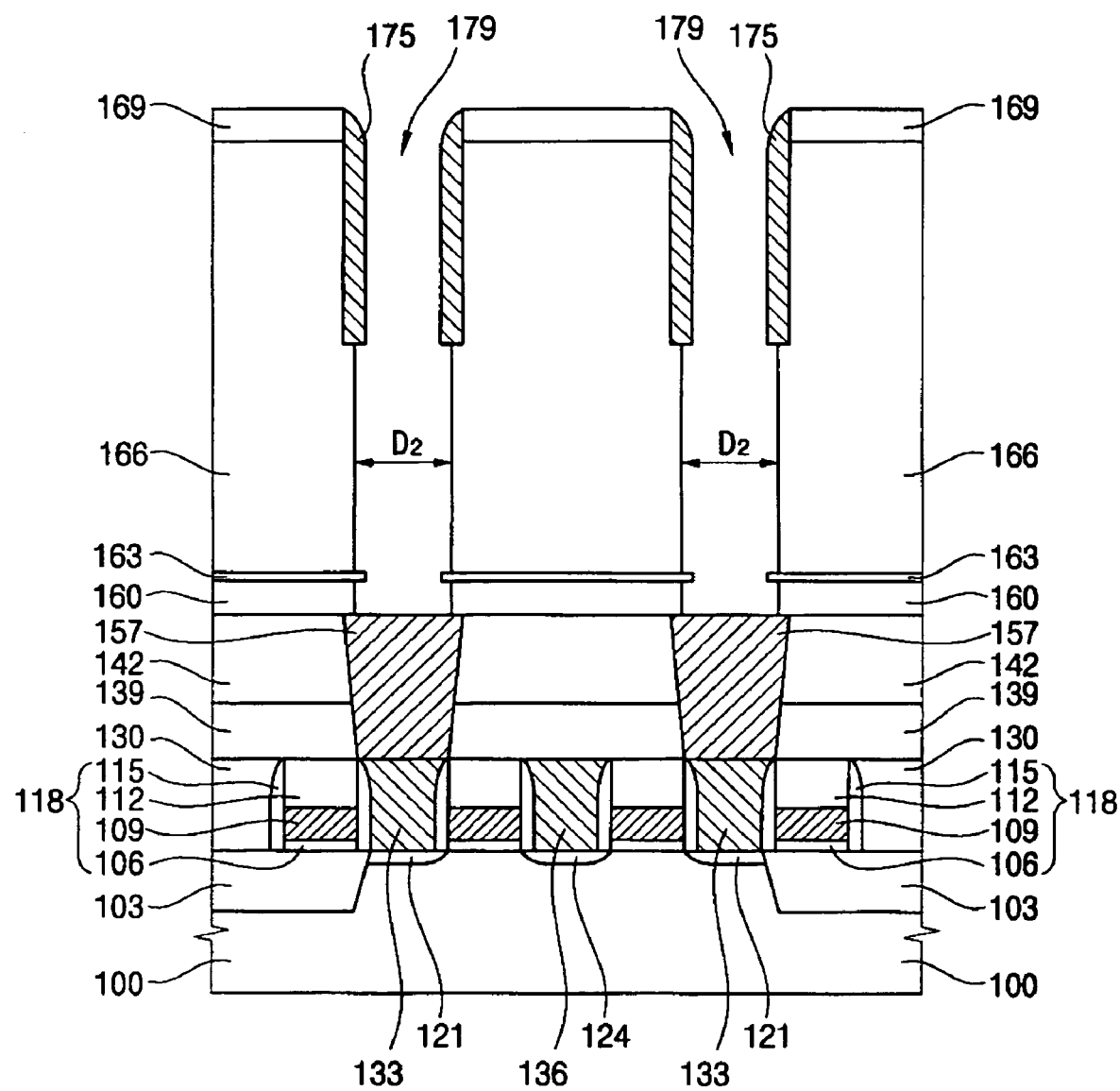
Figure 20:
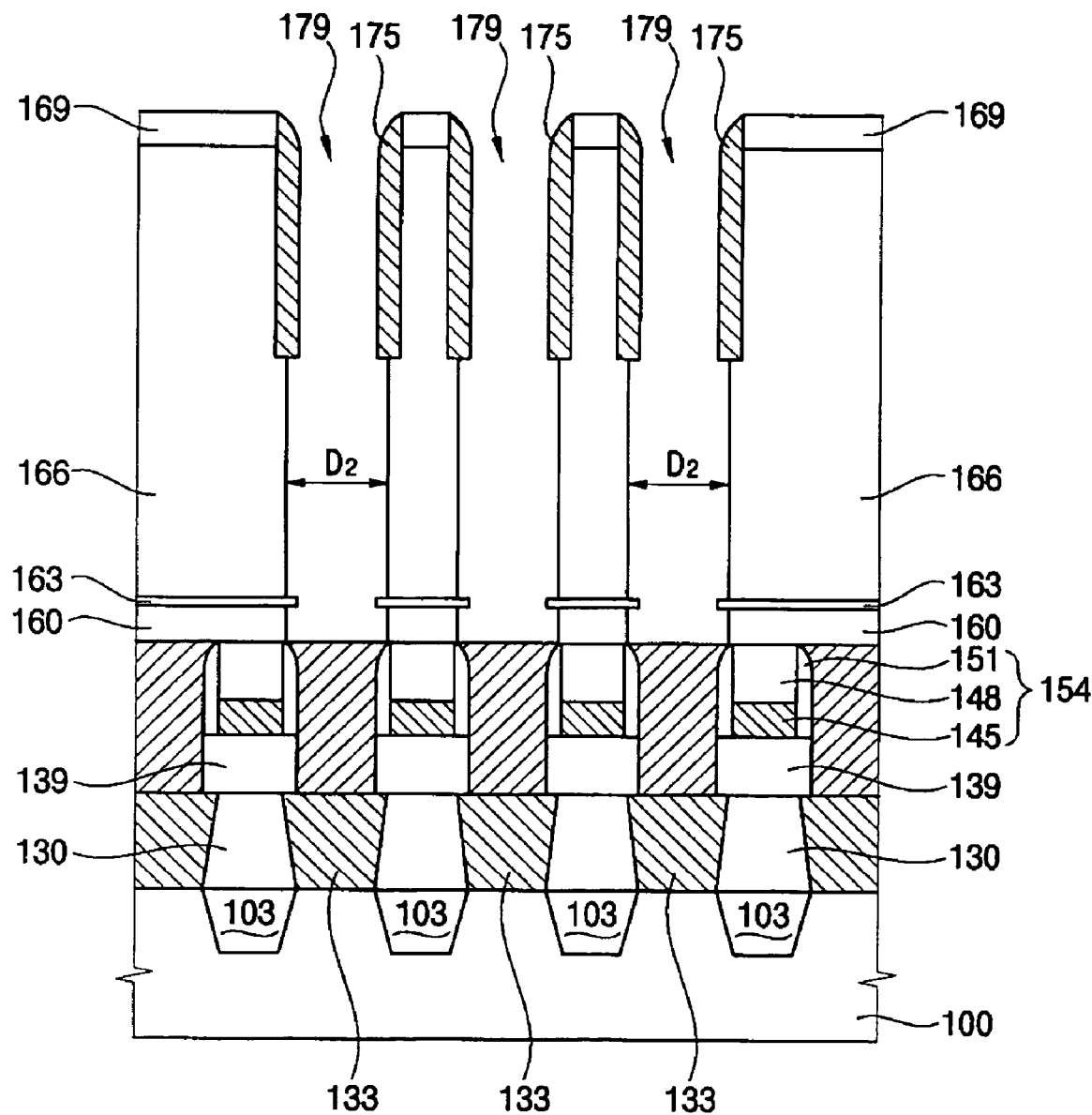

FIGS. 19 and 20 are cross-sectional diagrams illustrating an exemplary process for forming the fifth contact holes 179.

Referring to FIGS. 19 and 20, a cleaning process is performed on the semiconductor substrate 100 that includes the mold layer 166 that has the fourth contact holes 178 of the first diameter D1. The cleaning process may be performed using a cleaning solution that includes at least two of the following: deionized water, an ammonia solution, and sulfuric acid. The cleaning process may be performed for about 5 to about 20 minutes. After the cleaning process is carried out, the fourth contact holes 178 having the first diameter D1 are extended so that the fifth contact holes 179 having a second diameter D2 are formed through the mold layer 166.

According to embodiments of the invention, the second diameter D2 of the fifth contact holes 179 are relatively greater than that of the first diameter D1 of the fourth contact holes 178. As a result, the exposed portions of the fourth pads 157 through the fifth contact holes 179 are wider than those portions exposed through the fourth contact holes 178. The fifth contact holes 179 correspond to second storage node contact holes for forming the storage electrodes 190. In forming the fifth contact holes 179 using the above-described cleaning solution, the etching stop layer 163 may be slightly etched. It is because the etching stop layer 163 that includes nitride has an etching selectivity with respect to the fourth storage node mask 169 and the mold layer 166, wherein the fourth storage node mask 169 and the mold layer 166 include oxide. As a result, the etching stop layer 163 is horizontally and partially exposed from inner faces of the fifth contact holes 179. Because storage conductive patterns 188 that cover the protruding portions of the etching stop layer 163 are formed, the stability of lower portions of the storage electrode patterns 188 may be greatly improved.

Because the fifth contact hole 179 have an extended second diameter D2, the lower portions of the spacers 175 are partially supported by the mold layer 166. Hence, the structural stability of the third spacers 175 may be greatly improved. That is, the sidewalls of the third spacers 175 are attached to the mold layer 166, and the lower portions of the third spacers 175 are partially supported by the mold layer 166. As a result, the structural stability of the third spacers 175 may be largely improved. The complementary members 176 structurally stabilize the upper portions of the storage electrodes 190. Simultaneously, the protruding portions of the etching stop layer 163 structurally stabilize the lower portions of the storage electrodes 190. Consequently, according to embodiments of the invention, the capacitors 200 have a greater structural stability than that of conventional capacitors that were described above.

In addition, because the storage electrodes 190 are formed on the interior of the extended fifth contact holes 179, the area that the storage electrodes 190 occupy may be increased. Therefore, the capacitors 200 that include the storage electrodes 190 may have a largely improved capacitance. Namely, because the fifth contact holes 179 have extended areas that are wider than those of the fourth contact holes 178 by about 50 to 100 percent during the cleaning process, the areas of the storage electrodes 190 formed on the interiors of the fifth contact holes 179 may be increased. Because the capacitance is proportional to the area of the storage electrode 190, the capacitor 200 that includes the storage electrode 190 formed on the inside of the fifth contact hole 179 may have a capacitance that is greater than that of the conventional capacitor by about 50 to about 100 percent.

Figure 21:
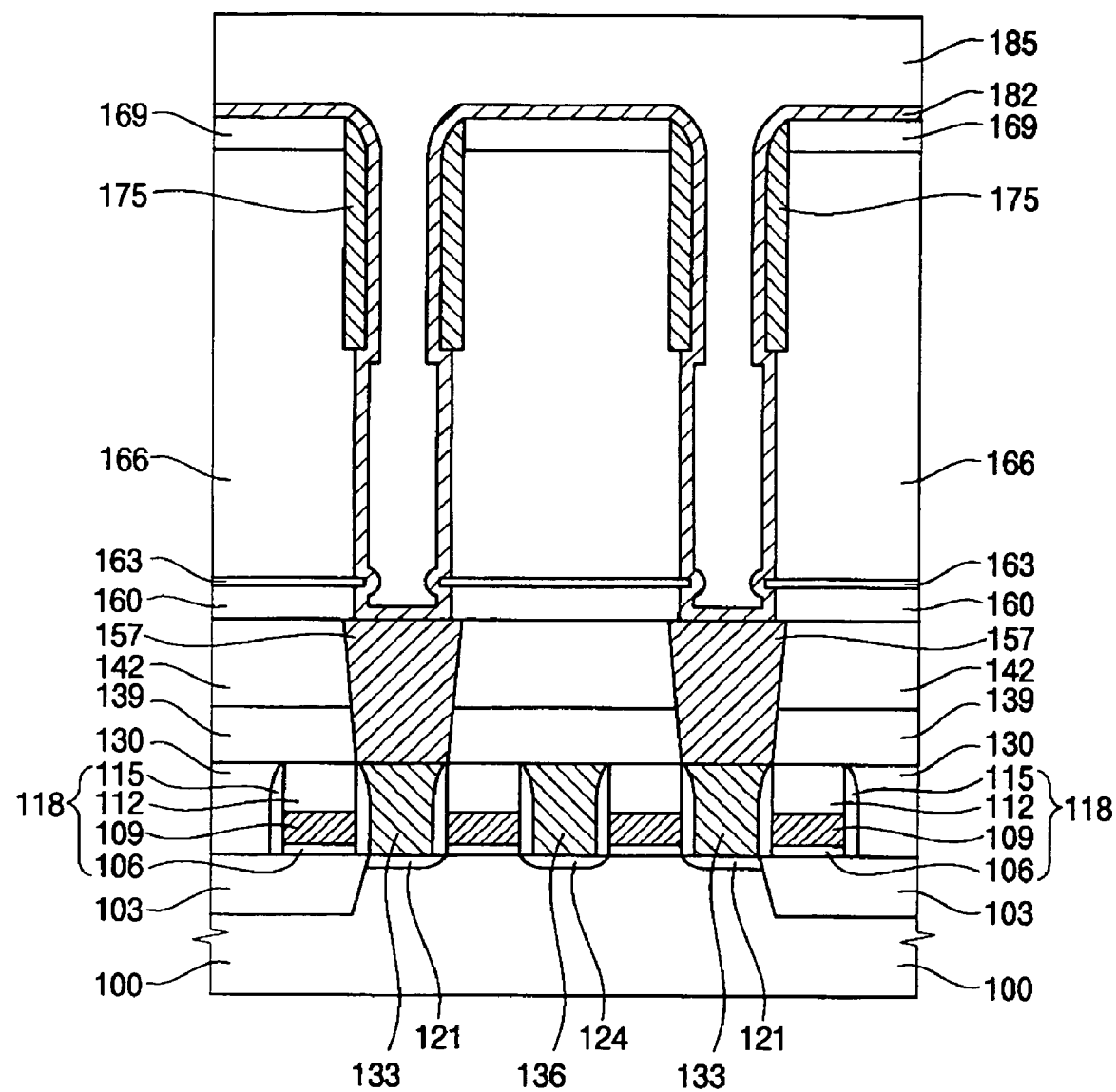
Figure 22:
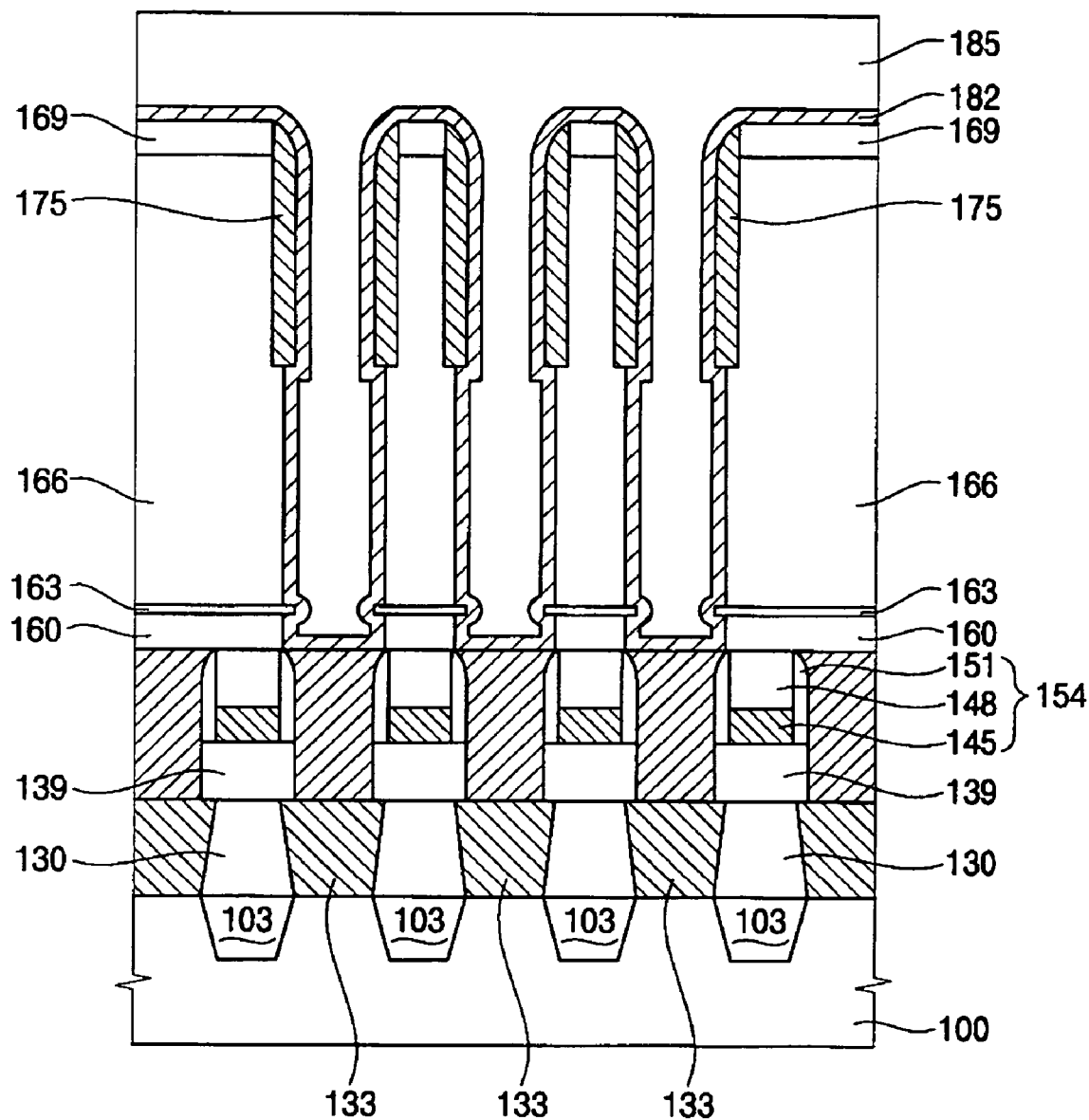

FIGS. 21 and 22 are cross-sectional diagrams illustrating an exemplary process for forming a sixth conductive layer 182 and a sacrificial layer 185.

Referring to FIGS. 21 and 22, a sixth conductive layer 182 is formed on the fourth pads 167 that are partially exposed through the fifth contact holes 179, on the insides of the fifth contact holes 179, on the third spacers 175, and on the storage node mask 169. Preferably, the sixth conductive layer 182 may include material that is used to form the third spacers 182. That is, the sixth conductive layer 182 may be formed using a material such as doped polysilicon, metal, etc.

Because the sixth conductive layer 182 covers the partially exposed portions of the etching stop layer 163 within the fifth contact holes 179, the sixth conductive layer 182 has inwardly protruding portions. The protruding portions of the sixth conductive layer 182 improve the structural stability of the lower portions of the storage conductive patterns 188. Therefore, the storage electrode 190 that includes the storage conductive pattern 188 and the complementary member 176 may have a greatly improved structural stability.

A sacrificial layer 185 that includes oxide is formed on the sixth conductive layer 182 to fill the fifth contact holes 179. The sacrificial layer 185 protects the storage conductive patterns 188 during successive etching processes. The sacrificial layer 185 is removed during formation of the storage electrodes 190. The sacrificial layer 185 may be formed using a material such as BPSG, USG, PSG, TEOS, HDP-CVD oxide, etc. These materials may be used either singly or in combination with one or more of the other materials. In some embodiments of the invention, an upper portion of the sacrificial layer 185 may be planarized by an etch-back process, a CMP process, or a combination of an etch-back process and a CMP process.

Figure 23:
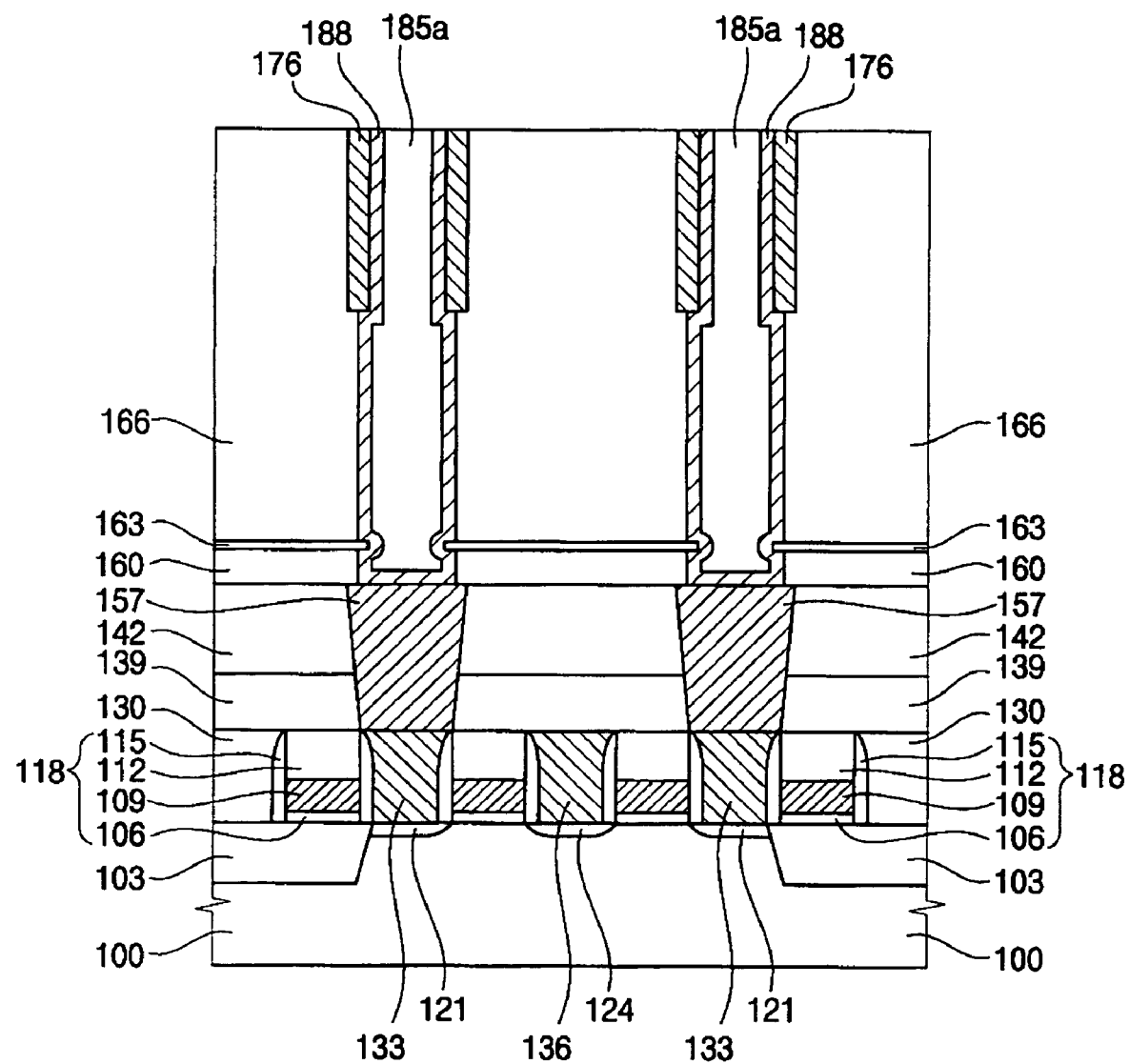
Figure 24:
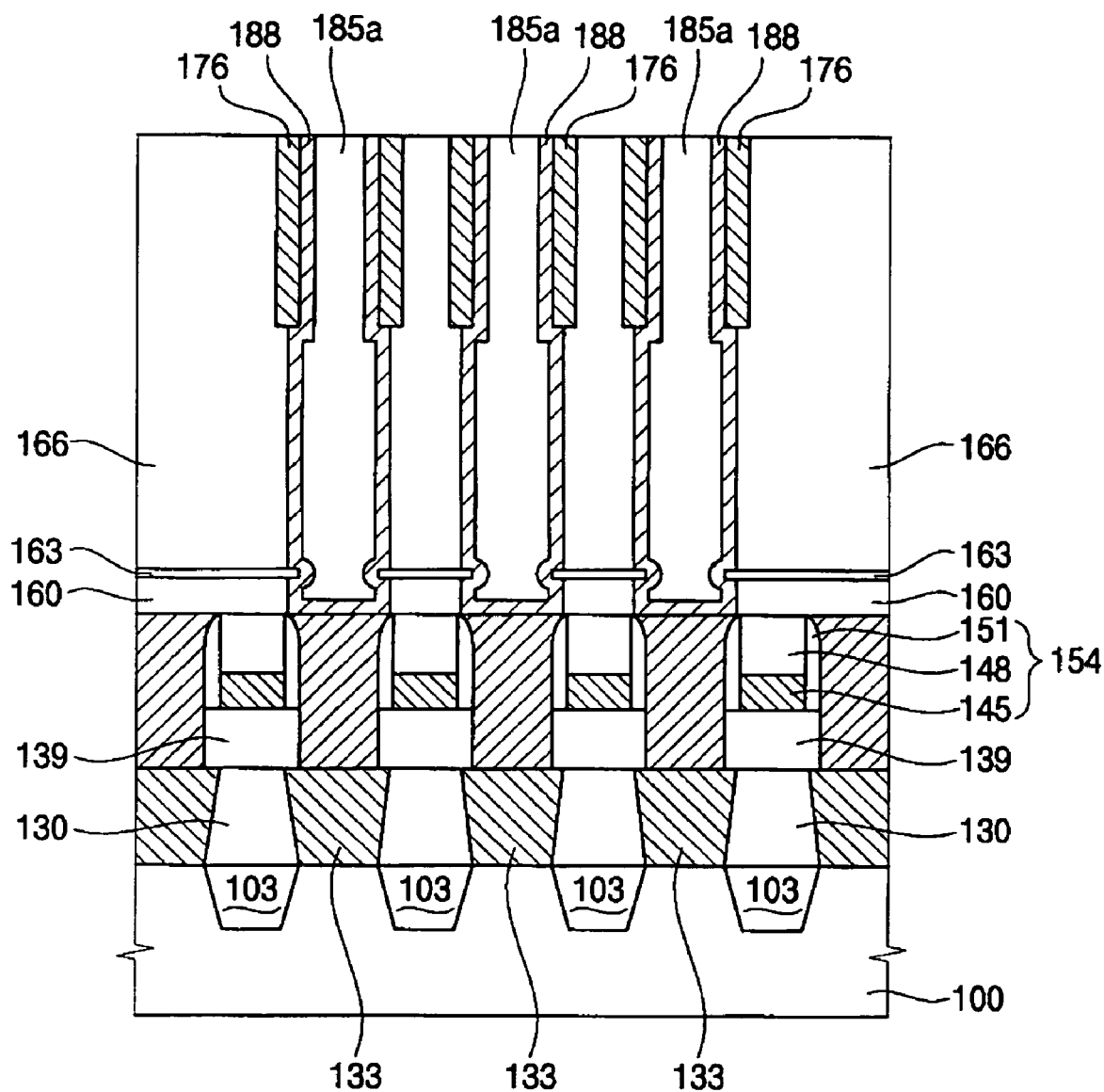

FIGS. 23 and 24 are cross-sectional diagrams illustrating an exemplary process for forming the complementary members 176 and the storage conductive patterns 188.

Referring to FIGS. 23 and 24, the upper portion of the sacrificial layer 185, an upper portion of the sixth conductive layer 182, a storage node mask 169, and an upper portion of the third spacer 175 are removed by an etch-back process, a CMP process, or a combination of an etch-back process and a CMP process until the mold layer 166 is exposed. Thus, the storage conductive patterns 188 and the sacrificial layer patterns 185*a* are formed in the fifth contact holes 179. The upper portions of the third spacers 176 are removed to form the complementary members 176 that enclose upper portions of the storage conductive patterns 188. The sacrificial layer patterns 185*a* protect the storage conductive patterns 188 during the successive etching processes. The complementary members 176 complement the etch loss of upper portions of the storage electrodes 190 so that the electrical characteristics of the storage electrodes 190 are not compromised even though the storage conductive patterns 188 may be damaged during the successive etching processes. The complementary members 176 also structurally assist the protruding portions of the etching stop layer 163 formed at the lower portions of the sixth conductive layer 182, thereby improving the structural stability of the storage electrodes 190.

In these embodiments, the complementary member 176 has a ring-shaped structure that encloses the upper portion of the storage conductive pattern 188 that has a cylindrical structure. That is, the complementary member 176 having the ring-shaped structure has a diameter that is greater than that of an upper portion of the storage conductive pattern 188, thereby encompassing the upper portion of the storage conductive pattern 188. Although the complementary members 176 and the storage conductive patterns 188 may not be formed by a substantially identical process, the complementary members 176 are preferably formed using a material that is substantially identical to that used for the storage conductive patterns 188. Hence, the complementary members 176 and the storage conductive patterns 188 may be integrally formed. That is, because the storage conductive patterns 188 that include doped polysilicon or metal may be formed on the complementary members 176 that include doped polysilicon or metal, the storage conductive patterns 188 are integrally formed with the complementary members 176. Therefore, the storage conductive patterns 188 may not separated from the complementary members 176 during successive etching and depositing processes.

Figure 25:
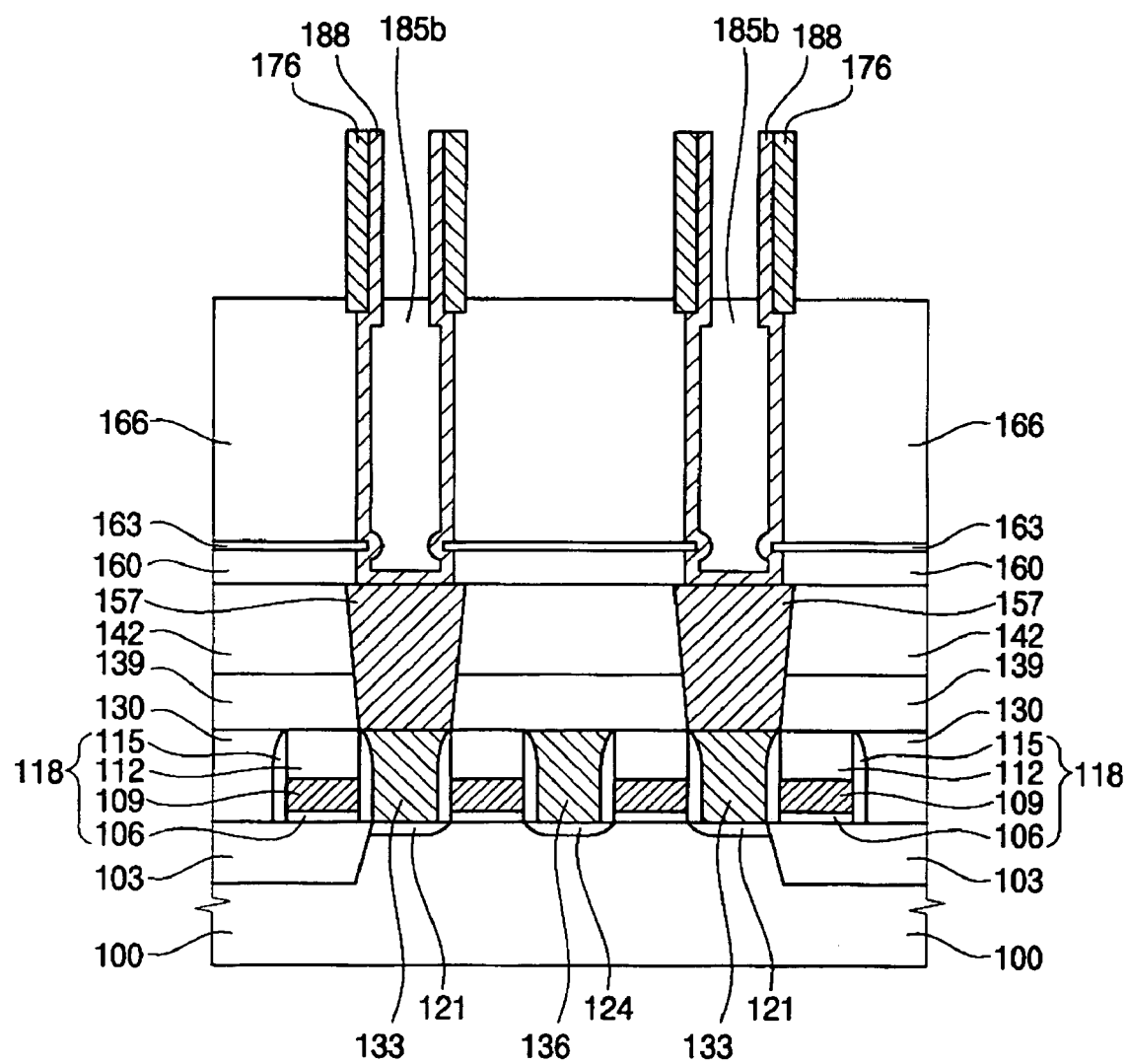
Figure 26:
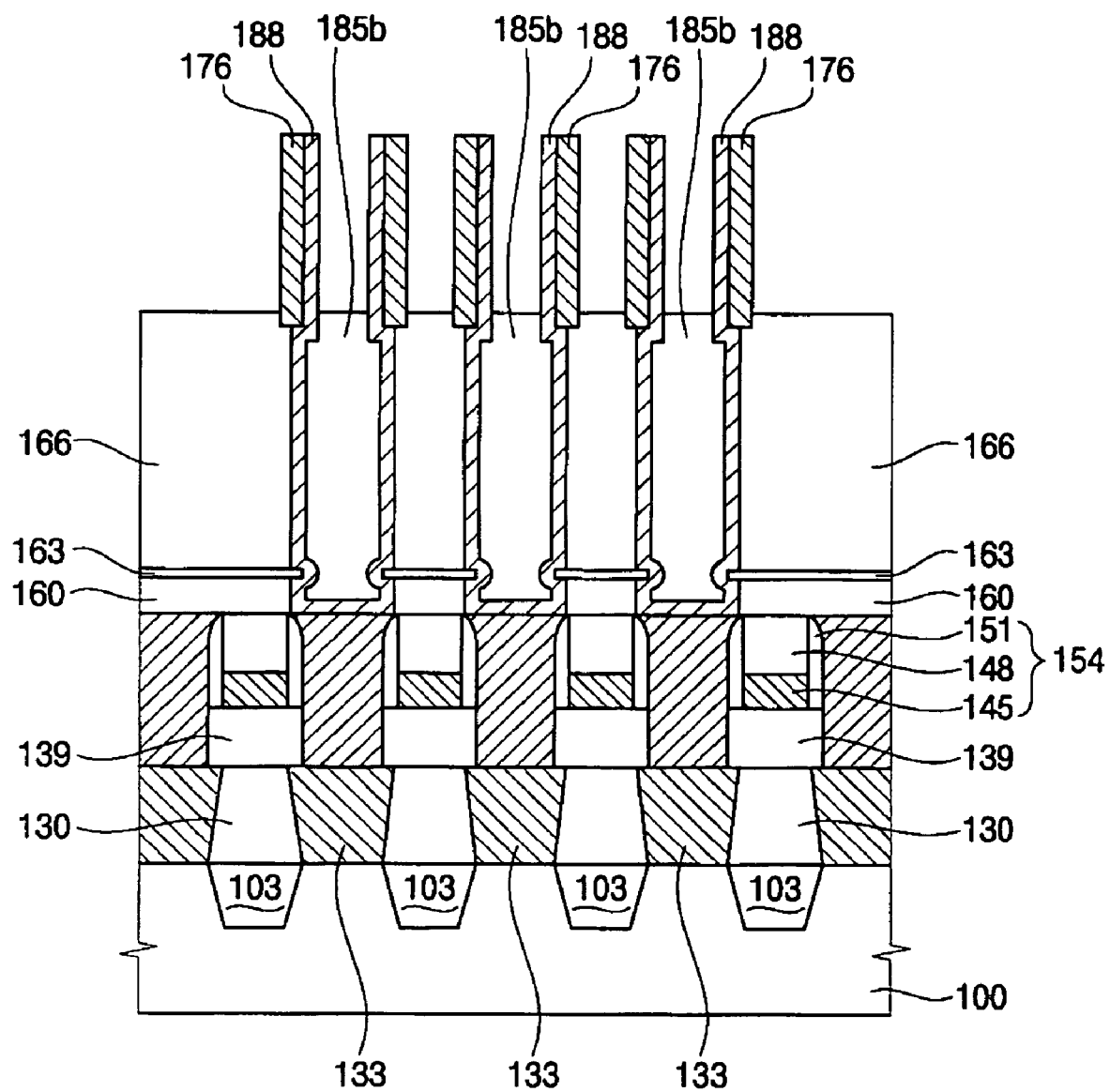

FIGS. 25 and 26 are cross-sectional diagrams illustrating a first exemplary process for removing the mold layer 166 and the sacrificial layer patterns 185*a*.

Referring to FIGS. 25 and 26, upper portions of the mold layer 166 and sacrificial layer patterns 185*a* are partially removed by a dry or wet etching process. Because the complementary members 176 and the storage conductive patterns 188 have an etching selectivity relative to the mold layer 166 and the oxide sacrificial layer patterns 185*a*, the complementary members 176 and the storage conductive patterns 188 are slightly etched during the dry or a wet etching process for removing the upper portions of the mold layer 166 and sacrificial layer patterns 185*a*.

Preferably, after the mold layer 166 and the sacrificial layer patterns 185*a* are partially etched by the dry etching process using a first etching gas that includes hydrogen fluoride (HF) and water vapor ($H_2O$), the mold layer 166 and the sacrificial layer 185*a* are then partially etched using a second etching gas that includes carbon tetrafluoride ($CF_4$) and oxygen ($O_2$). Because the second etching gas has an etch selectivity of about 50:1 between the polysilicon and the oxide, the complementary members 176 and the storage conductive patterns 188 are slightly etched during the partial etching of the mold layer 166 and the sacrificial layer patterns 185*a*. Here, the complementary members 176 compensate for the loss of the upper portions of the storage conductive patterns 188 and prevent the upper portions of the storage electrodes 190 from becoming thinner during the etching process.

Figure 27:
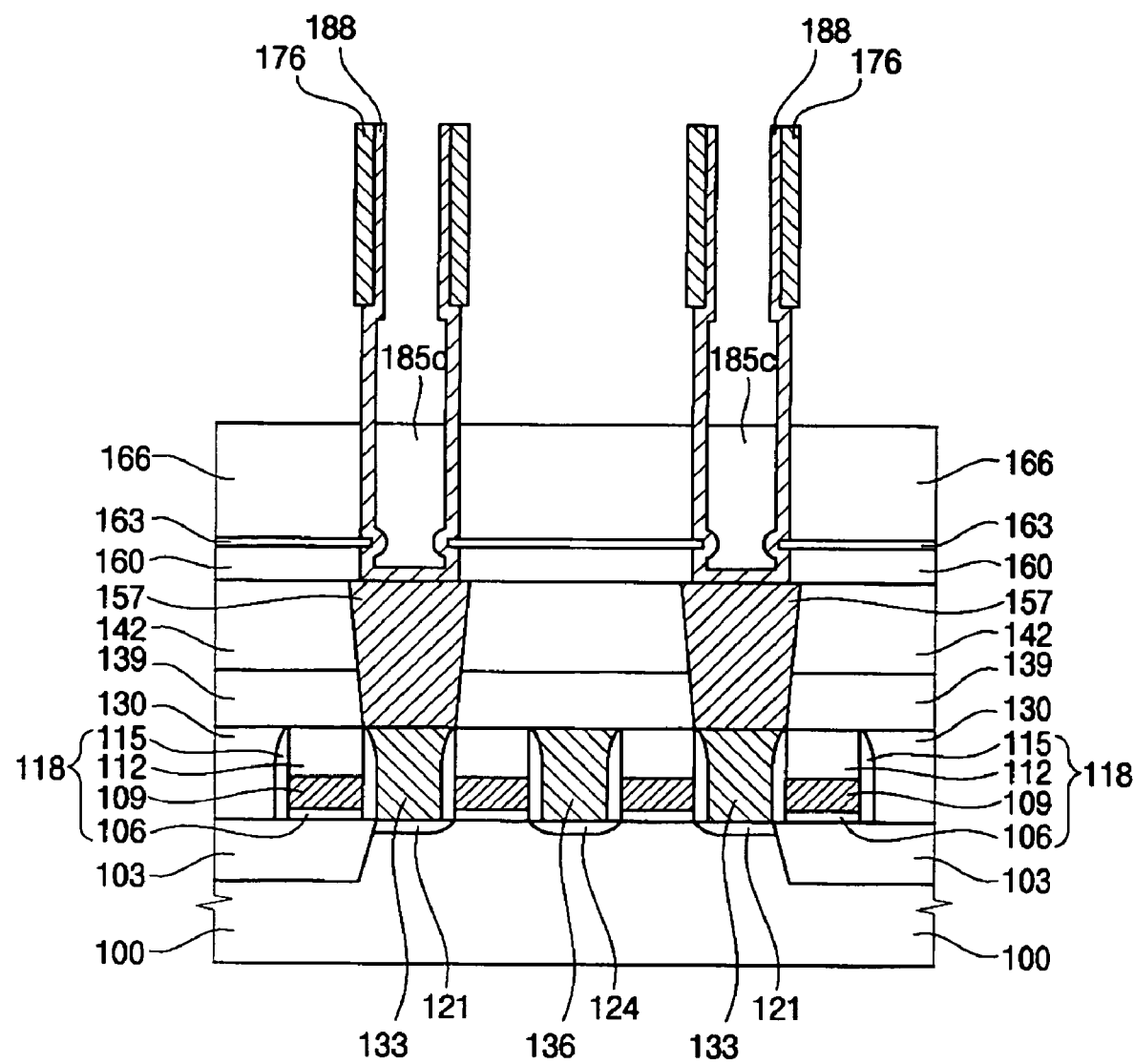
Figure 28:
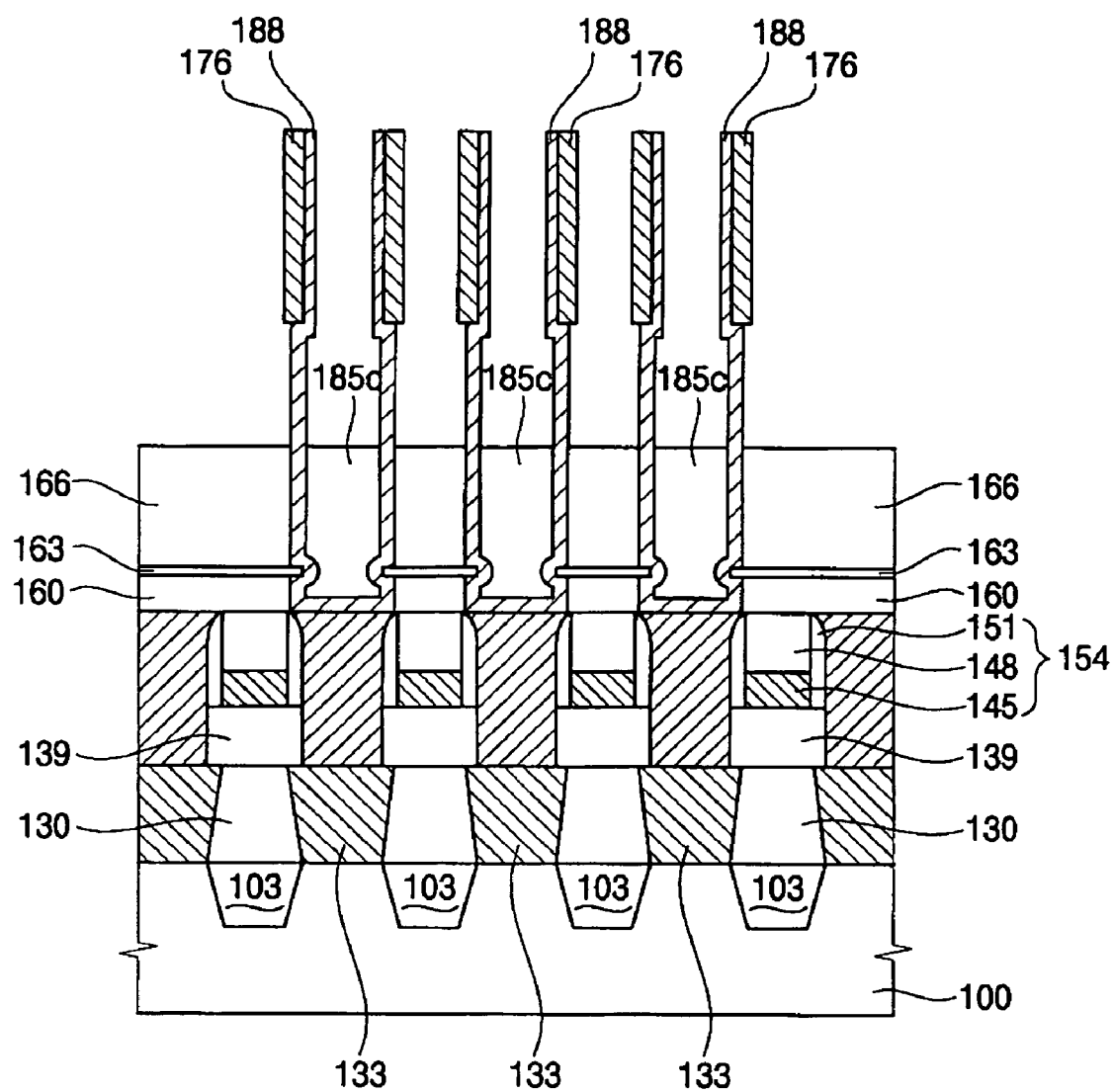

FIGS. 27 and 28 are cross-sectional diagrams illustrating a second exemplary process for removing the mold layer 166 and the sacrificial layer pattern 185*a*.

Referring to FIGS. 27 and 28, after the mold layer 166 and the sacrificial layer patterns 185*a* have been partially etched by the first process described above, the layers undergo a second dry or a wet etching process until central portions of the storage conductive patterns 188 are exposed.

Preferably, the mold layer 166 and the sacrificial layer patterns 185*a* are dry etched by the second process using the first and second drying gases, sequentially. Although the storage conductive patterns 188 and the complementary members 176 may be slightly etched, the complementary members 176 that enclose the upper portions of the storage conductive patterns 188 may compensate for the etch loss of upper portions of the storage conductive patterns 188 during the etching process.

Figure 29:
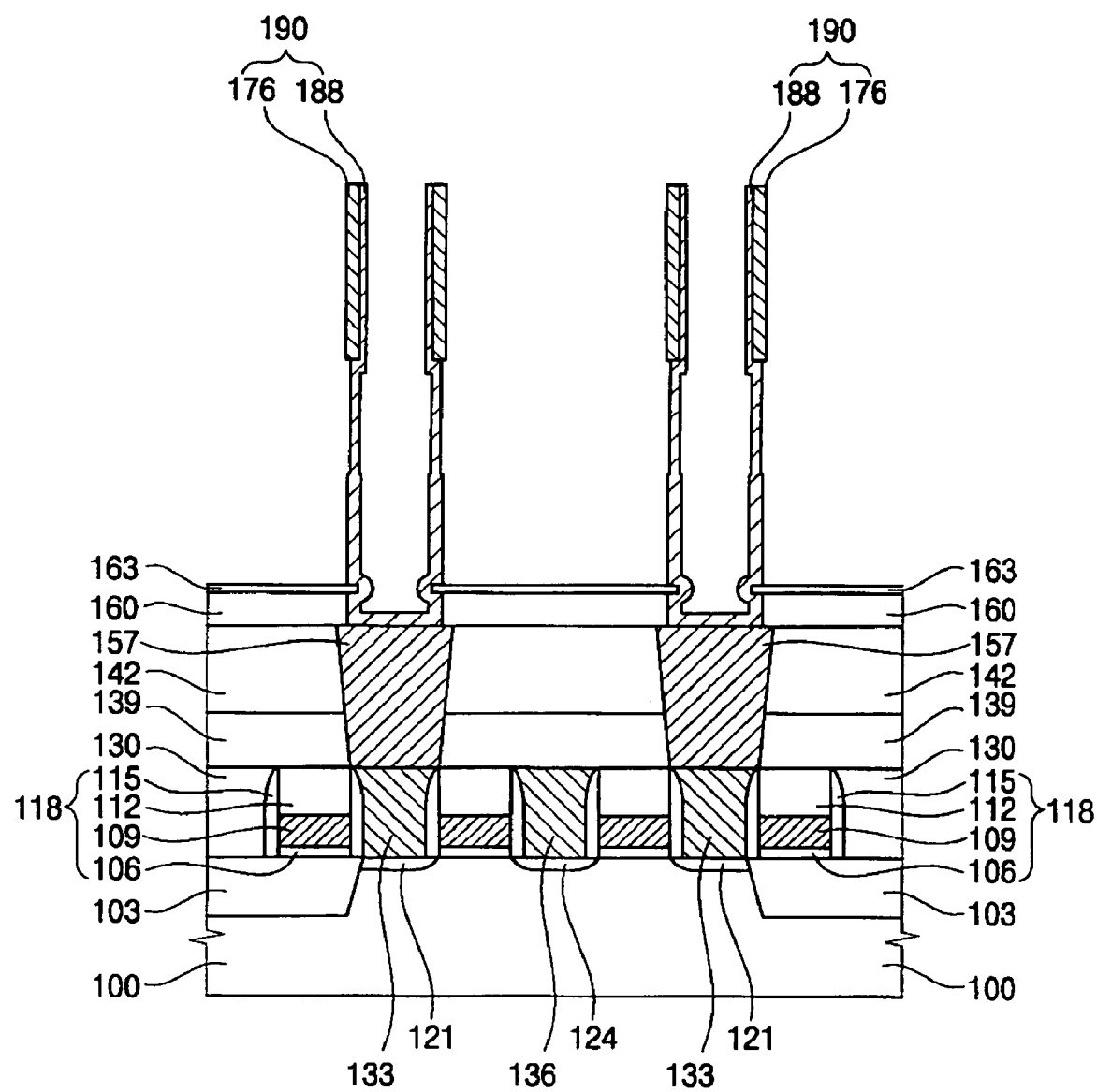
Figure 30:
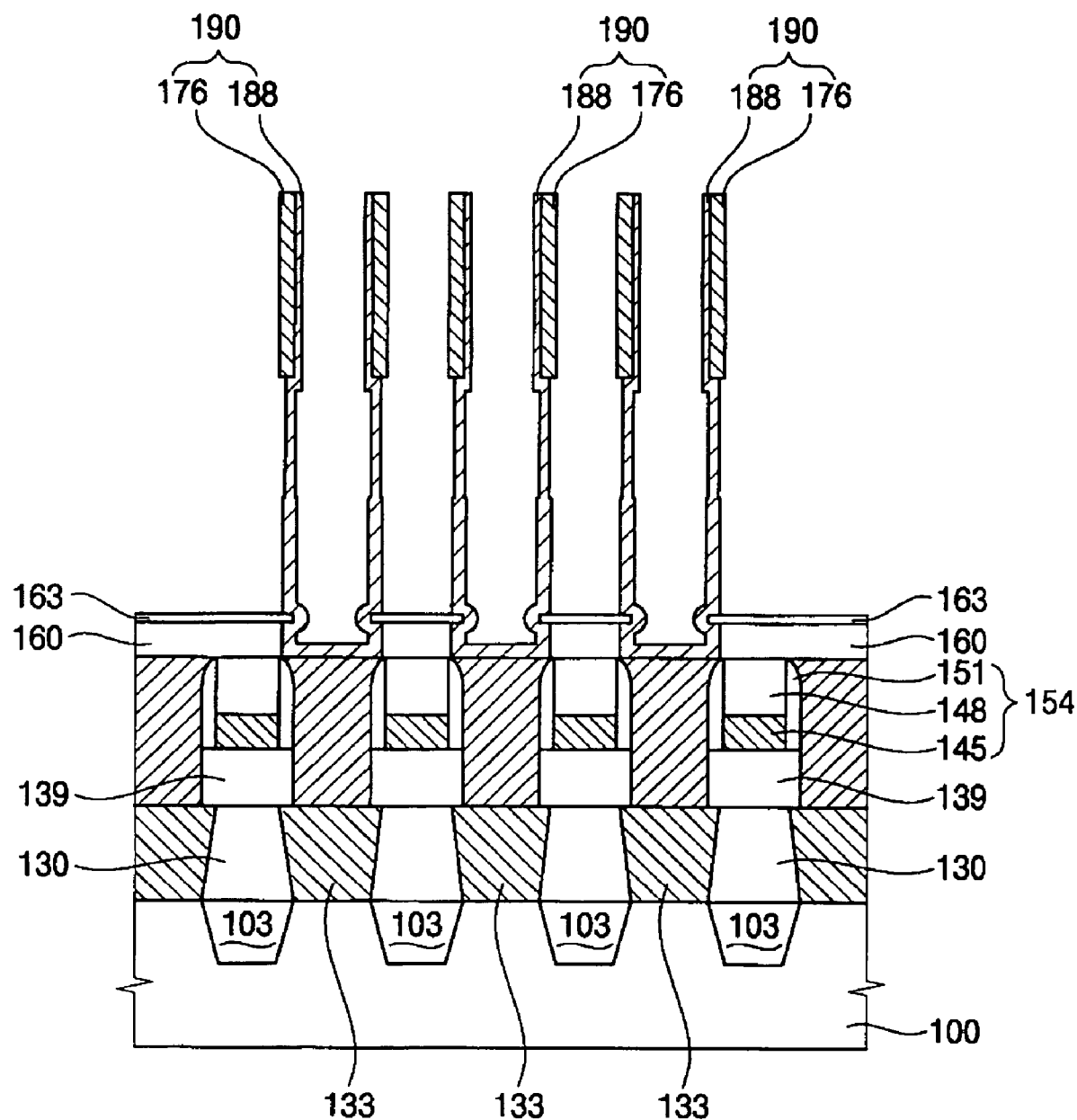

FIGS. 29 and 30 are cross-sectional diagrams illustrating an exemplary process for forming the storage electrodes 190.

Referring to FIGS. 29 and 30, the mold layer 166*b* and sacrificial layer patterns 185*c* are completely removed, thereby forming the storage conductive patterns 188 that are electrically connected to the first contact regions 121 through the forth pads 157 and the first contact pads 133. Preferably, the mold layer 166*b* and the sacrificial layer patterns 185*c* are removed by a dry etching process that sequentially uses the first drying gas and then the second drying gas. The lower portions of the complementary members 176 are partially supported by the storage conductive patterns 188, and the complementary members 176 are also attached to the upper portions of the storage conductive patterns 188. Thus, the complementary members 176 are stably affixed to the storage conductive patterns 188 and the complementary members 176 are prevented from being separated from the storage conductive patterns 188. As a result, the storage electrodes 190 that include the storage conductive patterns 188 and the complementary members 176 have improved structural stability. In addition, because the complementary members 176 compensate for the etch loss of upper portions of the storage conductive patterns 188, the upper portions of the storage conductive patterns 188 may not be reduced in thickness during the above-mentioned etching processes.

In these embodiments, because the above-described etching processes are carried out to form the storage electrode 190, central portions of the storage electrodes 190 have thicknesses that are substantially less than those of the upper or the lower portions of the storage electrodes 190. Because the upper portions of the storage electrode 190 have a sufficient thickness, the bowing or deformation of upper portions of the storage electrodes 190 may be prevented. Therefore, the structural stability of the storage electrodes 190 may be enhanced. After the upper portion of the storage electrode 190 that includes the complementary member 176 is etched three times, the upper portion of the storage electrode 190 has a first thickness. After the central portion of the storage electrode 190 is etched twice, the central portion of the storage electrode 190 has a second thickness. After the lower portion of the storage electrode 190 is etched once, the lower portion of the storage electrode 190 has a third thickness. The first thickness is greater than the second and third thicknesses whereas the second thickness is slightly greater or substantially identical to the third thickness. In other words, because the central portions of the storage electrodes 190 do not include the complementary members 176, the second thickness is less than the first thickness. In addition, because the lower portions of the storage electrodes 190 are etched only once, the third thickness is substantially identical to or slightly less than the second thickness.

Figure 31:
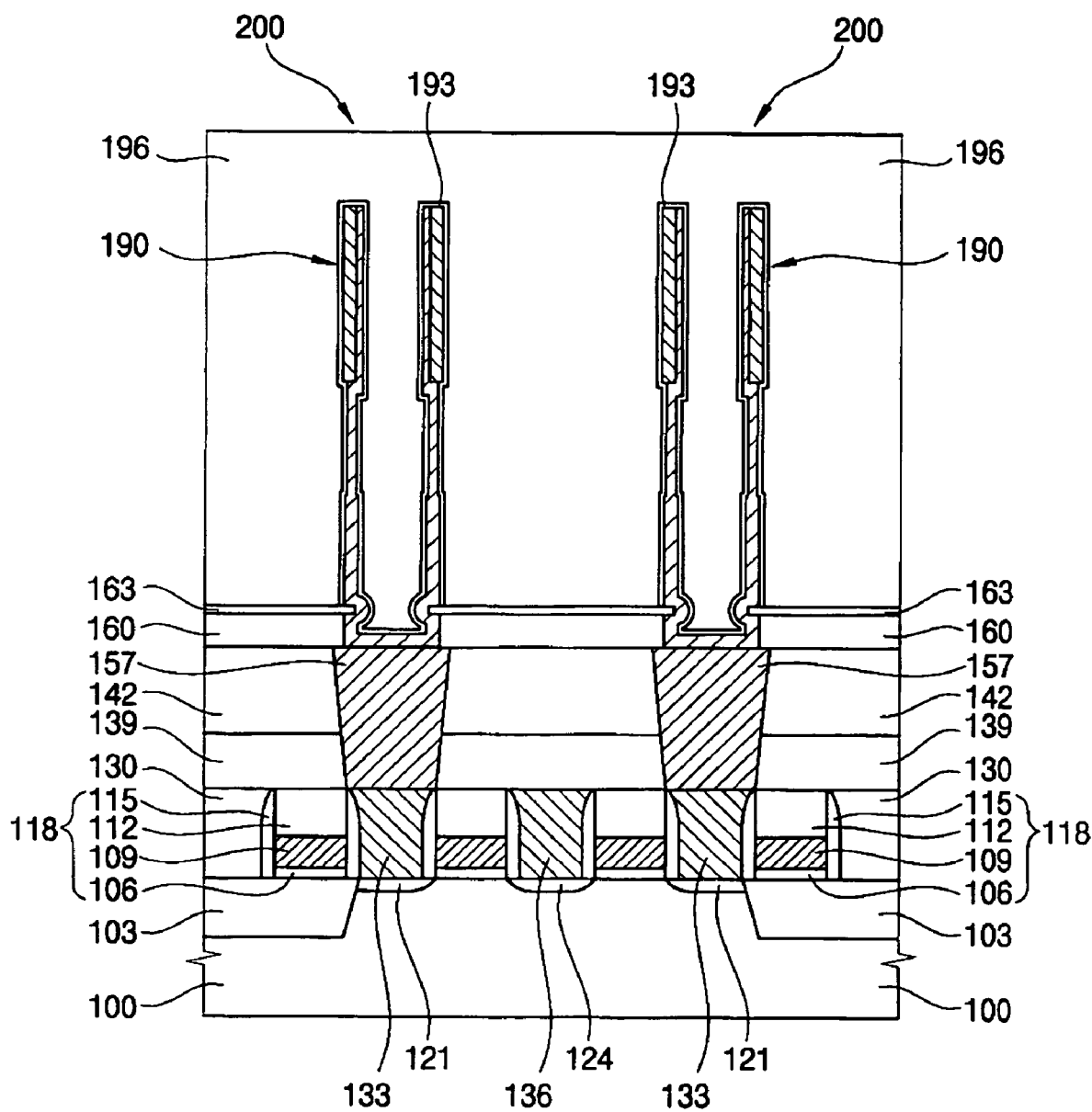
Figure 32:
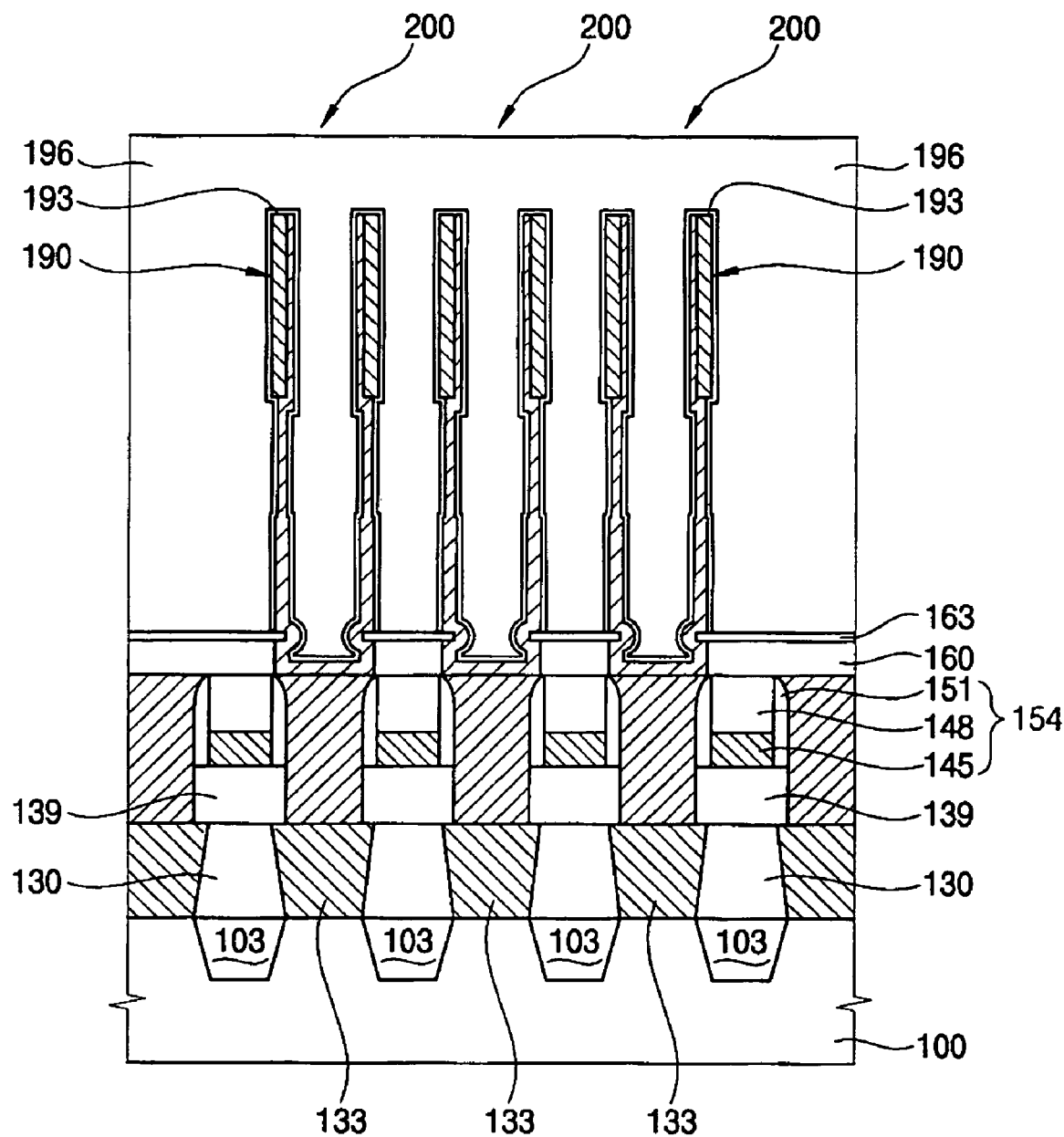

FIGS. 31 and 32 are cross-sectional diagrams illustrating an exemplary process for forming the capacitors 200.

Referring to FIGS. 31 and 32, a dielectric layer 193 and a plate electrode 196 are successively formed on the storage electrode 190 including the complementary member 176 and the storage conductive pattern 188 to thereby form the capacitors 200 on the substrate 100. Though it is not particularly shown in the drawings, a fifth insulation layer that electrically insulates the capacitors 200 from an upper wiring is formed on the capacitors 200 and the upper wiring is then formed thereon. As a result, a semiconductor device including the capacitor 200 is manufactured.

FIGS. 33 to 48 are cross-sectional diagrams illustrating a method of forming a semiconductor device in accordance with other embodiments of the invention. FIGS. 33, 35, 37, 39, 41, 43, 45 and 47 are cross-sectional diagrams illustrating the semiconductor device taken along a line parallel to the bit lines, and FIGS. 34, 36, 38, 40, 42, 44, 46 and 48 cross-sectional diagrams illustrating the semiconductor device taken along a line parallel to the word lines. In these embodiments, the processes up to the etching stop layer 163 are substantially identical to the processes described above with reference to FIGS. 9 to 14.

Figure 33:
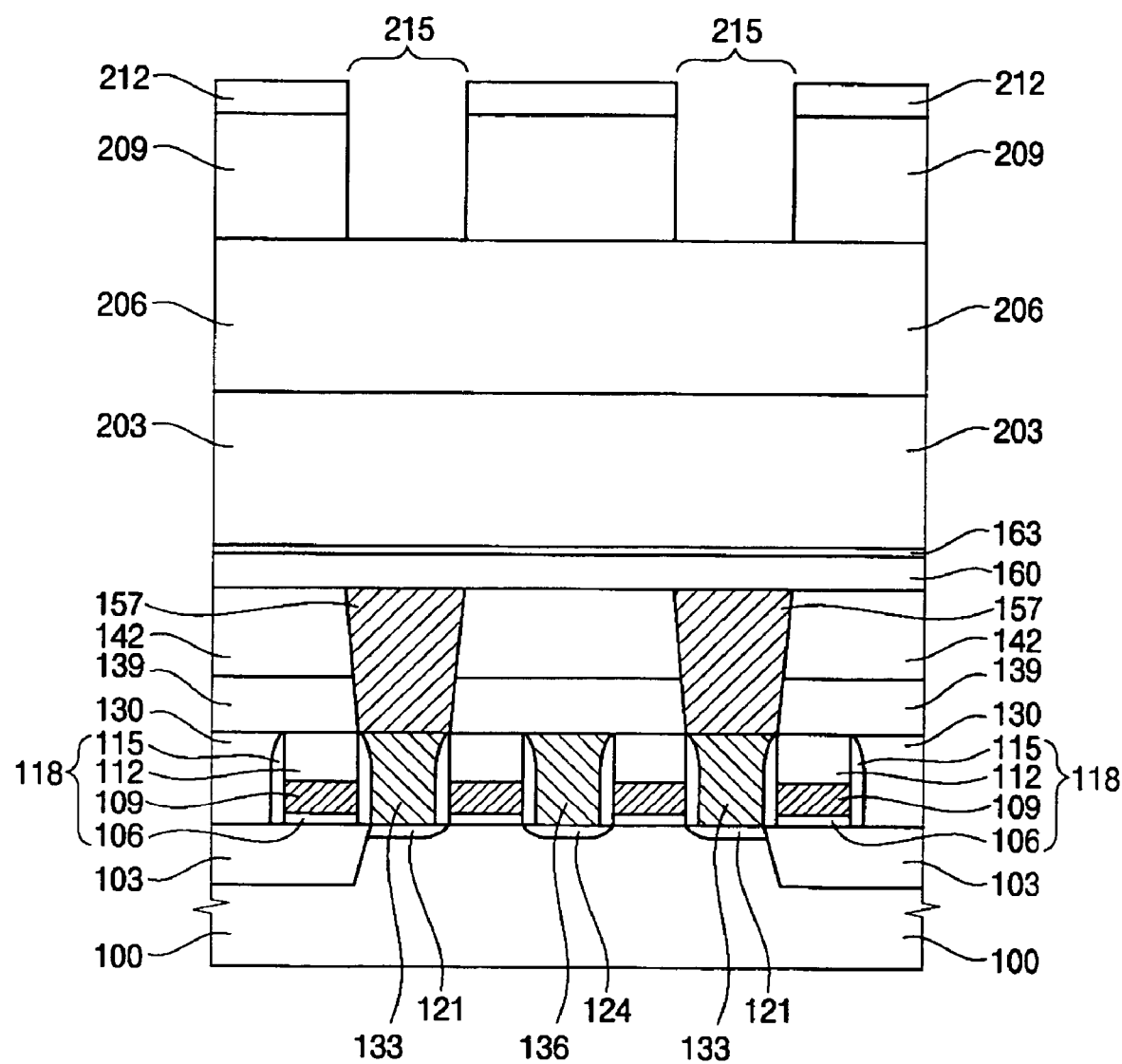
FIGS. 33 to 48 are cross-sectional diagrams illustrating a method of forming a semiconductor device in accordance with other embodiments of the invention.
Figure 34:
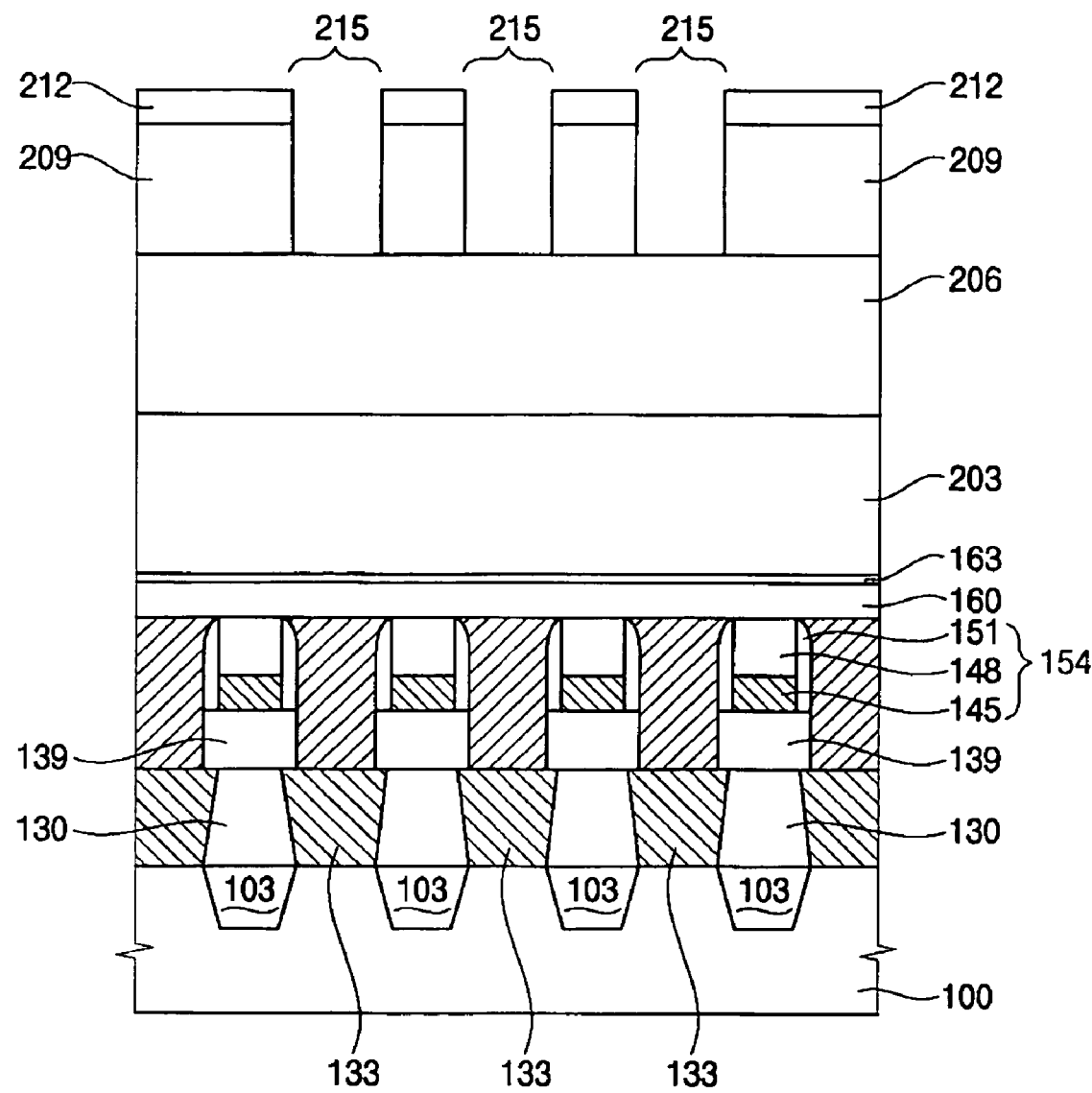

FIGS. 33 and 34 are cross-sectional diagrams illustrating processes for forming a first mold layer 209, a second mold layer 206, a third mold layer 203, a storage node mask 212, and openings 215.

Referring to FIGS. 33 and 34, the first mold layer 209 is formed on the semiconductor substrate 100 that includes the fourth insulating interlayer 160 and the etching stop layer 163. The first mold layer 203 may be formed using oxide doped with impurities at a first concentration. For example, the first mold layer 203 may be formed using boro-phosphor silicate glass (BPSG) or phosphor silicate glass (PSG) in which impurities such as boron (B) or phosphorus (P), etc. are doped in an oxide.

The second mold layer 206 is formed on the first mold layer 203 using an oxide doped with impurities at a second concentration. Here, the second concentration is greater than the first concentration. Thus, the first mold layer 203 may be etched more rapidly than the second mold layer 206 by an etching process that uses an etching solution that includes hydrogen fluoride (HF) or an etching solution that includes ammonium hydroxide ($NH_4OH$), hydrogen peroxide ($H_2O_2$) and deionized water.

The third mold layer 209 is formed on the second mold layer 206 using undoped oxide. For example, the third mold layer 209 may be formed using USG, TEOS, or HDP-CVD oxide. Alternatively, the third mold layer 209 may be formed using BPSG or PSG doped with impurities such as boron (B), phosphorus (P), etc., at a third concentration. Here, the third concentration is greater than the second concentration. Hence, the second mold layer 206 may be etched more rapidly than the third mold layer 209 by the etching process using the etching solution that includes hydrogen fluoride (HF) or the etching solution that includes ammonium hydroxide ($NH_4OH$), hydrogen peroxide ($H_2O_2$), and deionized water. Therefore, a mold layer structure including the first, second, and third mold layers 203, 206, and 209 is formed on the semiconductor substrate 100 that includes the fourth insulating interlayer 160 and the etching stop layer 163.

In these embodiments the first, second, and third mold layers 203, 206, and 209 have the first, second, and third concentrations of impurities, respectively. Because the first concentration is greater than the second concentration and the second concentration is greater than the third concentration, the first mold layer 203 is etched more rapidly than the second mold layer 206 and the second mold later 206 is etched more rapidly than the third mold layer 209 during the etching process using the etching solution that includes hydrogen fluoride (HF) or ammonium hydroxide ($NH_4OH$), hydrogen peroxide ($H_2O_2$) and deionized water. Therefore, each of the fourth contact holes 221 (see FIGS. 37 and 38) has a structure that includes a number of cylindrical segments, the cylindrical segments decreasing in diameter as a height of the contact hole increases.

A storage node mask 212 is formed on the third mold layer 209 using a material having etching selectivity with respect to oxide. For example, the storage node mask 212 may be formed using polysilicon or doped polysilicon. After the third mask layer is formed on the third mold layer 209, the third mask layer may be patterned by a photolithography process to form the storage node mask 212 on the third mold layer 209.

The third mold layer 209 is partially etched using the storage node mask 212 as an etching mask to form openings 215 that partially expose the second mold layer 206. Here, the openings 215 formed through the third mold layer 209 are disposed vertically over the fourth pads 157 and the first pads 133.

Figure 35:
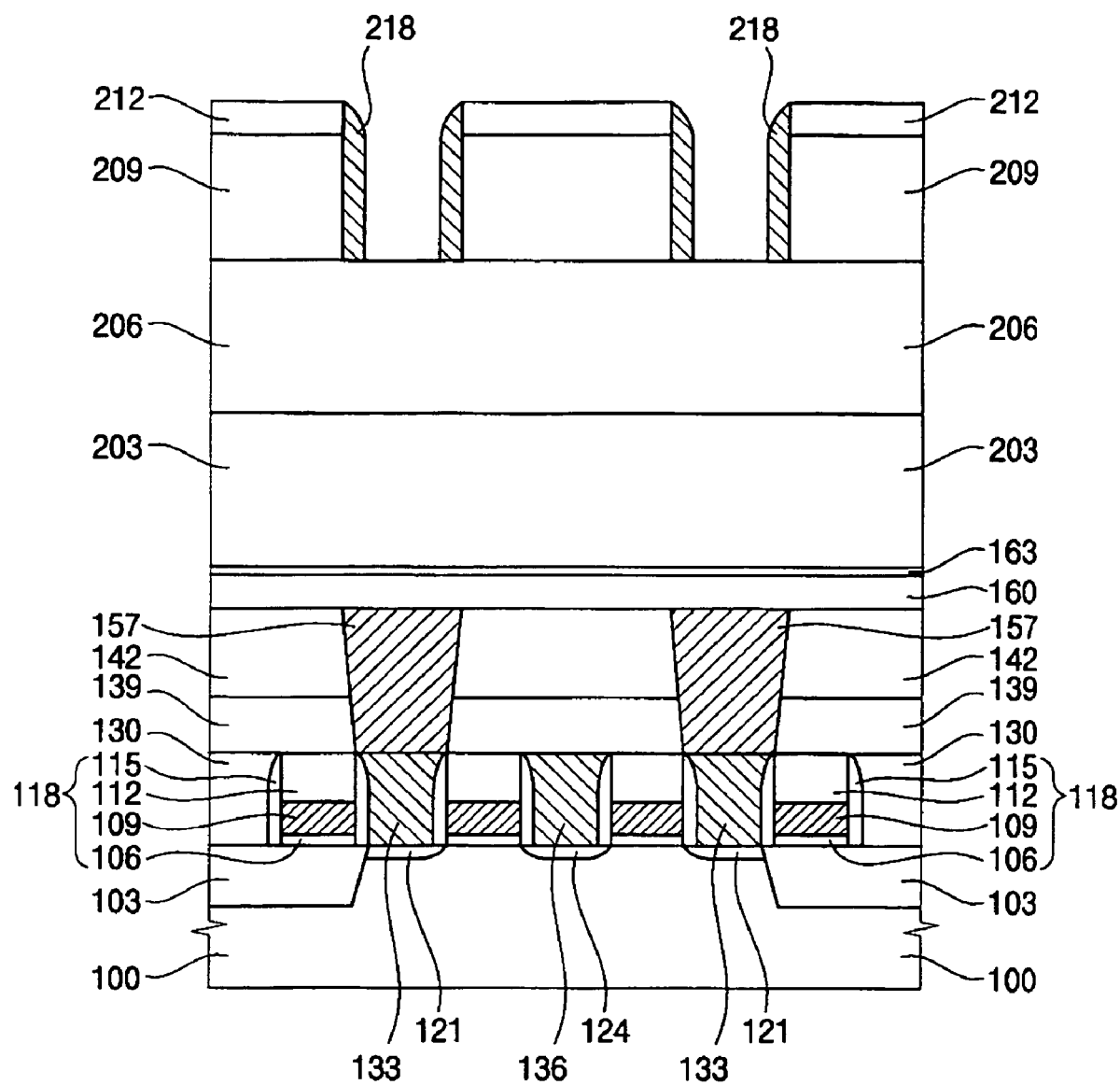
Figure 36:
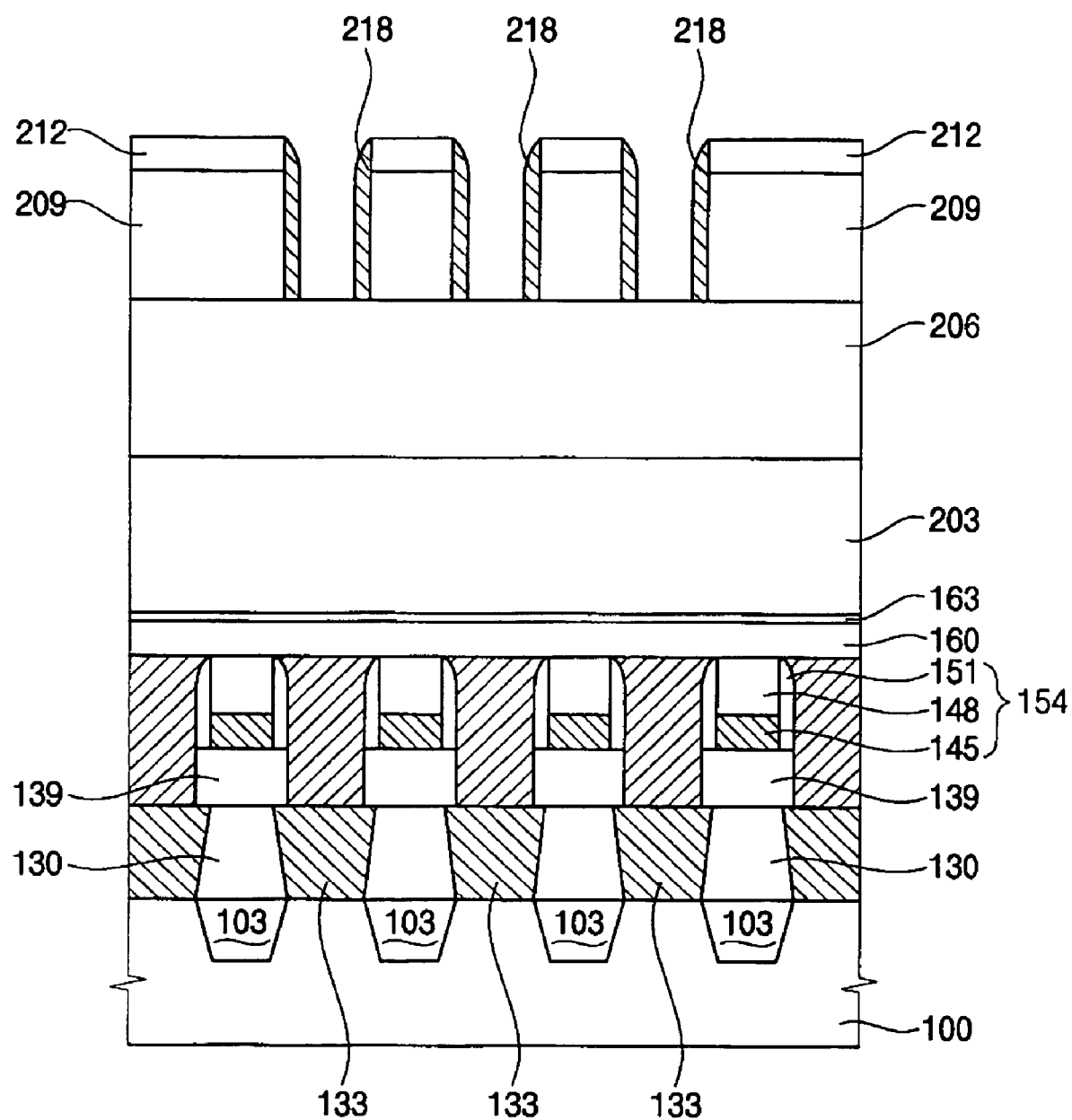

FIGS. 35 and 36 are cross-sectional diagrams illustrating exemplary processes for forming the third spacers 218.

Referring to FIGS. 35 and 36, a fifth conductive layer is formed on sidewalls of the openings 215, the partially exposed second mold layer 206, and the storage node mask 212. The fifth conductive layer may be formed using polysilicon, doped polysilicon, metal, etc.

The fifth conductive layer is anisotropically etched by a photolithography process to form the third spacers 218 on sidewalls of the openings 215. The third spacers 218 serve to form self-aligned fourth contact holes 221. The third spacers 218 will serve as complementary members 219 that improve the structural and electrical characteristics of the storage electrodes 227.

Figure 37:
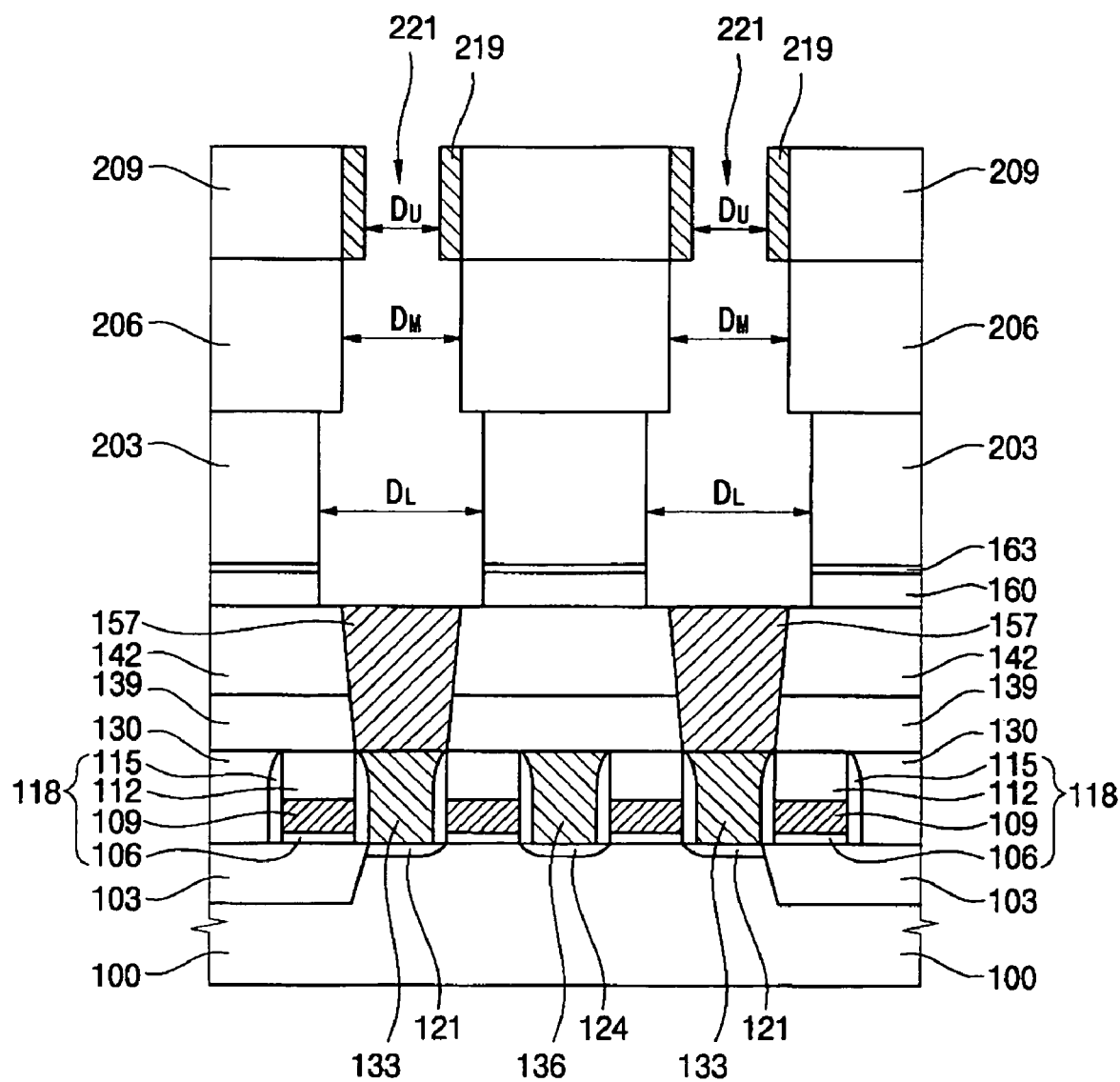
Figure 38:
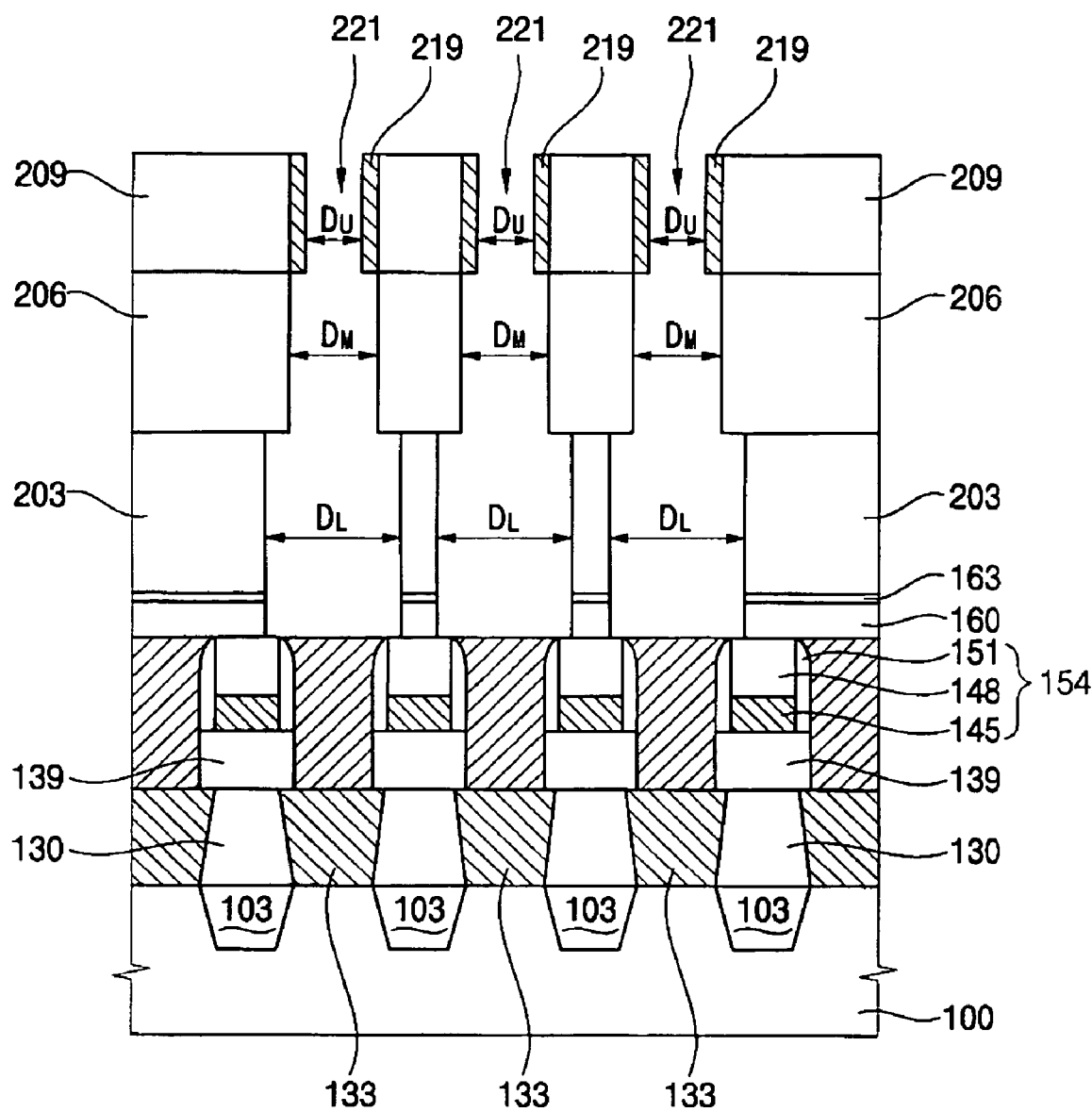

FIGS. 37 and 38 are cross-sectional diagrams illustrating exemplary processes for forming the fourth contact holes 221 and the complementary members 219.

Referring to FIGS. 37 and 38, the third mold layer 209, the second mold layer 206, the first mold layer 203, the etching stop layer 163, and the fourth insulating interlayer 160 are partially etched using the storage node mask 212 as an etching mask, thereby forming the fourth contact holes 221 that expose the fourth pads 157. Because the first mold layer 203 is etched more rapidly than the second mold layer 206 and the second mold later 206 is etched more rapidly than the third mold layer 209, each of the fourth contact holes 221 having a structure that includes a number of cylindrical segments, the cylindrical segments having a decreasing diameter as a height of the fourth contact holes increase. That is, a diameter $D_M$ of a central portion of the fourth contact hole 221 is greater than a diameter $D_U$ of an upper portion of the fourth contact hole 221, and also a diameter $D_L$ of a lower portion of the fourth contact hole 221 is greater than the diameter $D_M$ of the central portion of the fourth contact hole 221. Because the storage electrodes 227 are formed in the fourth contact holes 221 having the above-described structure, each of the storage electrodes 227 also has a cylindrical structure that has a stepped inside face and a diameter that decreases as a height of the storage electrode 227 increases.

After the fourth contact holes 221 are formed, the storage node mask 212 and upper portions of the third spacers 218 are etched. When the storage node mask 212 is removed, the complementary members 219 are simultaneously formed on insides of the upper portions of the fourth contact holes 221.

Figure 39:
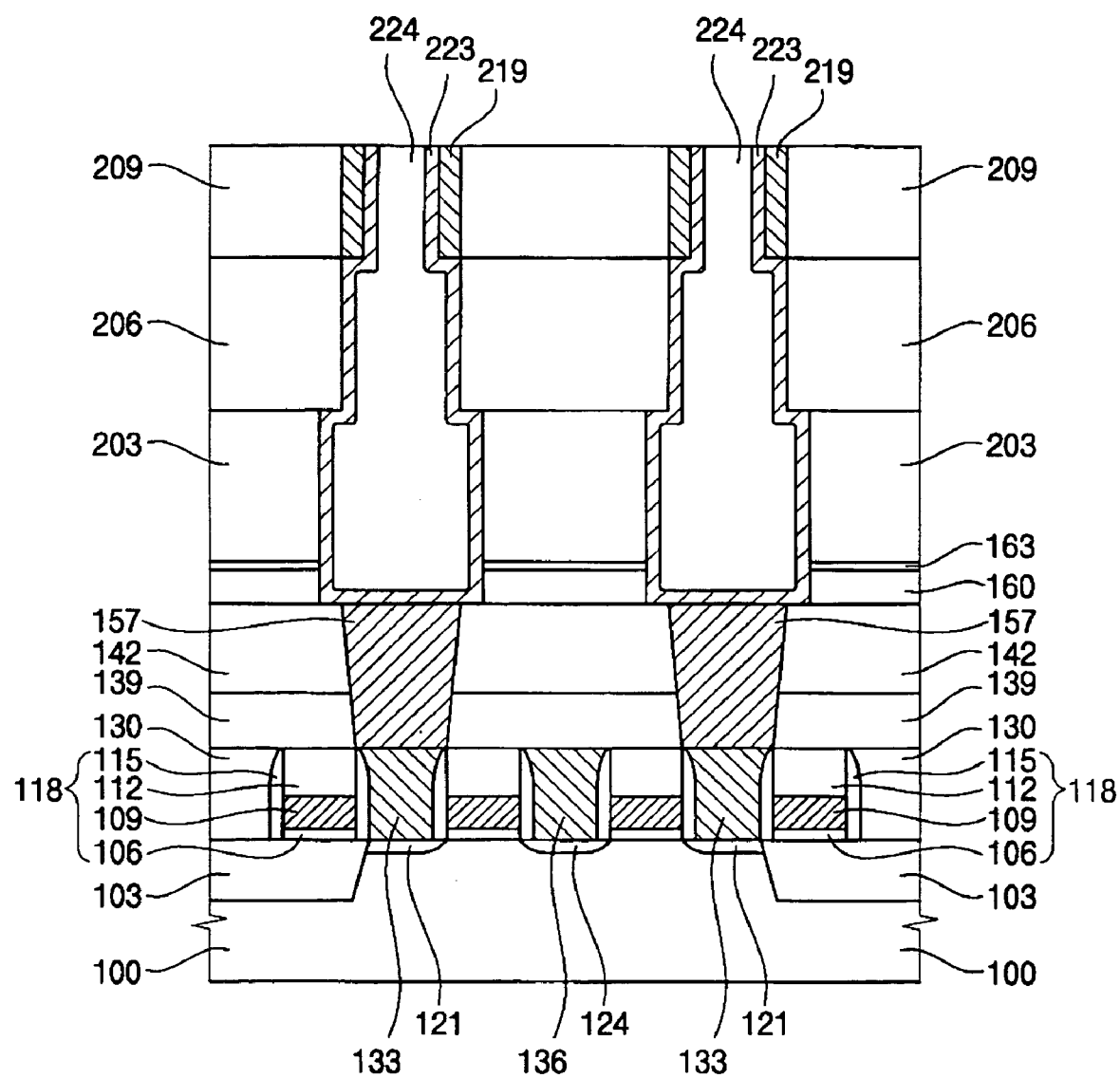
Figure 40:
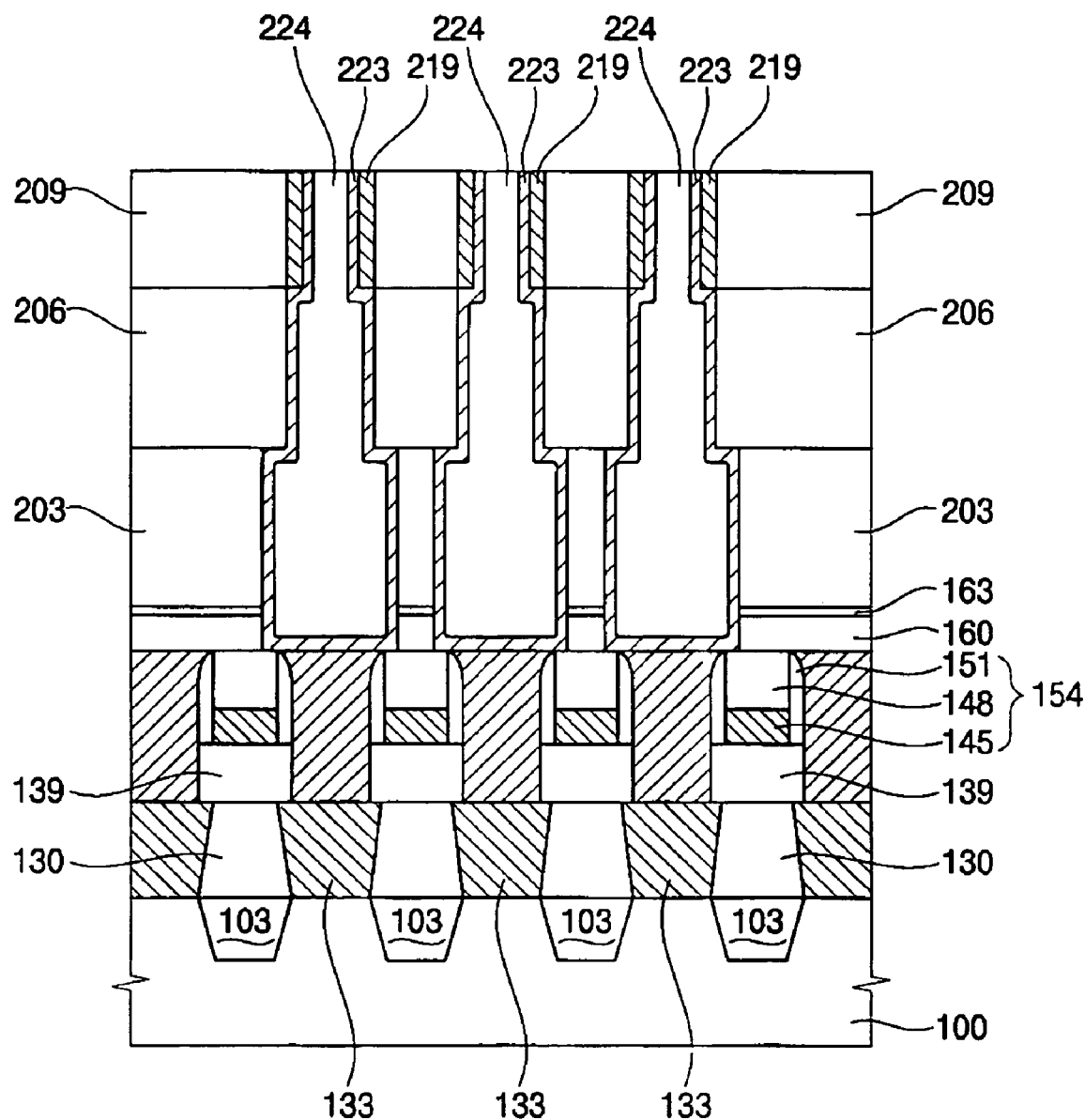

FIGS. 39 and 40 are cross-sectional diagrams illustrating exemplary processes for forming storage conductive patterns 223 and a sacrificial layer 224.

Referring to FIGS. 39 and 40, the storage conductive patterns 223 are formed on the insides of the fourth contact holes 221 having the stepped cylindrical structure. The storage conductive patterns 223 are formed on the third mold layer 209 and the third spacers 218. The storage conductive patterns 223 are formed on insides of the central and lower portions of the fourth contact holes 221 and also formed on the complementary members 129. Because the insides of the complementary member 219 are attached to the storage conductive patterns 223 and lower faces of the complementary members 219 are partially supported by the storage conductive patterns 223, the structural stability of the complementary members 219 may be greatly improved.

A sacrificial layer is formed using oxide on the storage conductive patterns 223 to fill the fourth contact holes 221. The sacrificial layer 224 may be formed using materials such as BPSG, PSG, USG, SOG, TEOS, HDP-CVD oxide, etc. These materials may be used alone or in a mixture composed of two or more of the materials. In some embodiments of the invention, an upper portion, a central portion, and a lower portion of the sacrificial layer 224 may be formed using BPSG or PSG doped with impurities at a first, a second, and a third concentration, respectively, where the first, second, and third concentrations are different from one another. Namely, the lower portion of the sacrificial layer 224 may be formed using BPSG or PSG doped with impurities at the first concentration that is substantially identical to the first concentration of the first mold layer 203. The central portion of the sacrificial layer 224 may be formed using BPSG or PSG doped with impurities at the second concentration that is substantially identical to the second concentration of the second mold layer 206. The upper portion of the sacrificial layer 224 may be formed using undoped oxide. Alternatively, the upper portion of the sacrificial layer 224 may be formed using BPSG or PSG doped with impurities at the third concentration that is substantially identical to the third concentration of the third mold layer 209.

Figure 41:
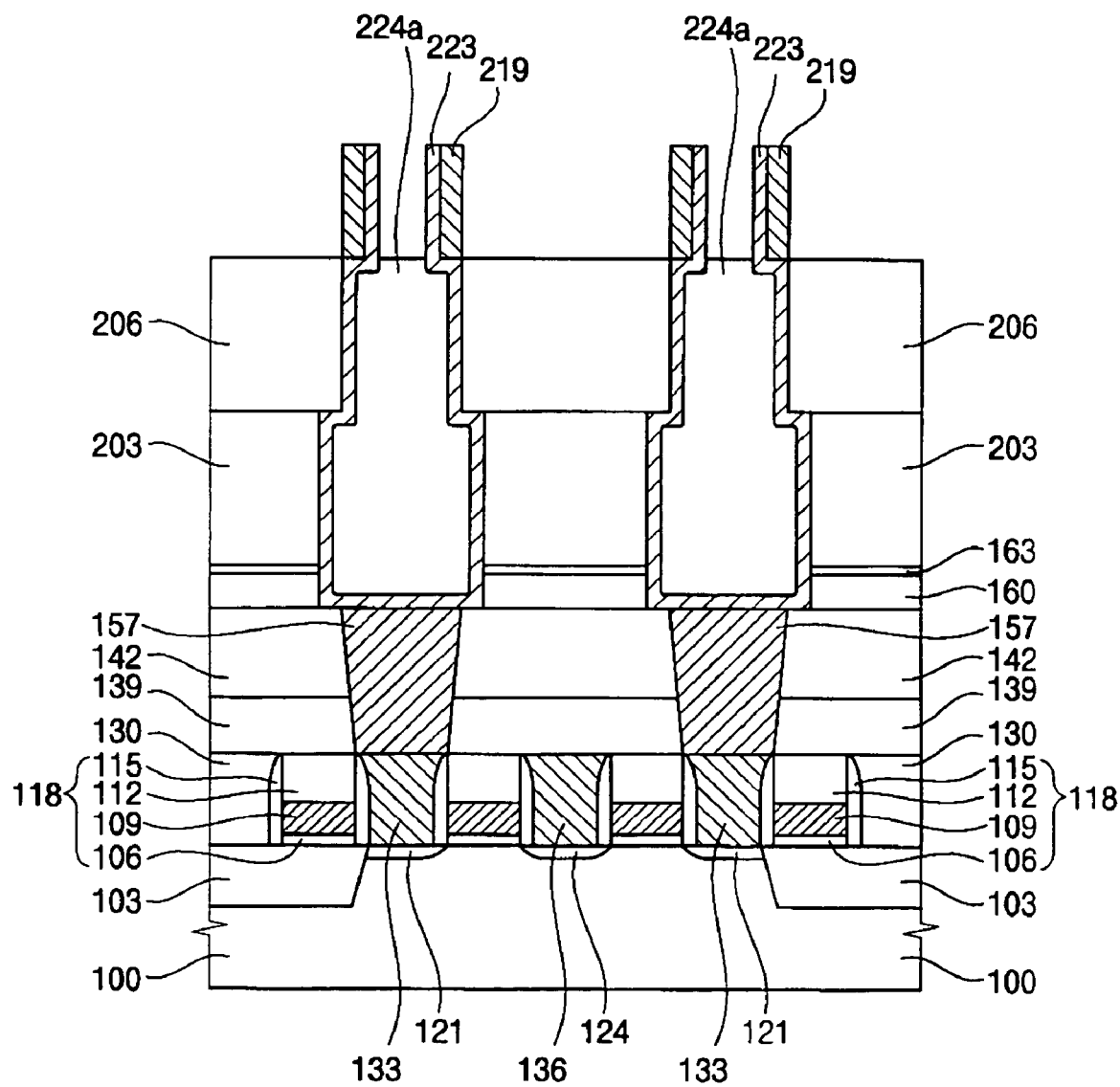
Figure 42:
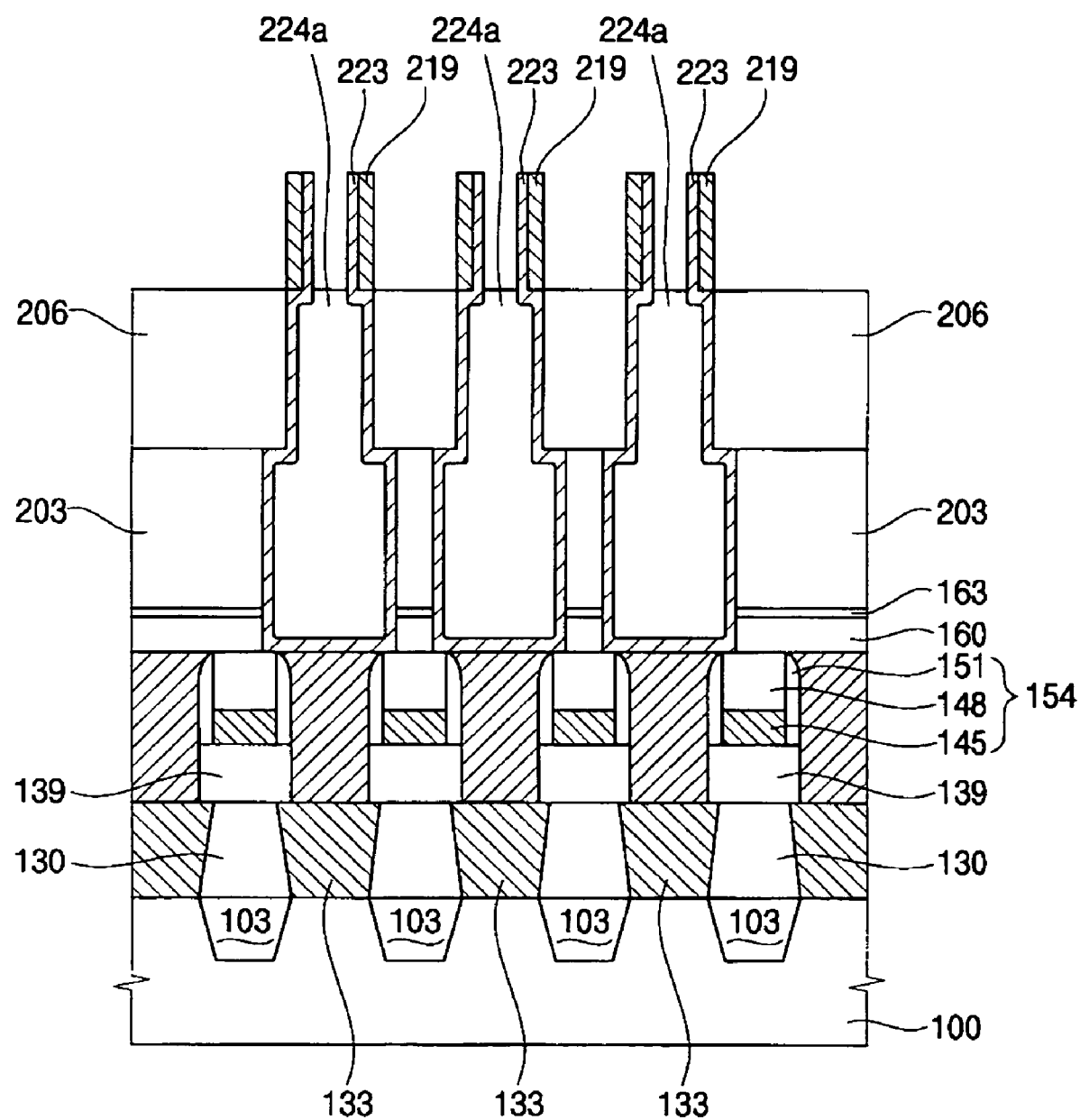

FIGS. 41 and 42 are cross-sectional diagrams illustrating exemplary processes for removing the third mold layer 209.

Referring to FIGS. 41 and 42, the third mold layer is partially removed by the dry etching process that uses the first etching gas including hydrogen fluoride (HF) and water vapor (H2O). The third mold layer 209 is then completely removed using the second etching gas including carbon tetrafluoride (CF4) and oxygen (O2). The complementary members 219 and the storage conductive patterns 223 may be slightly etched. As described above, the complementary members 176 compensate etched portions of the storage conductive patterns 233. The upper portion of the sacrificial layer 224 is removed to form first sacrificial layer patterns 224a in the storage conductive patterns 223 having the cylindrical shapes.

Figure 43:
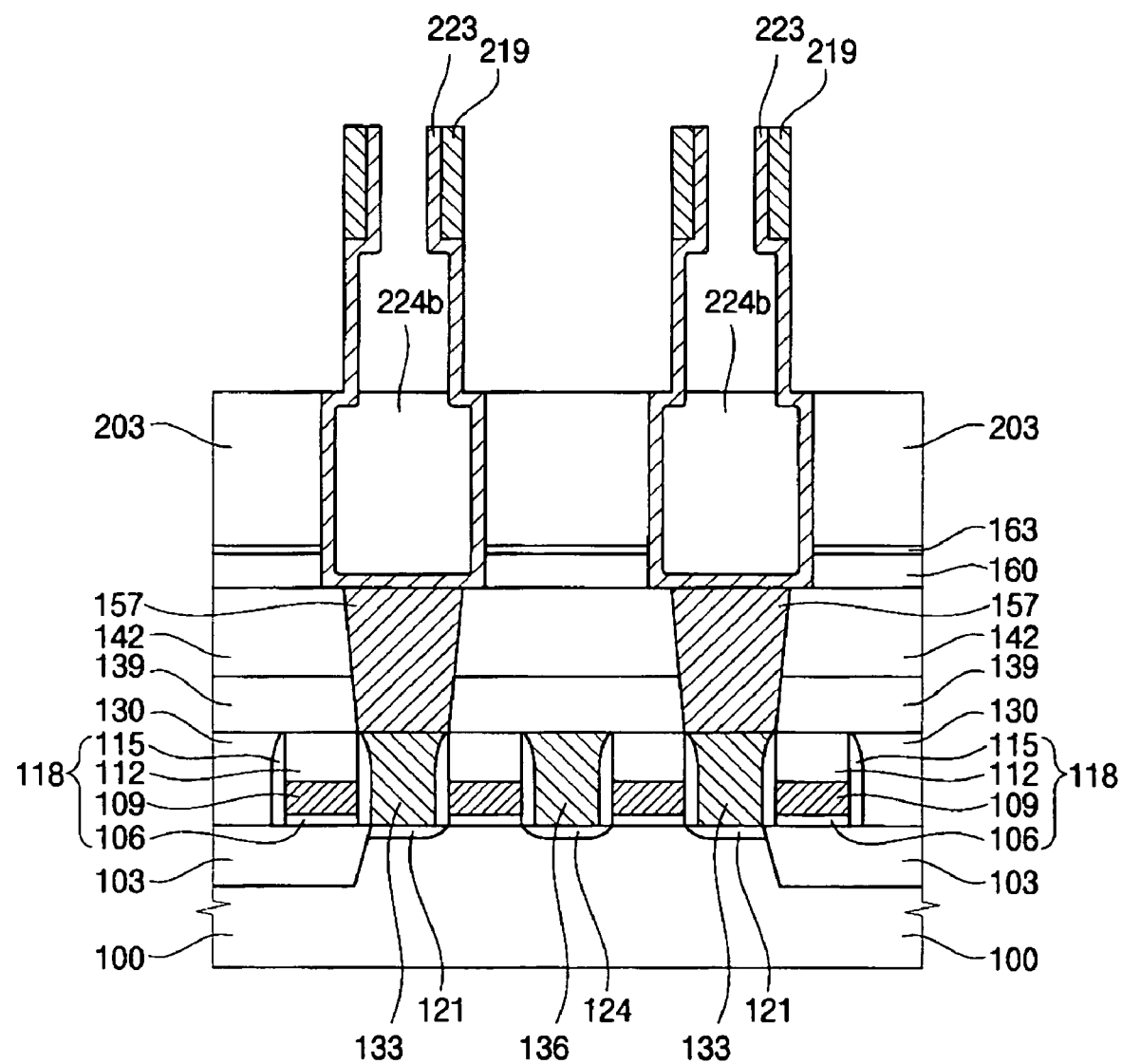
Figure 44:
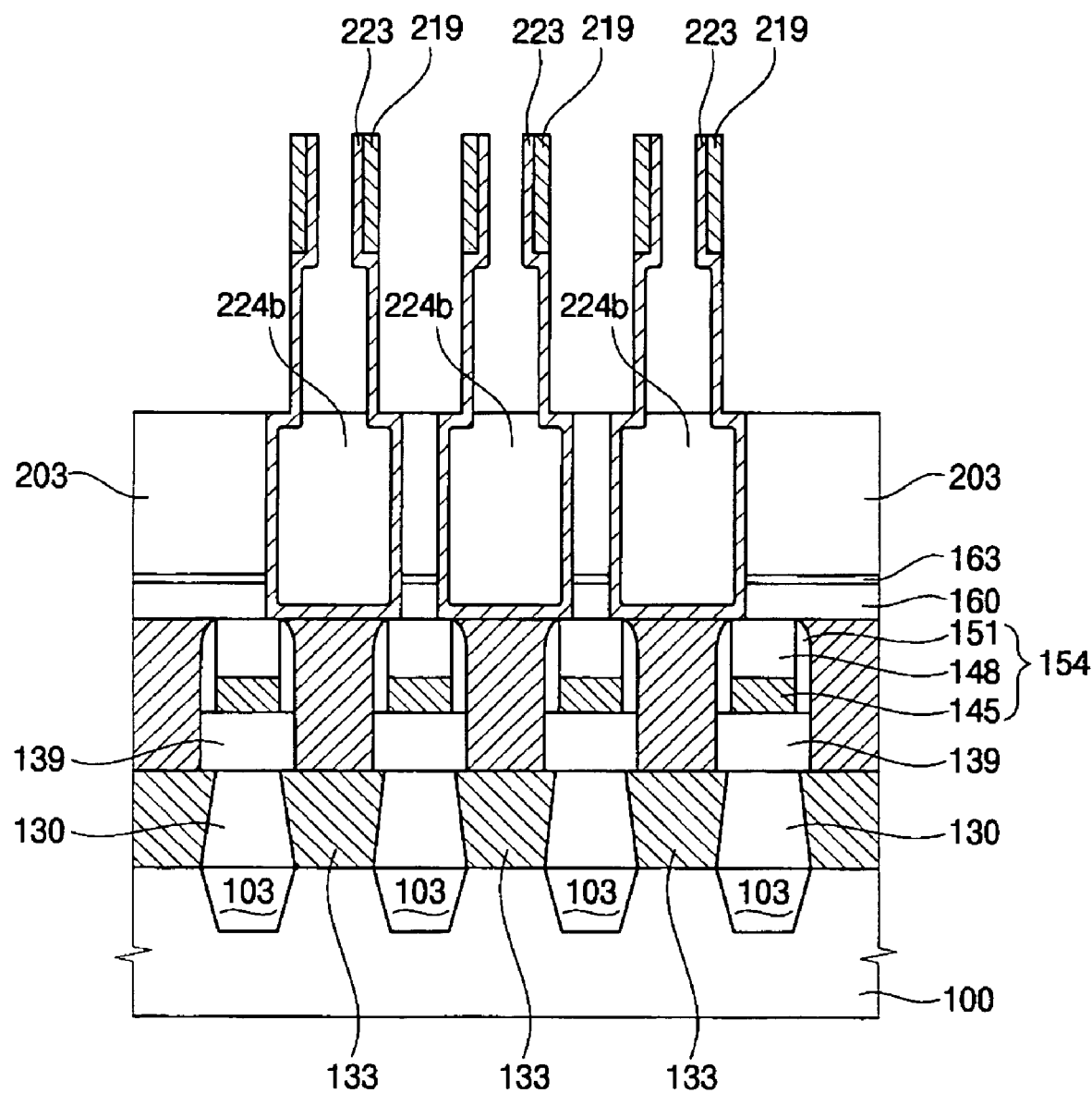

FIGS. 43 and 44 are cross-sectional diagrams illustrating exemplary processes for removing the second mold layer 206.

Referring to FIGS. 43 and 44, the second mold layer 206 is removed by a dry etching process that sequentially uses the first and second etching gases. Here, the first sacrificial layer patterns 224a disposed in the storage conductive patterns 223 are partially etched to form second sacrificial layer patterns 224b in lower portions of the storage conductive patterns 223.

Figure 45:
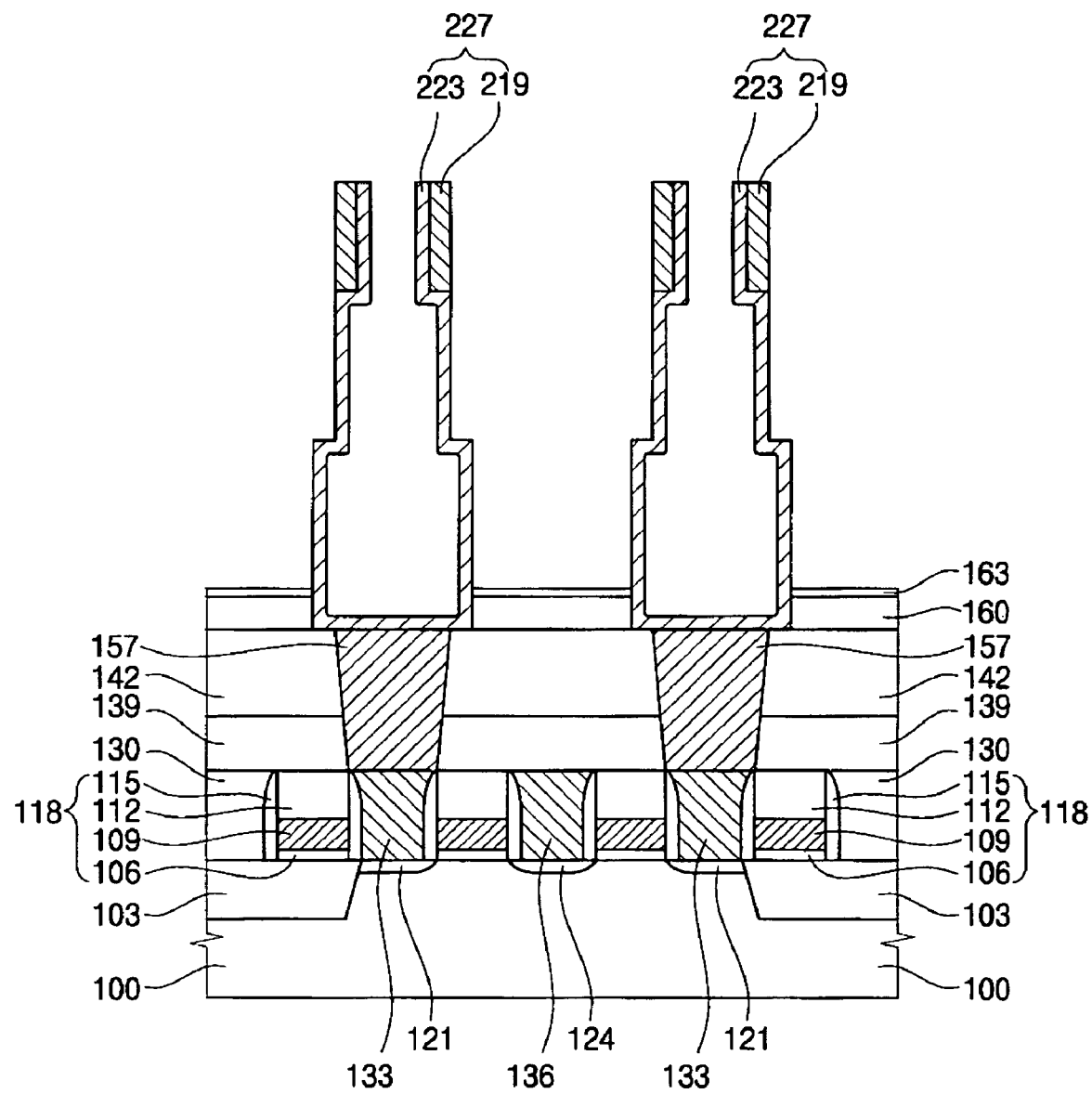
Figure 46:
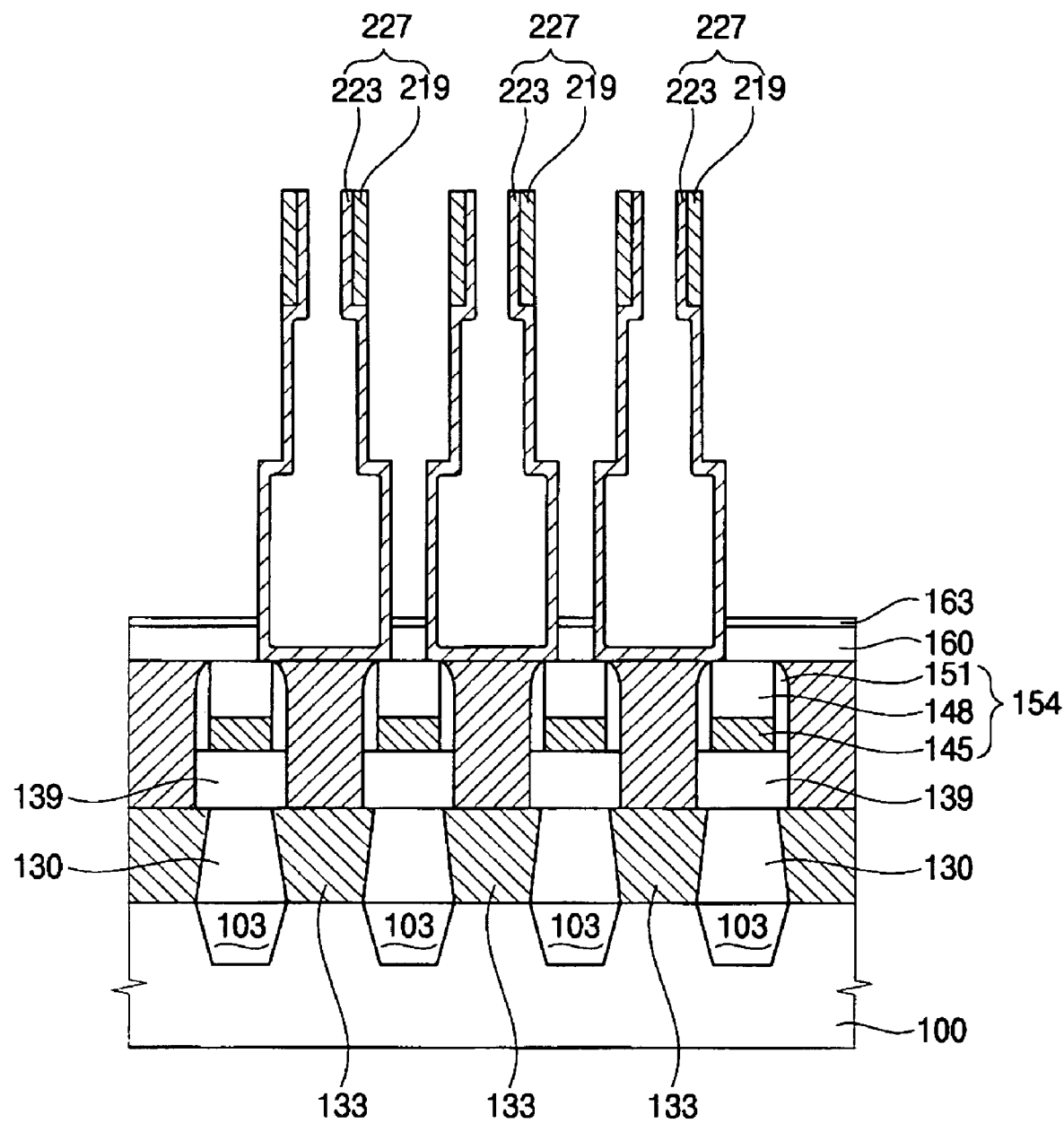

FIGS. 45 and 46 are cross-sectional diagrams illustrating exemplary processes for forming the storage electrodes 227.

Referring to FIGS. 45 and 46, the first mold layer 203 and the second sacrificial layer patterns 224b are removed by a dry etching process that sequentially uses the first and second etching gases. Thus, storage electrodes 227 having storage conductive patterns 223 with a stepped cylindrical structure are formed. Here, the complementary members 219 enclose the upper portions of the storage conductive patterns 223.

According to these embodiments, the storage electrodes 227 having the stepped cylindrical structure are formed by etching the first, second and third mold layers 203, 206, and 209 with etch rates that are different from one another. Therefore, the structural stability of the storage electrode 227 may be improved. Additionally, because the complementary member 176 complements the etch loss of the storage conductive pattern 188 during several etching processes, the electrical characteristics of the storage electrode 227 may be improved. As a result, the capacitor 240 has an improved structural stability so that the adjacent capacitors 240 that have high aspect ratios may not lean against each other. In addition, because the upper portions of the storage electrodes 227 may be maintained at the same thickness during the etching processes, the electrical characteristics of the capacitors 240 may be improved.

Figure 47:
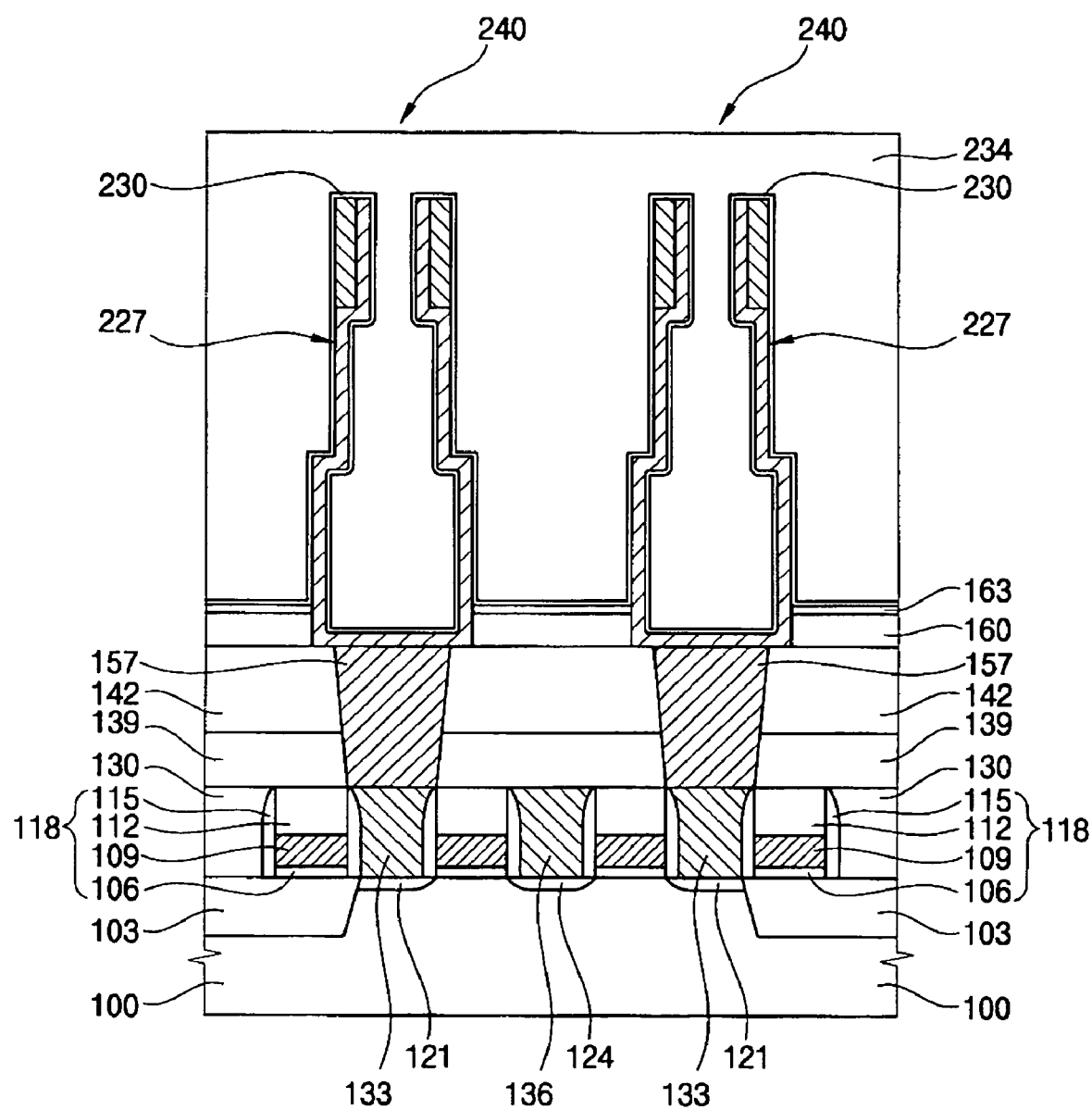
Figure 48:
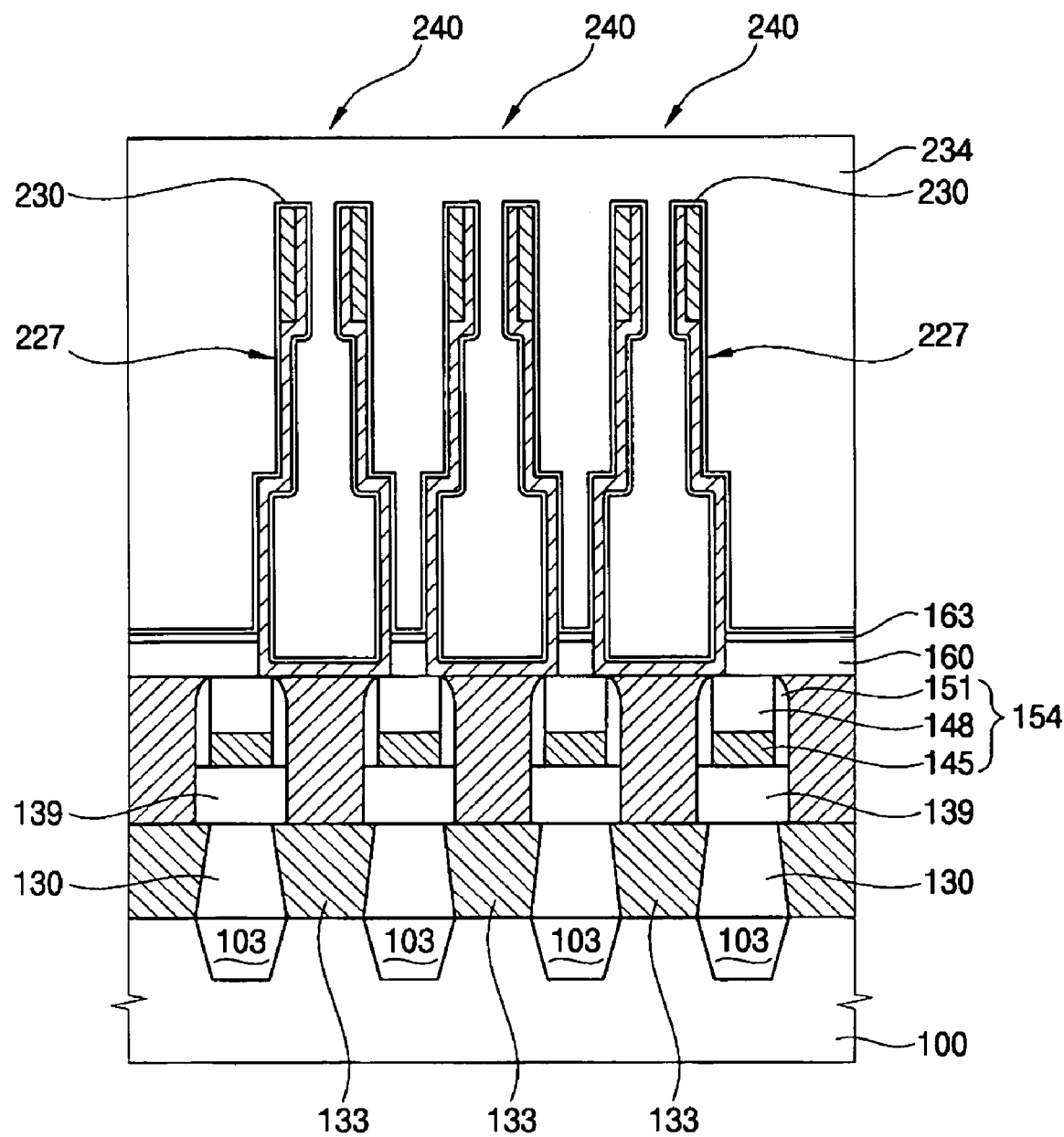

FIGS. 47 and 48 are cross-sectional diagrams illustrating exemplary processes for forming the capacitors 240.

Referring to FIGS. 47 and 48, a dielectric layer 230 and a plate electrode 234 are successively formed on the storage electrodes 227 that include the complementary members 219 and the storage conductive patterns 223, thereby forming the capacitors 240 on the semiconductor substrate 100. A fifth insulation layer that electrically insulates the capacitors 240 from an upper wiring is formed on the capacitors 240. The upper wiring is then formed on the fifth insulation layer. Therefore, the semiconductor device including the capacitors 240 is manufactured.

FIGS. 49 to 58 are cross-sectional diagrams illustrating a method of forming a semiconductor device in accordance with still other embodiments of the invention. FIGS. 49, 51, 53, 55 and 57 are cross-sectional diagrams illustrating the semiconductor device along a line that is parallel to the bit lines, and FIGS. 50, 52, 54, 56 and 58 are cross-sectional diagrams illustrating the semiconductor device along a line that is parallel to the word lines.

Figure 49:
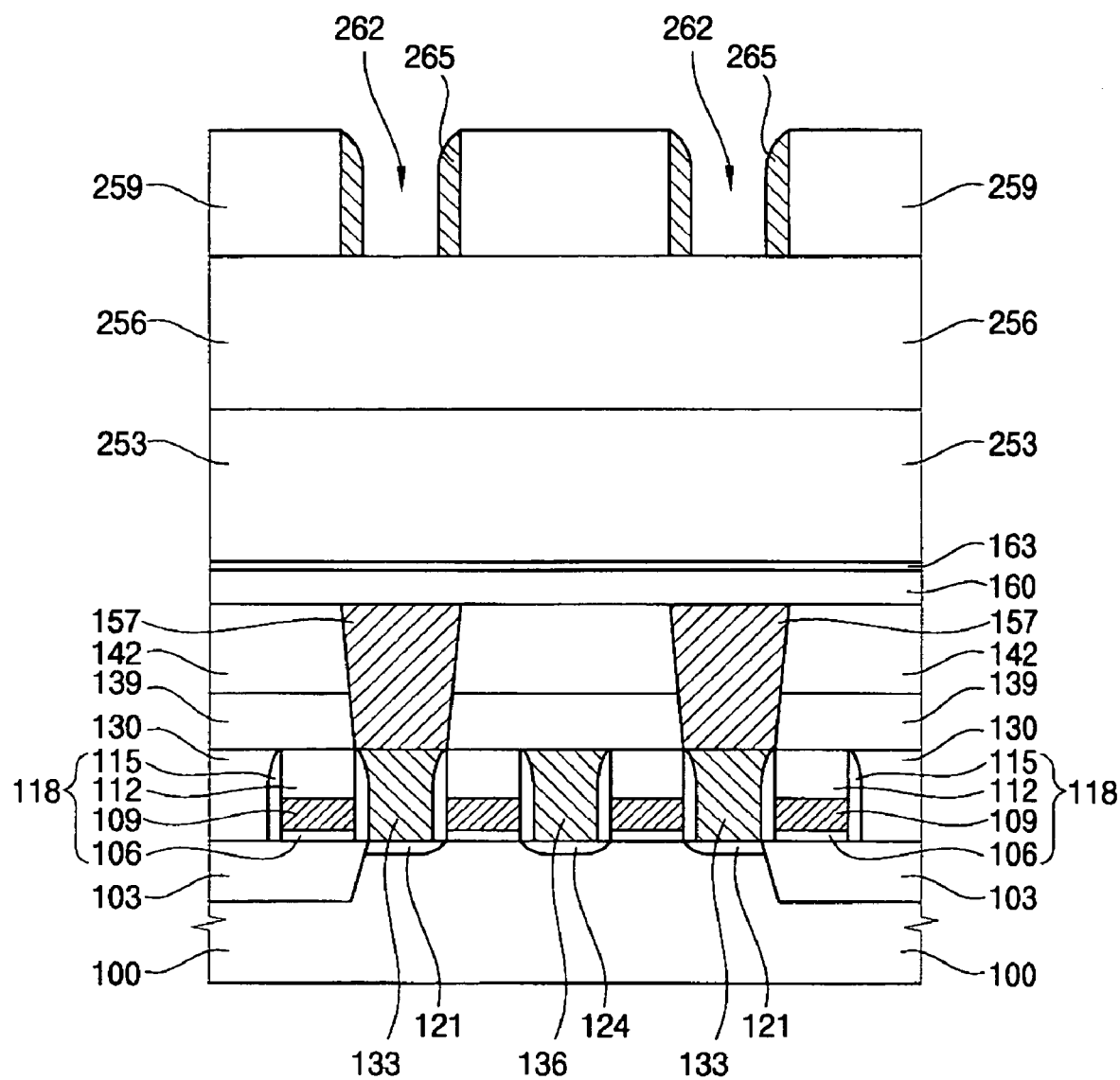
FIGS. 49 to 58 are cross-sectional diagrams illustrating a method of forming a semiconductor device in accordance with still other embodiments of the invention.
Figure 50:
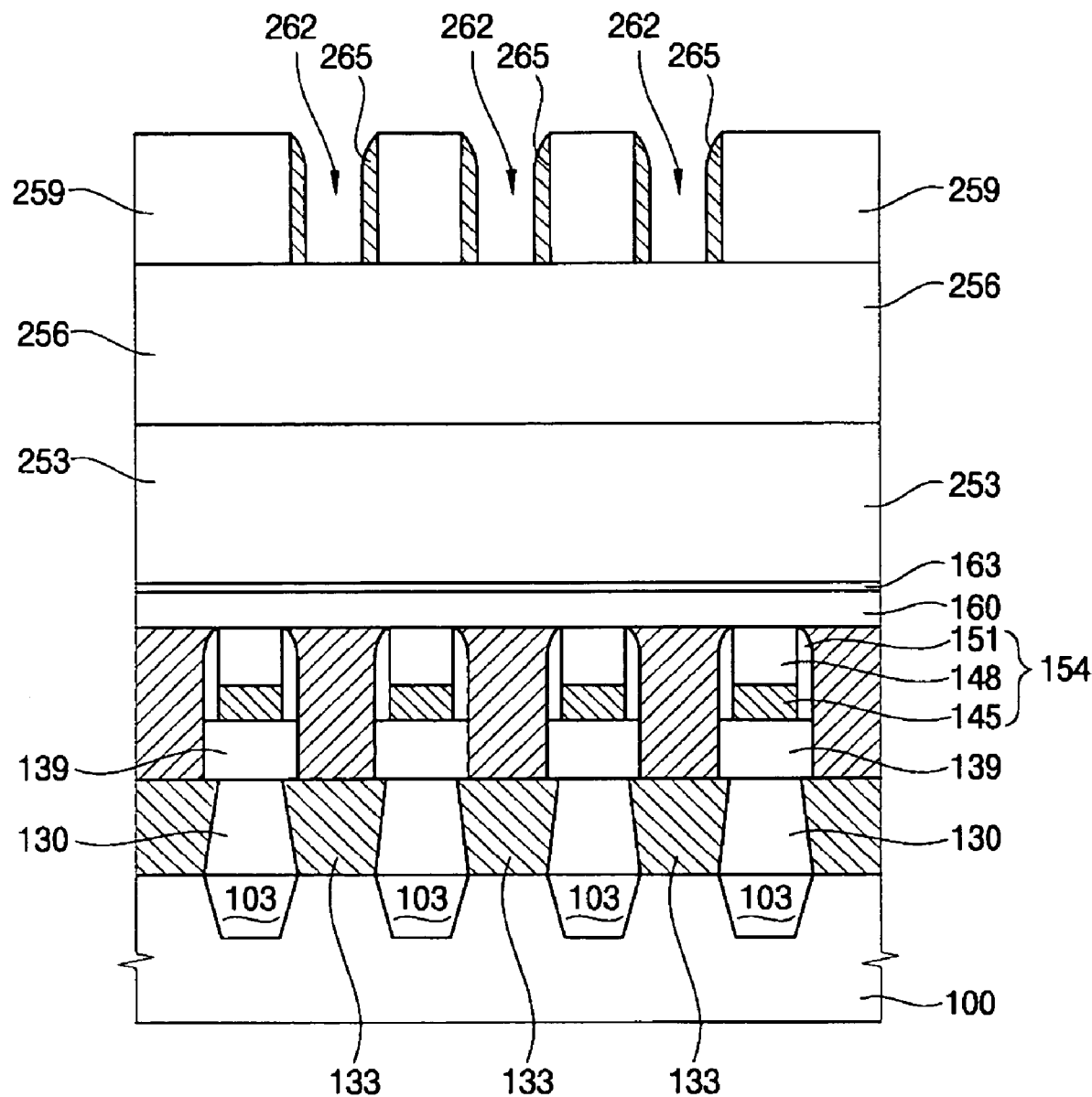

FIGS. 49 and 50 are cross-sectional diagrams illustrating exemplary processes for forming the openings 262 and third spacers 265.

Referring to FIGS. 49 and 50, a first mold layer 253 that includes an oxide is formed on a semiconductor substrate 100 that includes an etching stop layer 163. The first mold layer 253 may be formed using boro-phosphor silicate glass (BPSG) or phosphor silicate glass (PSG) doped with impurities such as boron (B) or phosphorus (P) at a first concentration.

The second mold layer 256 is formed on the first mold layer 253 using oxide doped with impurities at a second concentration. The second mold layer 256 may be formed using boro-phosphor silicate glass (BPSG) or phosphor silicate glass (PSG) doped with impurities such as boron (B) or phosphorus (P) at the second concentration. The second concentration of the second mold layer 256 is greater than the first concentration of the first mold layer 253. Thus, the first mold layer 253 may be etched more rapidly than the second mold layer with an etching process that uses an etching solution that includes hydrogen fluoride (HF) or an etching solution that includes ammonium hydroxide ($NH_4OH$), hydrogen peroxide ($H_2O_2$), and deionized water.

The third mold layer 259 is formed on the second mold layer 256 using undoped oxide. For example, the third mold layer 259 may be formed using a material such as USG, TEOS, HDP-CVD oxide, etc. The third mold layer 259 may be composed of one of these materials or a mixture of two or more of these materials. Alternatively, the third mold layer 259 may be formed using BPSG or PSG doped with boron (B) or phosphorous (P) at a third concentration. The third concentration of the third mold layer 259 is greater than the second concentration of the second mold layer 256. Therefore, the second mold layer 256 may be etched more rapidly than the third mold layer 259 with an etching process using an etching solution including hydrogen fluoride (HF) or ammonium hydroxide ($NH_4OH$), hydrogen peroxide ($H_2O_2$) and deionized water. As a result, a mold layer structure including the first, second and third mold layers 253, 256, and 259 is formed on the semiconductor substrate 100 including the fourth insulating interlayer 160 and the etching stop layer 163.

As described above, because the first, second, and third mold layers 253, 256, and 259 have impurity concentrations that are different from one another, the first, second, and third mold layers 253, 256, and 259 have etch rates that are different from one another with respect to the etching solution that includes hydrogen fluoride (HF) or ammonium hydroxide ($NH_4OH$), hydrogen peroxide ($H_2O_2$) and deionized water. Because the first concentration is greater than the second concentration, the first mold layer 253 is etched more rapidly than the second mold layer 256. In addition, because the second concentration is greater than the third concentration, the second mold layer 256 is etched more rapidly than the third mold layer 259. Hence, fourth contact holes 268 have a stepped cylindrical structure with diameters that decrease as the height of the contact holes 268 increase.

The third mold layer 259 is partially etched by a photolithography process to form the openings 262 that expose the second mold layer 256. The openings 262 formed through the second mold layer 256 are disposed vertically over the fourth and the first pads 157 and 133.

A fifth conductive layer is formed on insides of the openings 262 and the partially exposed portion of the second mold layer 256. The fifth conductive layer may be formed using polysilicon, doped polysilicon, or metal, etc.

The fifth conductive layer is then anisotropically etched using a photolithography process to form third spacers 265 disposed on the insides of the openings 215. Fourth contact holes 268 are formed through the first, second, and third mold layers 253, 256, and 259 by a self-alignment process. That is, the fourth contact holes 268 are self-aligned relative to the third spacers 265. In these embodiments, because the third spacers 265 also serve as complementary members 265, additional processes for the spacers 265 may not be required.

Figure 51:
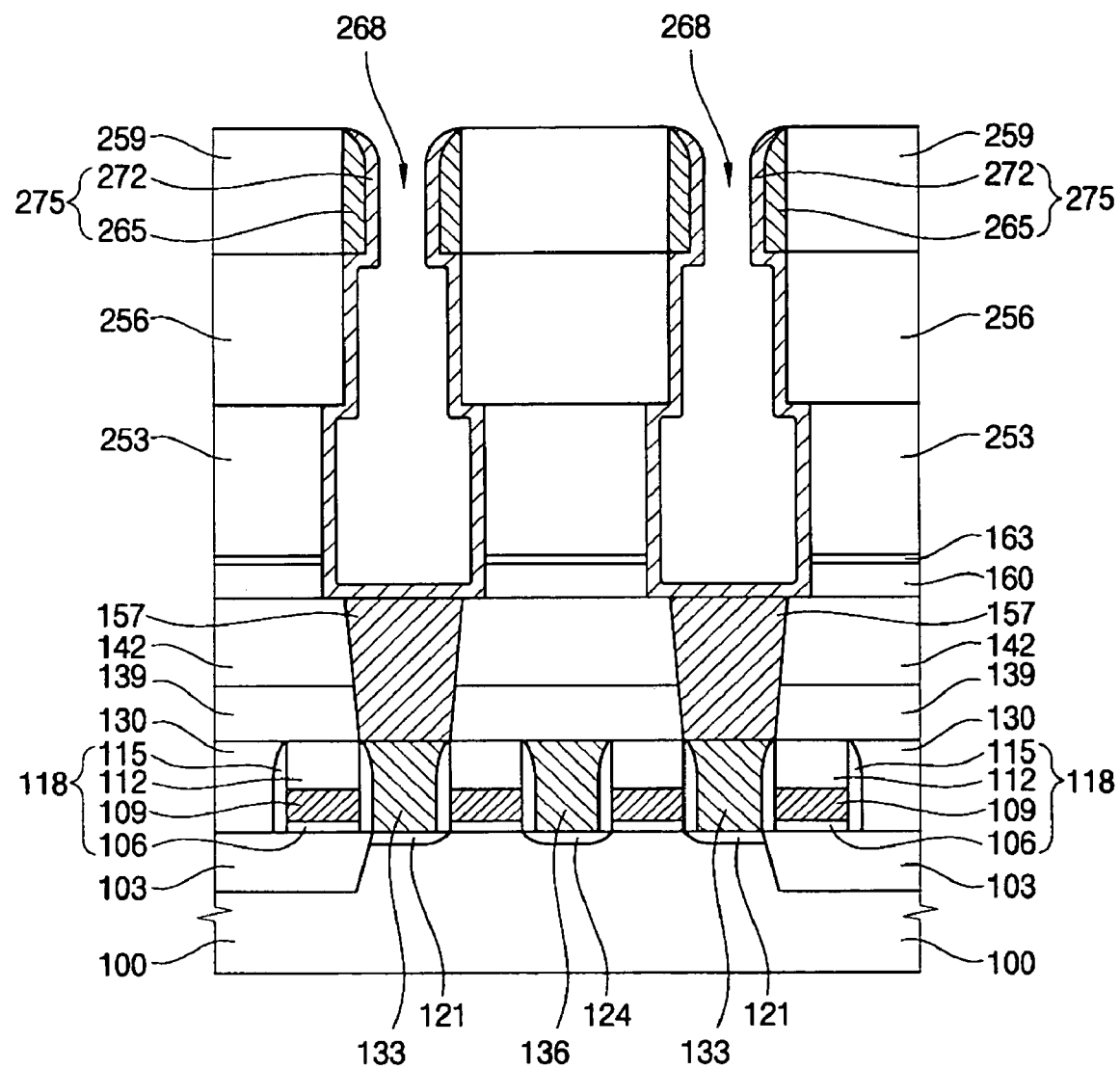
Figure 52:
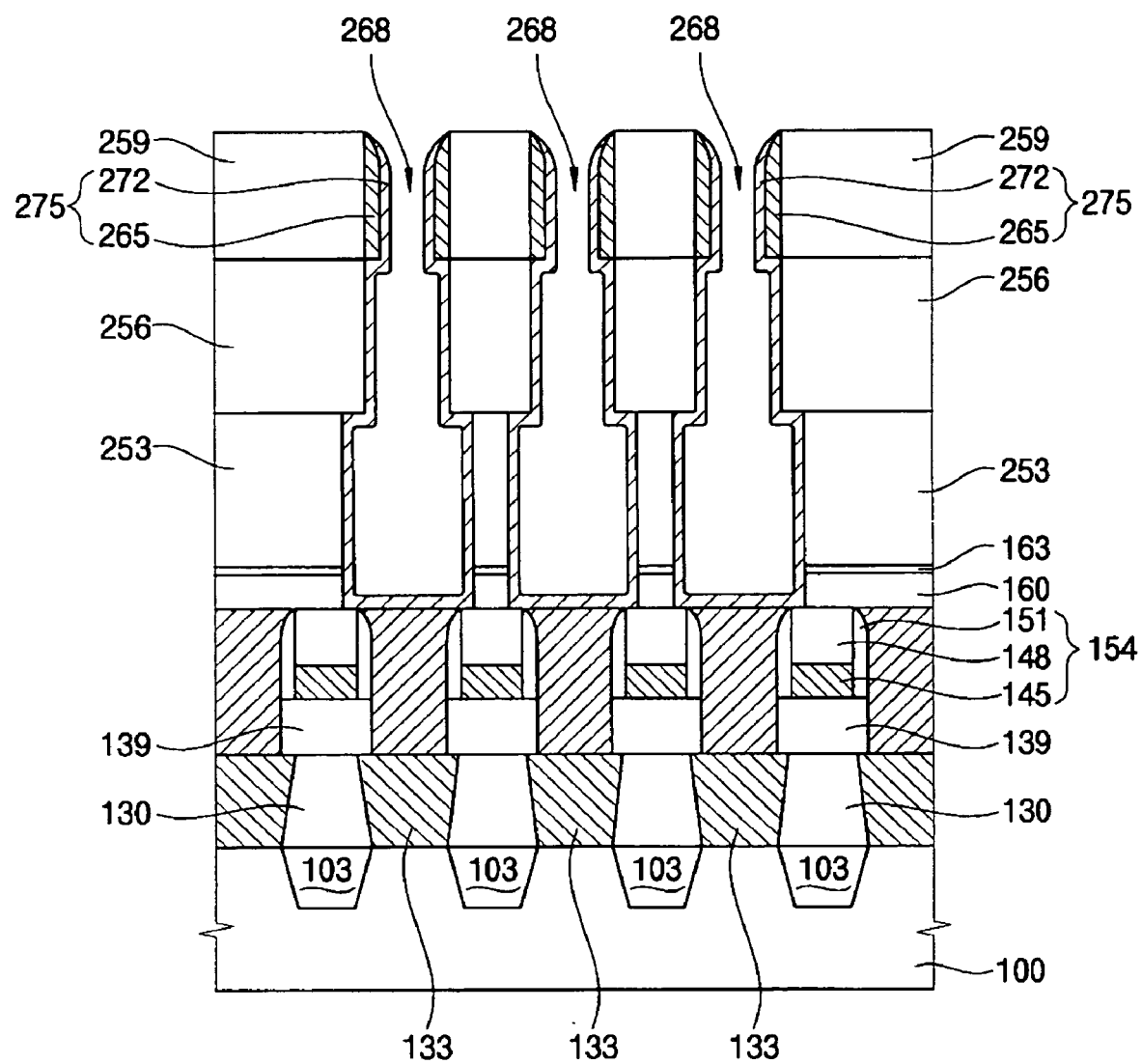

FIGS. 51 and 52 are cross-sectional diagrams illustrating exemplary processes for forming the fourth contact holes 268 and the storage conductive patterns 272.

Referring to FIGS. 51 and 52, the third mold layer 259, the second mold layer 256, the first mold layer 253, the etching stop layer 163, and the fourth insulating interlayer 160 are partially etched by a photolithography process, thereby forming the fourth contact holes 268 that expose the fourth pads 157. Because the second mold layer 256 is etched more rapidly than the third mold layer 259 and the first mold layer 253 is etched more rapidly than the second mold layer 256, the fourth contact holes 268 have a structure composed of cylindrical portions of decreasing diameter as the height of the contact holes 268 increase. That is, central portions of the fourth contact holes 268 have diameters that are greater than those of the upper portions of the fourth contact holes 268. Lower portions of the fourth contact holes 268 have diameters that are greater than those of the central portions of the fourth contact holes 268. Because the storage electrodes 275 are formed in the fourth contact holes 268, the storage electrodes 275 also have the stepped cylindrical structure that was described above.

A sixth conductive layer is formed on the insides of the fourth contact holes 268 and the third mold layer 259. The sixth conductive layer is patterned to form storage conductive patterns 272 on the insides of the fourth contact holes 268. The storage conductive patterns 272 are formed on insides of central and lower portions of the fourth contact holes 268, and also formed on the complementary members 265. The complementary members 265 are attached to the storage conductive patterns 272, and lower portions of the complementary members 268 are partially supported by the storage conductive patterns 272. Thus, the structural stability of the complementary member 219 may be greatly improved.

Figure 53:
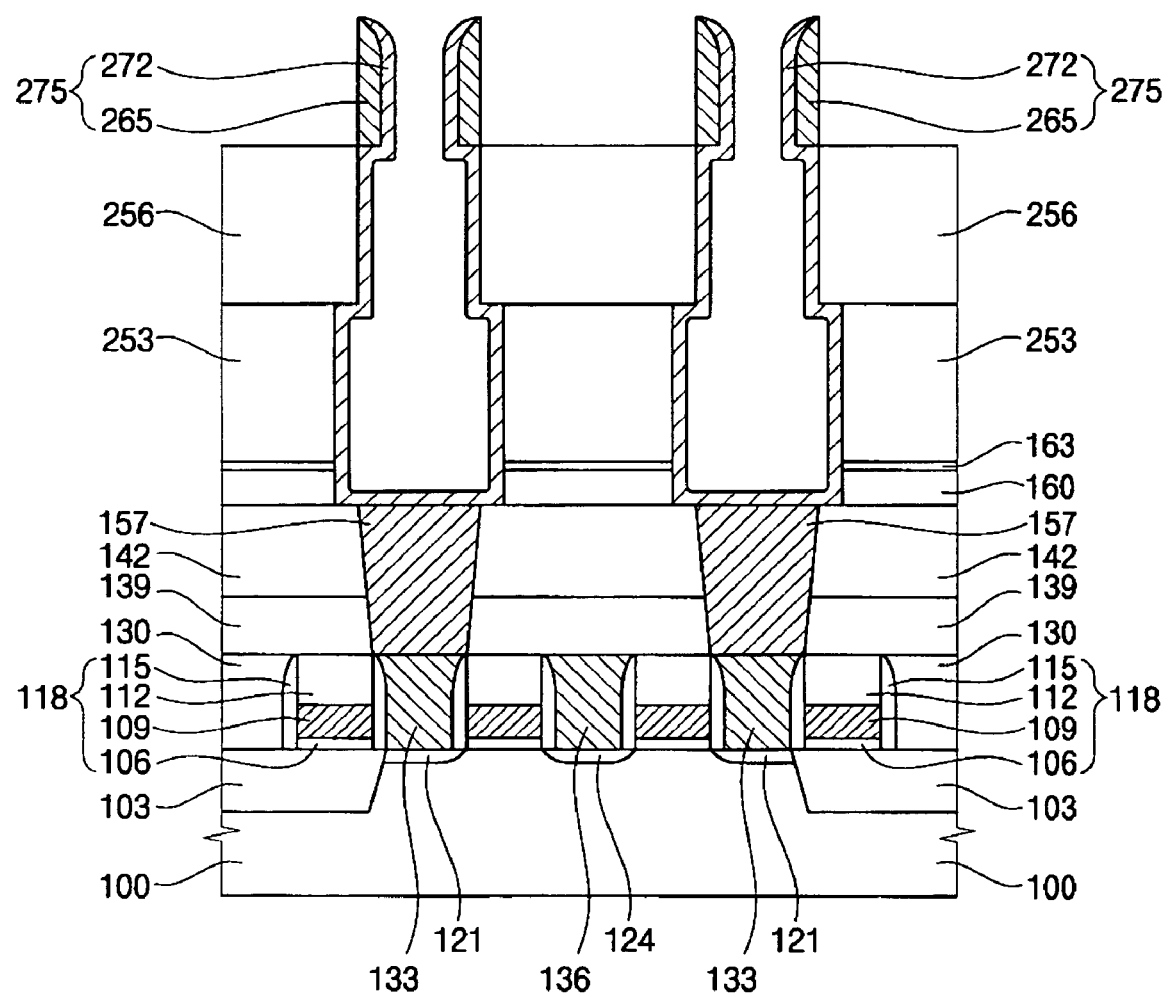
Figure 54:
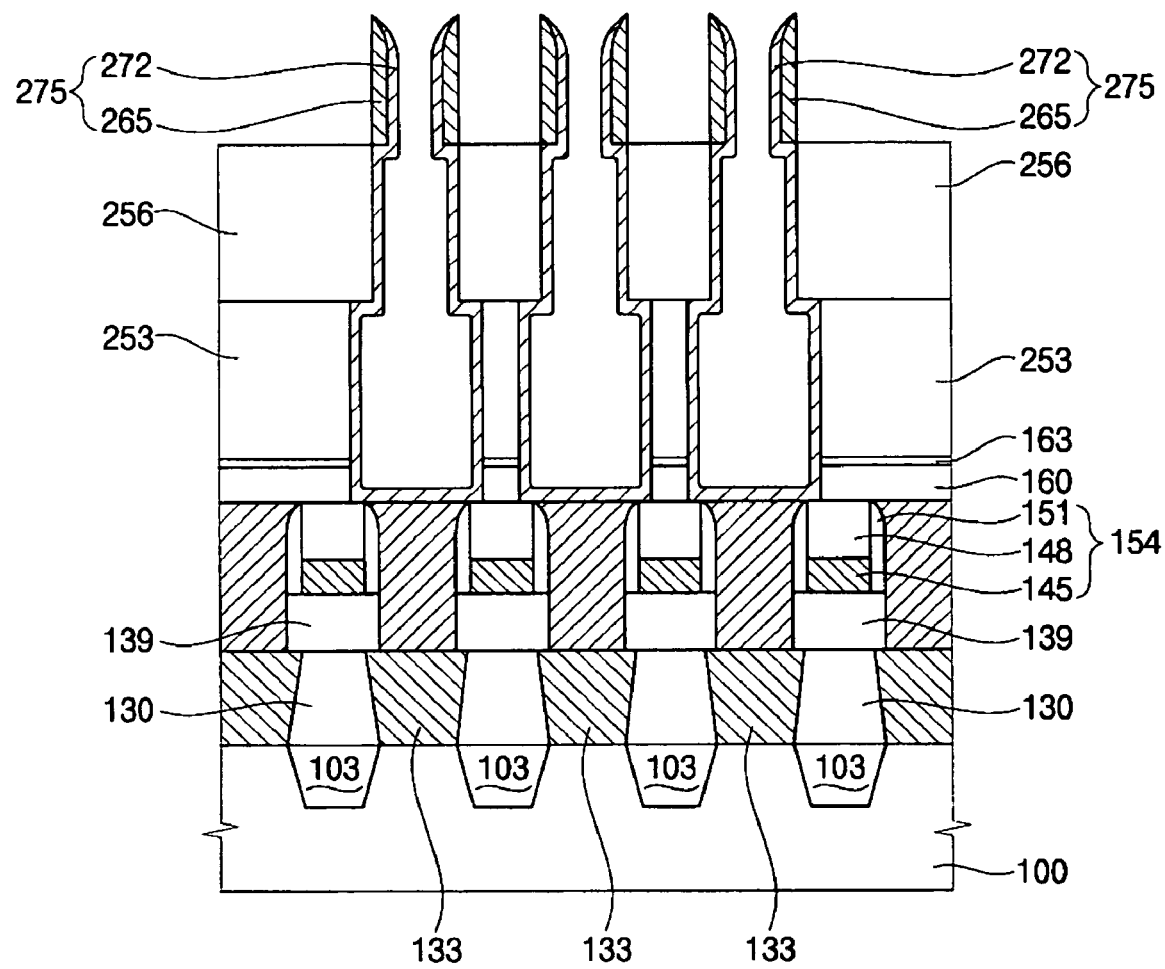

FIGS. 53 and 54 are cross-sectional diagrams illustrating exemplary processes for removing the third mold layer 259.

Referring to FIGS. 53 and 54, the third mold layer 259 is partially removed by the dry etching process that uses a first etching gas that includes hydrogen fluoride and water vapor. Sequentially, the third mold layer 259 is then removed using a second etching gas that includes carbon tetrafluoride ($CF_4$) and oxygen ($O_2$). Here, the complementary members 259 and the storage conductive patterns 272 may be slightly etched. As described above, the complementary members 259 compensate for the etch loss of upper portions of the storage conductive patterns 272.

Figure 55:
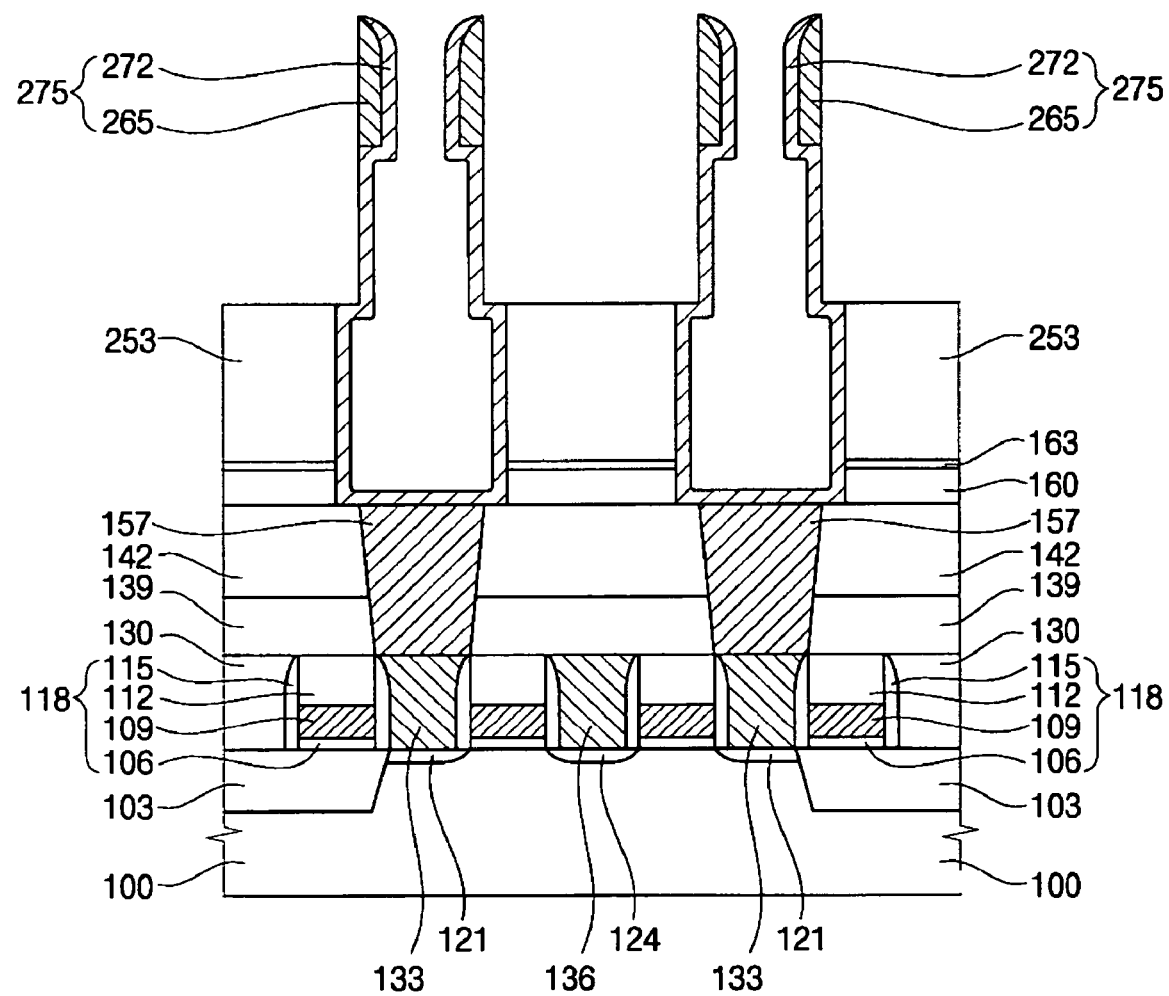
Figure 56:
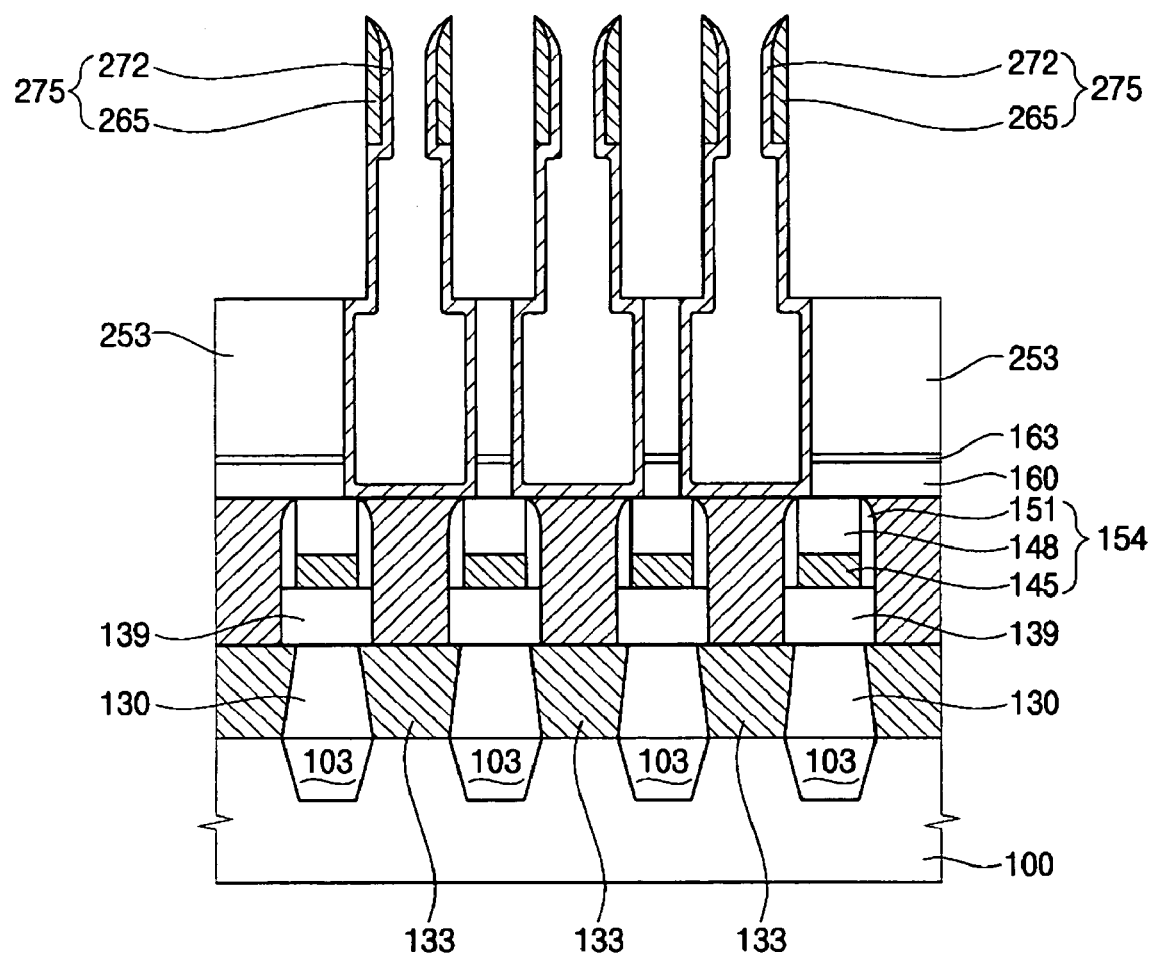

FIGS. 55 and 56 are cross-sectional diagrams illustrating exemplary processes for removing the second mold layer 256. Referring to FIGS. 55 and 56, the second mold layer 256 is removed by a dry etching process that sequentially uses the first and second etching gas.

Figure 57:
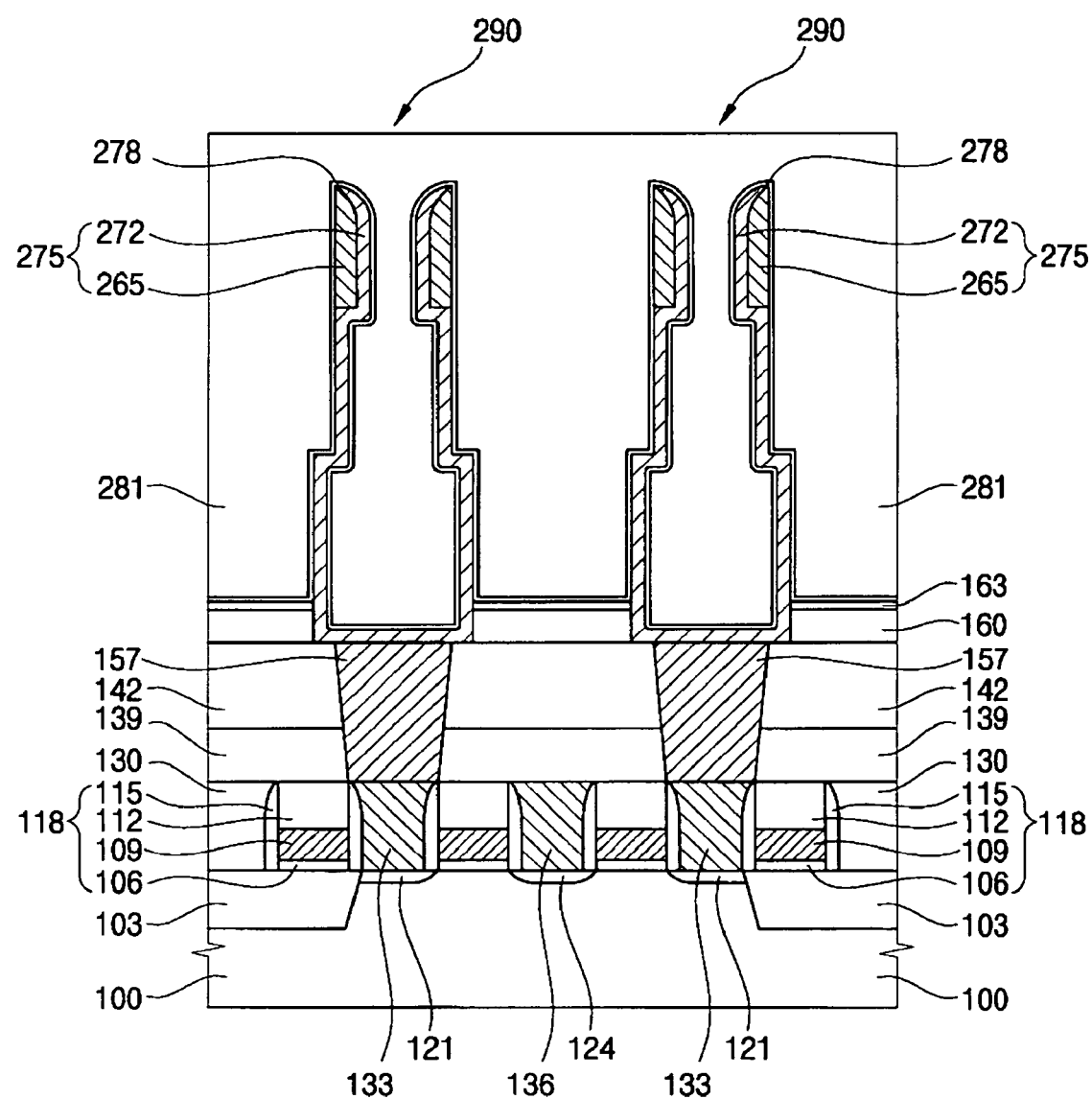
Figure 58:
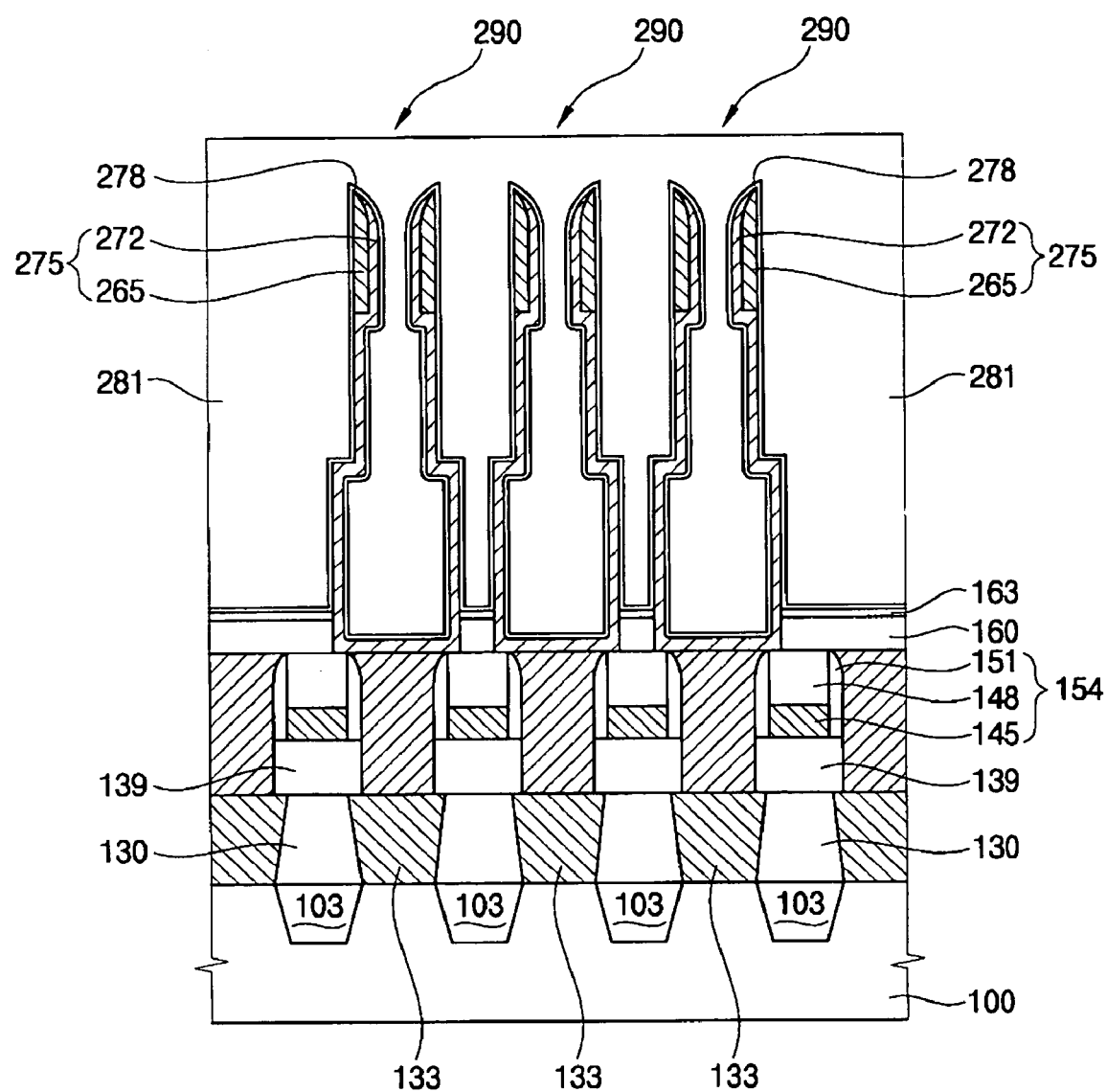

FIGS. 57 and 58 are cross-sectional diagrams illustrating exemplary processes for forming capacitors 290.

Referring to FIGS. 57 and 58, the first mold layer 253 is removed by a dry etching process that sequentially uses the first and second etching gases. Hence, the storage electrodes 275 that include the storage conductive patterns 272 have a stepped cylindrical structure. Here, the complementary members 268 enclose the upper portions of the storage conductive patterns 272. According to these embodiments, the storage electrodes 275 having the stepped cylindrical structure are formed by etching the first, second, and third mold layers 253, 256, and 259 at etching rates that are different from one another. Therefore, the structural stability of the storage electrodes 275 may be improved. Because the complementary members 265 compensate for the etch loss of upper portions of the storage conductive patterns 272, the electrical characteristics of the storage electrodes 275 may be improved. Accordingly, the capacitors 290 may have improved structural stabilities and electrical characteristics. A dielectric layer 278 and a plate electrode 234 are successively formed on the storage electrode 275 including the complementary member 265 and the storage conductive pattern 272, thereby forming the capacitor 290. Sequentially, a fifth insulation layer is formed on the capacitor 290 to electrically insulate the capacitor 290 from an upper wiring. The upper wiring is then formed on the fifth insulation layer. As a result, the semiconductor device that includes the capacitor 290 is manufactured.

Embodiments of the invention may be practiced in many ways. What follows are exemplary, non-limiting descriptions of some embodiments of the invention.

According to some embodiments of the invention, a capacitor includes a storage conductive pattern, a storage electrode, a dielectric layer and a plate electrode. The storage electrode includes a complementary member that encloses an upper portion of the storage conductive pattern so as to compensate for an etch loss of the storage conductive pattern. The plate electrode is formed on the dielectric layer that is disposed on the storage electrode. The complementary member is formed on the upper portion of the storage conductive pattern. An interior portion of the complementary member is attached to the storage conductive pattern, and a lower portion of the complementary member is partially supported by the storage conductive pattern. The storage electrode also includes an upper portion having a first thickness, a central portion having a second thickness that is less than the first thickness, and a lower portion having a third thickness that is substantially identical to the second thickness.

In accordance with other embodiments of the invention, a method of forming a capacitor includes forming a contact region on a semiconductor substrate. A mold layer structure including at least one mold layer is formed on the semiconductor substrate. A complementary member that compensates for an etch loss of storage conductive pattern is formed at an upper portion of the mold layer structure. The complementary member is disposed vertically over the contact region. A contact hole that exposes an interior portion of the complementary member and the contact region is formed. The storage conductive pattern is formed inside the contact hole. The mold layer structure is removed by at least two etching processes to form a storage electrode that includes the complementary member and the storage conductive pattern. A dielectric layer and a plate electrode are successively formed on the storage electrode.

In accordance with still other embodiments of the invention, a semiconductor device includes a semiconductor substrate that has a first and a second contact regions, a bit line that is electrically connected to the second contact region, a storage electrode including a storage conductive pattern that is electrically connected to the first contact region, a complementary member enclosing an upper portion of the storage conductive pattern so as to compensate for an etch loss of the storage conductive pattern, and a dielectric layer disposed on the storage electrode and a plate electrode disposed on the dielectric layer.

In accordance with other embodiments of the invention, a method of forming a semiconductor device includes forming a first and a second contact region on a semiconductor substrate. A bit line that is electrically connected to the second contact region is formed. A mold layer structure that includes at least one mold layer is formed on the semiconductor including the bit line. A complementary member that compensates for an etch loss of a storage conductive pattern is formed on an upper portion of the mold layer structure above the first contact region. A contact hole that exposes an inside of the complementary member and the first contact region is formed. A storage conductive pattern that is electrically connected to the first contact region is formed on an inside of the contact hole. The mold layer structure is removed by at least two etching processes to form a storage electrode that includes the complementary member and the storage conductive pattern. A dielectric layer and a plate are successively formed on the storage electrode.

According to embodiments of the invention, a complementary member compensates for the etch loss of a storage electrode, particularly on an upper portion of the storage electrode, during the several etching processes that form the storage electrode. The resulting storage electrode has a stepped cylindrical structure, where the diameter of the cylindrical structure decreases as the height of the storage electrode increases. Accordingly, the structural stability of the storage electrode may be prevented from deteriorating. In addition, because the complementary member encloses the upper portion of the storage electrode to form the storage electrode having the cylindrical structure, the storage electrode may have a sufficient thickness. Thus, the electrical characteristics of a capacitor including the storage electrode may be improved. Further, the capacitor that includes the storage electrode may have improved structural stability. Thus, a semiconductor device that includes the capacitor may have improved reliability and the throughput of a semiconductor manufacturing process may be increased.

Having thus described exemplary embodiments of the invention, it is to be understood that the invention defined by the appended claims is not to be limited by particular details set forth in the above description as many apparent variations thereof are possible without departing from the spirit or scope of the invention.

We claim:

1. A capacitor comprising:
a storage electrode that includes a storage conductive pattern and a complementary member, an upper portion of the storage conductive pattern having a first surface and a second surface opposite the first surface, the complementary member formed on the first surface of the upper portion of the storage conductive pattern and structured to compensate for an etch loss of the storage conductive pattern;
a dielectric layer formed directly on the second surface of the upper portion of the storage conductive pattern such that the upper portion of the storage conductive pattern is between the dielectric layer and the complementary member; and
a plate electrode formed on the dielectric layer.

2. The capacitor of claim 1, wherein the complementary member encloses the upper portion of the storage conductive pattern.

3. The capacitor of claim 1, wherein an interior portion of the complementary member is attached to the storage conductive pattern, and a lower portion of the complementary member is supported by the storage conductive pattern.

4. The capacitor of claim 1, wherein the storage conductive pattern and the complementary member include a substantially identical material.

5. The capacitor of claim 1, wherein the storage conductive pattern and the complementary member are integrally formed.

6. The capacitor of claim 1, wherein the storage electrode has a cylindrical structure.

7. The capacitor of claim 6, wherein the cylindrical structure has a stepped cylindrical structure, where a diameter of the cylindrical structure decreases as a height of the storage electrode increases.

8. The capacitor of claim 1, wherein the storage electrode comprises an upper portion, a central portion, and a lower portion that have thicknesses that are different from one another.

9. The capacitor of claim 1, wherein the storage electrode comprises an upper portion, a central portion and a lower portion, and wherein the central and lower portions of the storage electrode have substantially identical thicknesses, and the upper portion of the storage electrode has a thickness that is greater than those of the central and lower portions.

10. The capacitor of claim 1, wherein the lower portion of the storage electrode protrudes inwardly.

11. A capacitor comprising:
a storage electrode that includes a storage conductive pattern and a structure, an upper portion of the storage conductive pattern having a first surface and a second surface opposite the first surface, the structure formed on the first surface of the upper portion and enclosing the upper portion of the storage conductive pattern;
a dielectric layer disposed directly on the second surface of the upper portion of the storage conductive pattern such that the upper portion of the conductive pattern is between the dielectric layer and the structure; and
a plate electrode disposed on the dielectric layer.

12. The capacitor of claim 11, wherein the structure and the storage conductive pattern are integrally formed.

13. The capacitor of claim 11, wherein the storage electrode has a stepped cylindrical structure where a diameter of the stepped cylindrical structure incrementally decreases as a height of the storage electrode increases.

14. The capacitor of claim 11, wherein a lower portion of the storage conductive pattern protrudes inwardly.

15. A capacitor comprising:
a storage electrode that includes a storage conductive pattern and a complementary member, wherein the storage electrode has a stepped structure and a lowermost surface of the complementary member is directly on a portion of the stepped structure;
a dielectric layer disposed on the storage electrode; and
a plate electrode disposed on the dielectric layer.

16. The capacitor of claim 15, wherein the and a complementary member encloses an upper portion of the storage conductive pattern and is integrally formed with the storage conductive pattern.

17. A semiconductor device comprising:
a semiconductor substrate that includes a first contact region and a second contact region;
a bit line that is electrically connected to the second contact region;
a storage electrode that includes a storage conductive pattern and a complementary member, an upper portion of the storage conductive pattern having a first surface and a second surface opposite the first surface, the complementary member formed on the first surface of the upper portion and enclosing the upper portion of the storage conductive pattern;
a dielectric layer disposed directly on the second surface of the upper portion of the storage conductive pattern such that the upper portion of the conductive pattern is between the dielectric layer and the structure; and
a plate electrode disposed on the dielectric layer.

18. The semiconductor device of claim 17, wherein the complementary member and the storage conductive pattern are integrally formed.

19. The semiconductor device of claim 17, wherein an interior of the complementary member is attached to the storage conductive pattern, and a lower portion of the complementary member is supported by the storage conductive pattern.

20. The semiconductor device of claim 17, wherein the storage electrode has a stepped cylindrical structure where a diameter of the stepped cylindrical structure decreases as a height of the storage electrode increases.

21. The semiconductor device of claim 17, wherein the storage electrode comprises a central portion and a lower portion having a substantially identical thickness, and an upper portion having a thickness that is greater than those of the central and lower portions of the storage electrode.

22. The semiconductor device of claim 17, wherein the storage electrode has a stepped cylindrical structure where a diameter of the stepped cylindrical structure decreases as a height of the storage electrode increases, and where a lower portion of the storage electrode protrudes inwardly.

* * * * *

UNITED STATES PATENT AND TRADEMARK OFFICE
CERTIFICATE OF CORRECTION

PATENT NO. : 7,227,215 B2
APPLICATION NO. : 10/996969
DATED : June 5, 2007
INVENTOR(S) : Je-Min Park et al.

It is certified that error appears in the above-identified patent and that said Letters Patent is hereby corrected as shown below:

Column 22, line 15, the words "the and a" should read --the--.

Signed and Sealed this

Fifth Day of August, 2008

JON W. DUDAS
*Director of the United States Patent and Trademark Office*